(12) United States Patent
Yamazaki

(10) Patent No.: US 9,559,213 B2
(45) Date of Patent: Jan. 31, 2017

(54) SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/854,566

(22) Filed: Sep. 15, 2015

(65) Prior Publication Data

US 2016/0005878 A1    Jan. 7, 2016

Related U.S. Application Data

(63) Continuation of application No. 14/450,997, filed on Aug. 4, 2014, now Pat. No. 9,166,061, which is a
(Continued)

(30) Foreign Application Priority Data

Dec. 23, 2011  (JP) ................................. 2011-282509

(51) Int. Cl.
*H01L 27/108* (2006.01)
*H01L 29/76* (2006.01)
(Continued)

(52) U.S. Cl.
CPC ......... *H01L 29/7869* (2013.01); *H01L 29/045* (2013.01); *H01L 29/24* (2013.01); *H01L 29/78693* (2013.01); *H01L 29/78696* (2013.01)

(58) Field of Classification Search
CPC ........... H01L 29/78696; H01L 29/7869; H01L 29/045; H01L 29/78693
(Continued)

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

CN    101276840 A    10/2008
CN    101490850 A    7/2009
(Continued)

OTHER PUBLICATIONS

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.
(Continued)

*Primary Examiner* — David S Blum
(74) *Attorney, Agent, or Firm* — Robinson Intellectual Property Law Office; Eric J. Robinson

(57) ABSTRACT

Provided is a transistor which includes an oxide semiconductor film and has stable electrical characteristics. In the transistor, over an oxide film which can release oxygen by being heated, a first oxide semiconductor film which can suppress oxygen release at least from the oxide film is formed. Over the first oxide semiconductor film, a second oxide semiconductor film is formed. With such a structure in which the oxide semiconductor films are stacked, the oxygen release from the oxide film can be suppressed at the time of the formation of the second oxide semiconductor film, and oxygen can be released from the oxide film in later-performed heat treatment. Thus, oxygen can pass through the first oxide semiconductor film to be favorably supplied to the second oxide semiconductor film. Oxygen supplied to the second oxide semiconductor film can suppress the generation of oxygen deficiency, resulting in stable electrical characteristics.

34 Claims, 29 Drawing Sheets

Related U.S. Application Data continuation of application No. 13/716,939, filed on Dec. 17, 2012, now Pat. No. 8,796,683.

(51) Int. Cl.
  *H01L 29/94* (2006.01)
  *H01L 31/119* (2006.01)
  *H01L 29/786* (2006.01)
  *H01L 29/04* (2006.01)
  *H01L 29/24* (2006.01)

(58) Field of Classification Search
  USPC .......................................................... 257/43
  See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,262,463 B2 | 8/2007 | Hoffman |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,564,055 B2 | 7/2009 | Hoffman |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,763,981 B2 | 7/2010 | Yamazaki et al. |
| 7,791,072 B2 | 9/2010 | Kumomi et al. |
| 7,855,379 B2 | 12/2010 | Hayashi et al. |
| 7,994,500 B2 | 8/2011 | Kim et al. |
| 8,058,645 B2 | 11/2011 | Jeong et al. |
| 8,058,647 B2 | 11/2011 | Kuwabara et al. |
| 8,088,652 B2 | 1/2012 | Hayashi et al. |
| 8,148,779 B2 | 4/2012 | Jeong et al. |
| 8,158,976 B2 | 4/2012 | Son et al. |
| 8,174,053 B2 | 5/2012 | Kitakado |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 8,298,858 B2 | 10/2012 | Kuwabara et al. |
| 8,314,032 B2 | 11/2012 | Kawamura et al. |
| 8,319,905 B2 | 11/2012 | Yoon et al. |
| 8,344,387 B2 | 1/2013 | Akimoto et al. |
| 8,378,351 B2 | 2/2013 | Fukumoto et al. |
| 8,384,076 B2 | 2/2013 | Park et al. |
| 8,395,931 B2 | 3/2013 | Yamazaki et al. |
| 8,399,882 B2 | 3/2013 | Jeon et al. |
| 8,426,868 B2 | 4/2013 | Akimoto et al. |
| 8,445,902 B2 | 5/2013 | Sato et al. |
| 8,461,594 B2 | 6/2013 | Morosawa et al. |
| 8,481,377 B2 | 7/2013 | Akimoto et al. |
| 8,513,661 B2 | 8/2013 | Takahashi et al. |
| 8,530,273 B2 | 9/2013 | Den Boer |
| 8,546,182 B2 | 10/2013 | Akimoto et al. |
| 8,552,434 B2 | 10/2013 | Akimoto et al. |
| 8,618,537 B2 | 12/2013 | Kaneko et al. |
| 8,624,240 B2 | 1/2014 | Sato et al. |
| 8,624,400 B2 | 1/2014 | Yamazaki et al. |
| 8,633,492 B2 | 1/2014 | Akimoto et al. |
| 8,692,252 B2 | 4/2014 | Takata et al. |
| 8,742,418 B2 | 6/2014 | Morosawa et al. |
| 8,748,881 B2 | 6/2014 | Yamazaki |
| 8,748,887 B2 | 6/2014 | Kuwabara et al. |
| 8,759,167 B2 | 6/2014 | Akimoto et al. |
| 8,779,420 B2 | 7/2014 | Yamazaki |
| 8,883,554 B2 | 11/2014 | Sakata et al. |
| 9,166,061 B2 | 10/2015 | Yamazaki |
| 9,214,520 B2 | 12/2015 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017244 A1 | 1/2005 | Hoffman et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0076322 A1 | 3/2009 | Matsunaga et al. |
| 2009/0114910 A1 | 5/2009 | Chang |
| 2009/0134399 A1 | 5/2009 | Sakakura et al. |
| 2009/0152506 A1 | 6/2009 | Umeda et al. |

(56) References Cited

U.S. PATENT DOCUMENTS

| | | |
|---|---|---|
| 2009/0152541 A1 | 6/2009 | Maekawa et al. |
| 2009/0236596 A1 | 9/2009 | Itai |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0044701 A1 | 2/2010 | Sano et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2011/0024751 A1 | 2/2011 | Yamazaki et al. |
| 2011/0062436 A1 | 3/2011 | Yamazaki et al. |
| 2011/0140100 A1 | 6/2011 | Takata et al. |
| 2011/0147738 A1 | 6/2011 | Yamazaki et al. |
| 2011/0182110 A1 | 7/2011 | Yamazaki et al. |
| 2011/0193083 A1 | 8/2011 | Kim et al. |
| 2011/0204362 A1 | 8/2011 | Akimoto et al. |
| 2011/0215328 A1 | 9/2011 | Morosawa et al. |
| 2011/0309411 A1 | 12/2011 | Takemura |
| 2012/0001167 A1 | 1/2012 | Morosawa |
| 2012/0103804 A1 | 5/2012 | Ikisawa et al. |
| 2012/0119205 A1 | 5/2012 | Taniguchi et al. |
| 2012/0242627 A1 | 9/2012 | Kim et al. |
| 2013/0012694 A1 | 1/2013 | Zhang |
| 2013/0020571 A1 | 1/2013 | Yamazaki et al. |
| 2013/0037793 A1 | 2/2013 | Pan et al. |
| 2013/0127694 A1 | 5/2013 | Kim et al. |
| 2013/0309808 A1 | 11/2013 | Zhang et al. |
| 2014/0030846 A1 | 1/2014 | Akimoto et al. |
| 2014/0246673 A1 | 9/2014 | Akimoto et al. |
| 2014/0252348 A1 | 9/2014 | Kuwabara et al. |
| 2016/0163871 A1 | 6/2016 | Yamazaki |

FOREIGN PATENT DOCUMENTS

| | | |
|---|---|---|
| CN | 101617408 A | 12/2009 |
| CN | 102171833 A | 8/2011 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-134694 A | 4/2004 |
| JP | 2004-273614 A | 9/2004 |
| JP | 2004-273732 A | 9/2004 |
| JP | 2006-165528 A | 6/2006 |
| JP | 2007-519256 | 7/2007 |
| JP | 2008-270759 A | 11/2008 |
| JP | 2008-294136 A | 12/2008 |
| JP | 2009-089351 A | 4/2009 |
| JP | 2009-170905 A | 7/2009 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-073881 A | 4/2010 |
| JP | 2010-074061 A | 4/2010 |
| JP | 2010-087223 A | 4/2010 |
| JP | 2010-114413 A | 5/2010 |
| JP | 2010-177431 A | 8/2010 |
| JP | 4571221 | 10/2010 |
| JP | 2011-124360 A | 6/2011 |
| JP | 2011-135063 A | 7/2011 |
| JP | 2011-249674 A | 12/2011 |
| JP | 2012-160679 A | 8/2012 |
| TW | 200901481 | 1/2009 |
| TW | 201138111 | 11/2011 |
| TW | 201145520 | 12/2011 |
| WO | WO-2004/114391 | 12/2004 |
| WO | WO-2005/015643 | 2/2005 |
| WO | WO-2005/074038 | 8/2005 |
| WO | WO-2008/105347 | 9/2008 |
| WO | WO-2008/133345 | 11/2008 |
| WO | WO-2009/034953 | 3/2009 |
| WO | WO-2010/140548 | 12/2010 |
| WO | WO-2011/065243 | 6/2011 |

OTHER PUBLICATIONS

Invitation to pay additional fees (application No. PCT/JP2012/083764), International Searching Authority, dated Feb. 5, 2013.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 32, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of Igzo Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Matter. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Sakata.J et al., "Development of 4.0-IN. AMOLED Display With Driver Circuit Using Amorphous In—Ga—Zn—Oxide TFTs", IDW '09: Proceedings of the 16th International Displays Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID International Symposium Digest of Technical Papers, May 31, 2009, pp. 1110-1112.
Ohara.H et al., "21.3:4.0 In. QVGA AMOLED Display Using In—Ga—Zn—Oxide TFTs with a Novel Passivation Layer," SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

(56) References Cited

OTHER PUBLICATIONS

Orita.M et al., "Mechanism of Electrical Conductivity of Transparent InGaZnO4", Phys. Rev. B. (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of The 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Chinese Office Action (Application No. 201280063818.7) Dated May 19, 2016.

Taiwanese Office Action (Application No. 101147851) Dated Aug. 25, 2016.

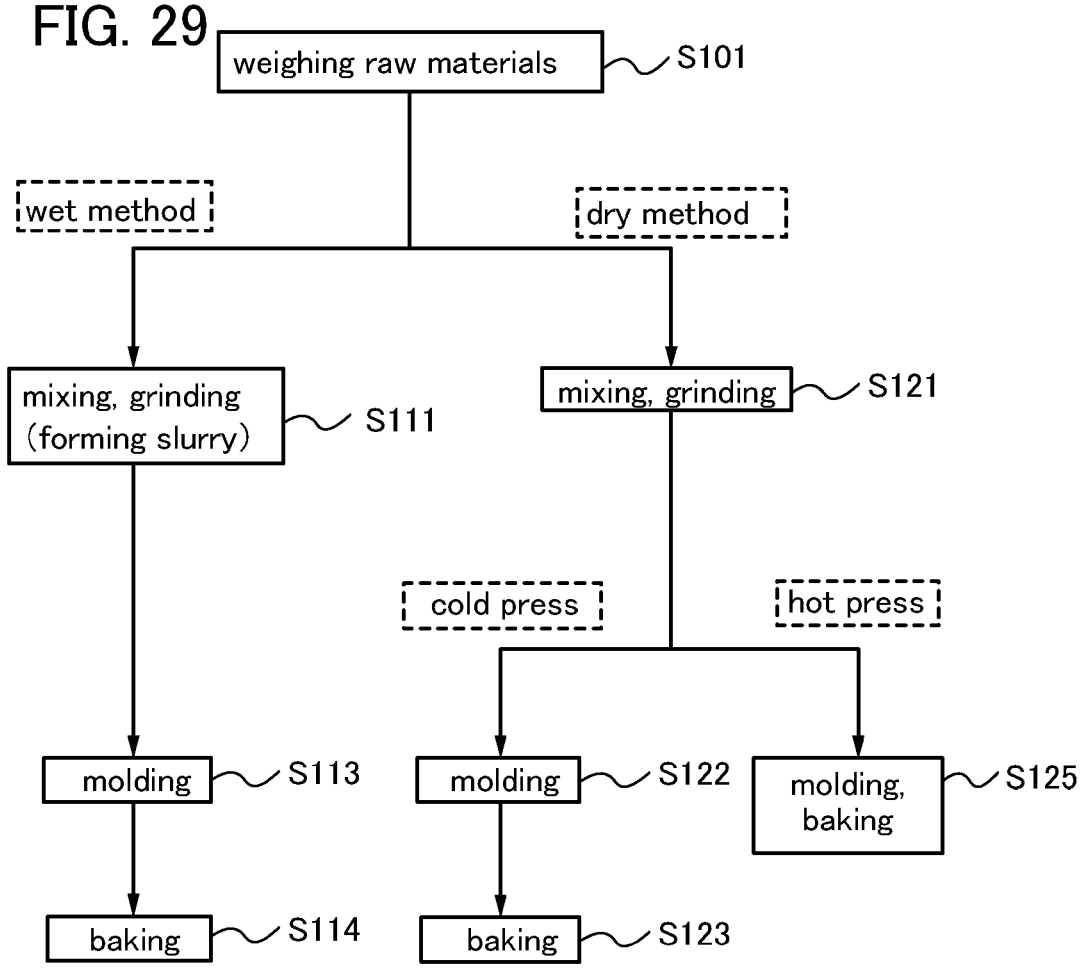

SEMICONDUCTOR DEVICE

TECHNICAL FIELD

The present invention relates to a semiconductor device including an oxide semiconductor.

In this specification, a semiconductor device refers to a device which can function by utilizing semiconductor characteristics; a transistor, an electro-optical device, a semiconductor circuit, and an electronic device are all included in the category of the semiconductor device.

BACKGROUND ART

A technique by which transistors are formed using semiconductor thin films formed over a substrate having an insulating surface has been attracting attention. The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including an amorphous oxide semiconductor film containing indium (In), gallium (Ga), and zinc (Zn) as an active layer is disclosed (see Patent Document 1).

REFERENCE

Patent Document

[Patent Document 1] Japanese Published Patent Application No. 2006-165528

DISCLOSURE OF INVENTION

A transistor including an oxide semiconductor film operates faster (it can also be said that the field effect mobility is higher) than a transistor including an amorphous silicon film and is manufactured more easily than a transistor including a polycrystalline silicon film.

However, some problems of the transistor including an oxide semiconductor film have been pointed out. One of the problems is unstable electrical characteristics of the transistor. Specifically, a problem that the threshold voltage of the transistor is negatively shifted by a bias-temperature stress test (also referred to as a BT stress test) or irradiation with visible light or ultraviolet light, so that the transistor tends to be normally on has been pointed out. As one of factors of the problem, oxygen deficiency in the oxide semiconductor film can be given.

When the oxide semiconductor film is amorphous, for example, the bonding state of metal atoms and oxygen atoms in the oxide semiconductor film is not ordered; thus, oxygen deficiency is likely to be generated. For this reason, the electrical characteristics (e.g., electrical conductivity) of the oxide semiconductor film might be changed. Such a change can cause variations in the electrical characteristics of a transistor, which leads to a reduction in reliability of a semiconductor device including the transistor.

One example of a method for reducing oxygen deficiency generated in an oxide semiconductor film is to supply oxygen to the oxide semiconductor film from an oxide film or the like formed in the vicinity of the oxide semiconductor film so that the oxygen deficiency can be repaired. However, before the formation of the oxide semiconductor film (in other words, before the oxygen supply to the oxide semiconductor film), heat treatment or the like in a manufacturing process might cause oxygen to be released from the oxide film or the like formed in the vicinity of the oxide semiconductor film, which would result in insufficient supply of oxygen to the oxide semiconductor film.

In view of the above problem, an object of one embodiment of the present invention is to provide a transistor which includes an oxide semiconductor film and has stable electrical characteristics.

Over an oxide film which can release oxygen by being heated, a first oxide semiconductor film which can suppress the oxygen release at least from the oxide film is formed. Over the first oxide semiconductor film, a second oxide semiconductor film is formed. With such a structure in which the oxide semiconductor films are stacked, the oxygen release from the oxide film can be suppressed at the time of the formation of the second oxide semiconductor film, and oxygen can be released from the oxide film in later-performed heat treatment. Thus, oxygen can pass through the first oxide semiconductor film to be favorably supplied to the second oxide semiconductor film. Oxygen supplied to the second oxide semiconductor film can suppress the generation of oxygen deficiency, resulting in stable electrical characteristics.

The first oxide semiconductor film and the second oxide semiconductor film are each an oxide film containing at least indium, gallium, and zinc; the first oxide semiconductor film has a lower content percentage of indium and a higher content percentage of gallium than the second oxide semiconductor film. Being formed over the first oxide semiconductor film containing the same kinds of materials, the second oxide semiconductor film can have a crystal that grows from the interface with the first oxide semiconductor film. More details will be described below.

One embodiment of the present invention is a semiconductor device including a first oxide semiconductor film; and a second oxide semiconductor film formed over the first oxide semiconductor film. The first oxide semiconductor film and the second oxide semiconductor film are each an oxide film containing at least indium, gallium, and zinc, and the first oxide semiconductor film has a lower content percentage of indium and a higher content percentage of gallium than the second oxide semiconductor film.

Another embodiment of the present invention is a semiconductor device including a first oxide semiconductor film formed over an oxide film; a second oxide semiconductor film formed over the first oxide semiconductor film; a gate insulating film formed over the second oxide semiconductor film; and a gate electrode which is in contact with the gate insulating film and formed in a region overlapping with the second oxide semiconductor film. The first oxide semiconductor film and the second oxide semiconductor film are each an oxide film containing at least indium, gallium, and zinc, and the first oxide semiconductor film has a lower content percentage of indium and a higher content percentage of gallium than the second oxide semiconductor film.

In this specification and the like, the term content percentage means the proportion of a component in a film, and is particularly often referred to for the first oxide semiconductor film and the second oxide semiconductor film.

Another embodiment of the present invention is a semiconductor device including a first oxide semiconductor film formed over an oxide film; a second oxide semiconductor film formed over the first oxide semiconductor film; a gate insulating film formed over the second oxide semiconductor film; a gate electrode which is in contact with the gate insulating film and formed in a region overlapping with the second oxide semiconductor film; a protective insulating film formed over the gate electrode; an interlayer insulating film formed over the protective insulating film; and a source electrode and a drain electrode which are formed over the interlayer insulating film and electrically connected to the second oxide semiconductor film. The first oxide semiconductor film and the second oxide semiconductor film are each an oxide film containing at least indium, gallium, and zinc, and the first oxide semiconductor film has a lower content percentage of indium and a higher content percentage of gallium than the second oxide semiconductor film.

Another embodiment of the present invention is a semiconductor device including a first oxide semiconductor film formed over an oxide film; a second oxide semiconductor film formed over the first oxide semiconductor film; a gate insulating film formed over the second oxide semiconductor film; a gate electrode which is in contact with the gate insulating film and formed in a region overlapping with the second oxide semiconductor film; a protective insulating film formed over the gate electrode; an interlayer insulating film formed over the protective insulating film; a first opening and a second opening which are formed in the gate insulating film, the protective insulating film, and the interlayer insulating film; and a source electrode and a drain electrode which are embedded in the first opening and the second opening and electrically connected to the second oxide semiconductor film. The first oxide semiconductor film and the second oxide semiconductor film are each an oxide film containing at least indium, gallium, and zinc, and the first oxide semiconductor film has a lower content percentage of indium and a higher content percentage of gallium than the second oxide semiconductor film.

Another embodiment of the present invention is a semiconductor device including a first oxide semiconductor film formed over an oxide film; a second oxide semiconductor film formed over the first oxide semiconductor film; a gate insulating film formed over the second oxide semiconductor film; a gate electrode which is in contact with the gate insulating film and formed in a region overlapping with the second oxide semiconductor film; an insulating film formed in a region overlapping with the gate electrode; a sidewall insulating film formed along a side surface of the gate electrode and a side surface of the insulating film in a cross section taken along a channel length; a source electrode and a drain electrode which are in contact with the sidewall insulating film and electrically connected to the second oxide semiconductor film; and a protective insulating film and an interlayer insulating film which are formed at least over the source electrode and the drain electrode. The first oxide semiconductor film and the second oxide semiconductor film are each an oxide film containing at least indium, gallium, and zinc, and the first oxide semiconductor film has a lower content percentage of indium and a higher content percentage of gallium than the second oxide semiconductor film.

Another embodiment of the present invention is a semiconductor device including a first oxide semiconductor film formed over an oxide film; a second oxide semiconductor film formed over the first oxide semiconductor film; a gate insulating film formed over the second oxide semiconductor film; a gate electrode which is in contact with the gate insulating film and formed in a region overlapping with the second oxide semiconductor film; a source electrode which is in contact with one side surface of the second oxide semiconductor film and a drain electrode which is in contact with the other side surface of the second oxide semiconductor film in a cross section taken along a channel length; a first conductive film formed along one side surface of the gate electrode; a second conductive film formed along the other side surface of the gate electrode; a sidewall insulating film formed along a side surface of the first conductive film and a side surface of the second conductive film; and a protective insulating film and an interlayer insulating film which are formed at least over the gate electrode, the source electrode, and the drain electrode. The first oxide semiconductor film and the second oxide semiconductor film are each an oxide film containing at least indium, gallium, and zinc, and the first oxide semiconductor film has a lower content percentage of indium and a higher content percentage of gallium than the second oxide semiconductor film.

In any of the above structures, at least part of the first conductive film is formed over the source electrode with the gate insulating film interposed therebetween, and at least part of the second conductive film is formed over the drain electrode with the gate insulating film interposed therebetween.

The first conductive film and the second conductive film formed in this manner to be in contact with the gate electrode can have the regions (also referred to as Lov regions) that overlap with the source electrode and the drain electrode with the gate insulating film interposed therebetween. Accordingly, a reduction in on-state current due to miniaturization can be suppressed.

Another embodiment of the present invention is a semiconductor device including a first oxide semiconductor film formed over an oxide film; a second oxide semiconductor film formed over the first oxide semiconductor film; a gate insulating film formed over the second oxide semiconductor film; a gate electrode which is in contact with the gate insulating film and covers a top surface and a side surface of the second oxide semiconductor film; a protective insulating film and an interlayer insulating film which are formed over the gate electrode; a source electrode and a drain electrode each of which is in contact with a side surface of the second oxide semiconductor film in an opening penetrating through the interlayer insulating film, the protective insulating film, the gate insulating film, and the second oxide semiconductor film in a cross section taken along a channel length. The first oxide semiconductor film and the second oxide semiconductor film are each an oxide film containing at least indium, gallium, and zinc, and the first oxide semiconductor film has a lower content percentage of indium and a higher content percentage of gallium than the second oxide semiconductor film.

In any of the above structures, it is preferable that the source electrode and the drain electrode each have a surface which is planarized by chemical mechanical polishing treatment.

Formation of the source electrode and the drain electrode each of which has the surface planarized by chemical mechanical polishing treatment does not require etching treatment using a resist mask, enabling precise processing accurately even in the case where the widths of the source electrode and the drain electrode in the channel length direction are scaled-down.

In any of the above structures, it is preferable that the first oxide semiconductor film include a low-resistance region and a high-resistance region, the high-resistance region being located at least outside the second oxide semiconductor film.

The high-resistance region of the first oxide semiconductor film is formed outside the second oxide semiconductor film to serve as a separation layer between transistors. Such a structure can prevent electrical connection between adjacent transistors.

In any of the above structures, the second oxide semiconductor film preferably includes a channel region and a pair of low-resistance regions which are in contact with the channel region. The formation of the pair of low-resistance regions which are in contact with the channel region in the second oxide semiconductor film can lower contact resistances between the second oxide semiconductor film and the source electrode, and between the second oxide semiconductor film and the drain electrode.

In any of the above structures, the second oxide semiconductor film preferably includes a high-resistance region on either end thereof in the channel width direction. The formation of the high-resistance region on either side of the second oxide semiconductor film in the channel width direction can suppress the generation of a parasitic channel in the second oxide semiconductor film.

In any of the above structures, the content percentage of gallium is preferably higher than or equal to that of indium in the first oxide semiconductor film, and the content percentage of indium is higher than that of gallium in the second oxide semiconductor film. When the content percentage of indium is higher than gallium in the second oxide semiconductor film, the second oxide semiconductor film can have higher crystallinity.

In any of the above structures, it is preferable that the first oxide semiconductor film be formed using an oxide having an atomic ratio of In:Ga:Zn=1:1:1 or 1:3:2, and the second oxide semiconductor film be formed using an oxide having an atomic ratio of In:Ga:Zn=3:1:2.

In any of the above structures, the second oxide semiconductor film preferably includes a crystal portion where a c-axis is aligned in a direction parallel to a normal vector of a surface where the second oxide semiconductor film is formed. With the crystal portion included in the second oxide semiconductor film, the bonding state of metal atoms and oxygen atoms can be ordered and the generation of oxygen deficiency can be suppressed.

In any of the above structures, the protective insulating film is preferably an aluminum oxide film having a film density of higher than or equal to 3.2 g/cm$^3$. The use of such an aluminum oxide film has a shielding effect of preventing the protective insulating film from transmitting both oxygen and an impurity such as hydrogen or moisture which might enter the second oxide semiconductor film.

It is possible to provide a transistor which includes an oxide semiconductor film and has stable electrical characteristics.

BRIEF DESCRIPTION OF DRAWINGS

FIG. 29 is a flowchart illustrating manufacturing processes of sputtering targets.

BEST MODE FOR CARRYING OUT THE INVENTION

Figure 1A:
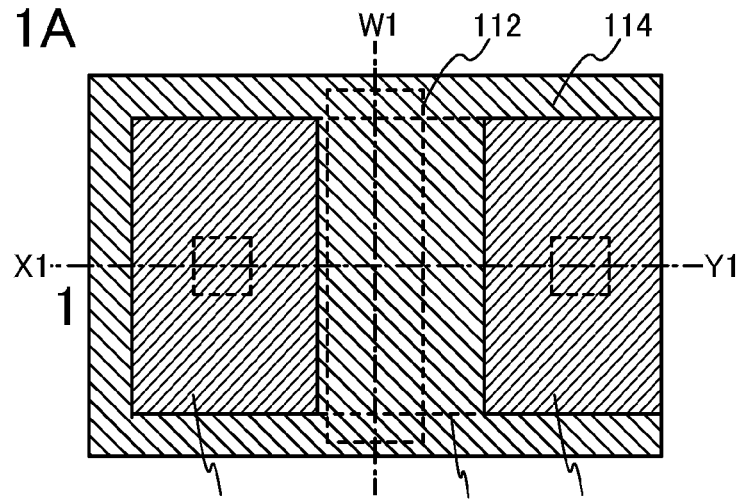
FIG. 1A is a plan view illustrating one embodiment of a semiconductor device and FIGS. 1B and 1C are cross-sectional views thereof.

Hereinafter, embodiments of the invention disclosed in this specification will be described in detail with reference to the accompanying drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that the position, size, range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Note that in this specification and the like, the term such as "over" or "below" does not necessarily mean that a component is placed "directly on" or "directly under" another component. For example, the expression "a gate electrode over a gate insulating film" can mean the case where there is an additional component between the gate insulating film and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

(Embodiment 1)

In this embodiment, one embodiment of a semiconductor device and a method for manufacturing the semiconductor device will be described with reference to FIGS. 1A to 1C, FIGS. 2A to 2D, and FIGS. 3A to 3D.

[Structural Example 1 of Semiconductor Device]

Figure 1B:
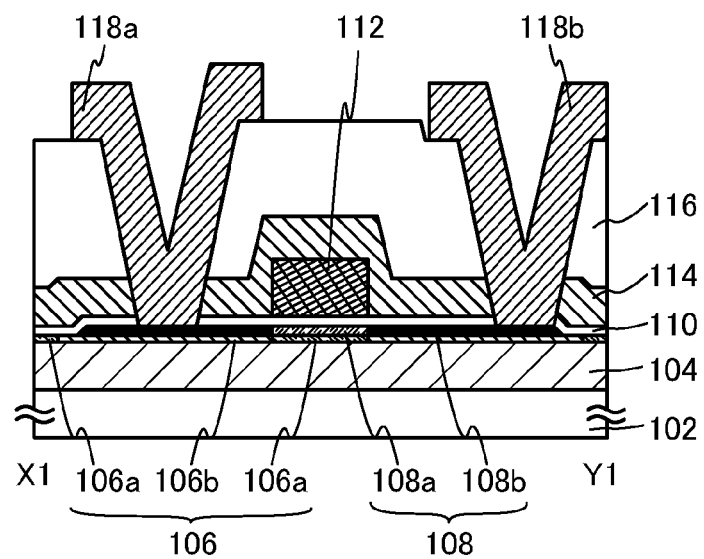
Figure 1C:
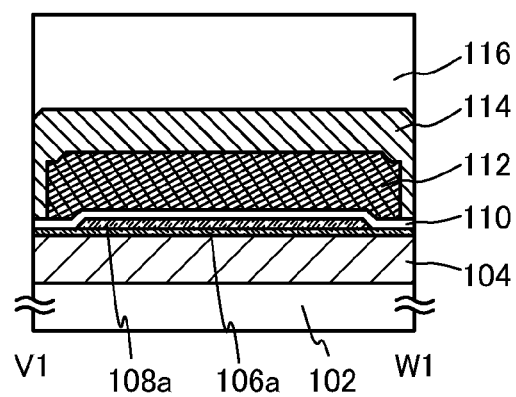

A plan view and cross-sectional views of a top-gate transistor as an example of the semiconductor device are illustrated in FIGS. 1A to 1C. FIG. 1A is the plan view, FIG. 1B corresponds to a cross-sectional view taken along line X1-Y1 in FIG. 1A, and FIG. 1C corresponds to a cross-sectional view taken along line V1-W1 in FIG. 1A.

Note that in FIG. 1A, some components of the semiconductor device (e.g., a gate insulating film 110) are omitted for simplicity.

The semiconductor device illustrated in FIGS. 1A to 1C includes an oxide film 104; a first oxide semiconductor film 106 formed over the oxide film 104; a second oxide semiconductor film 108 formed over the first oxide semiconductor film 106; the gate insulating film 110 formed over the second oxide semiconductor film 108; and a gate electrode 112 which is in contact with the gate insulating film 110 and formed in a region overlapping with the second oxide semiconductor film 108.

The first oxide semiconductor film 106 and the second oxide semiconductor film 108 are each formed using an oxide film containing at least indium, gallium, and zinc, and the content percentage of gallium in the first oxide semiconductor film 106 is higher than in the second oxide semiconductor film 108.

Further, in the first oxide semiconductor film 106, the content percentage of gallium is higher than or equal to that of indium. Furthermore, in the second oxide semiconductor film 108, the content percentage of indium is higher than that of gallium. The high content percentage of indium in the second oxide semiconductor film 108 can lead to higher crystallinity of the second oxide semiconductor film 108.

The first oxide semiconductor film 106 and the second oxide semiconductor film 108 are stacked and have different compositions as described above. Further, the first oxide semiconductor film 106 can suppress oxygen release from the oxide film 104 at the time of the formation of the second oxide semiconductor film 108.

The following will discuss a structure without the first oxide semiconductor film 106. In this case, the second oxide semiconductor film 108 is to be formed directly on the oxide film 104. To deposit the second oxide semiconductor film 108 while heating it at 400° C. for example, oxygen would be released from the oxide film 104 before the formation of the second oxide semiconductor film 108. Therefore, after the formation of second oxide semiconductor film 108, the amount of oxygen released from the oxide film 104 becomes small, resulting in insufficient oxygen supply to the second oxide semiconductor film 108. Further, in the case where the material of the oxide film 104 is different from that of the second oxide semiconductor 108, e.g., silicon oxide, silicon that is contained in the oxide film 104 might be mixed into the second oxide semiconductor film 108 to interfere with the crystallization of the second oxide semiconductor film 108.

In contrast, in a structure described in this embodiment in which, for example, after the oxide film 104 is formed, the first oxide semiconductor film 106 is formed at a low temperature (e.g., higher than or equal to room temperature and lower than or equal to 200° C.) and the second oxide semiconductor film 108 is formed at a high temperature (e.g., higher than or equal to 250° C. to lower than or equal to 500° C., preferably higher than or equal to 300° C. and lower than or equal to 400° C.), the first oxide semiconductor film 106 can suppress oxygen release from the oxide film 104. Further, the second oxide semiconductor film 108 is formed over the first oxide semiconductor film 106 which is formed using the same kinds of materials as the second oxide semiconductor film 108, whereby no impurities or very few impurities, if any, are mixed into the second oxide semiconductor film 108. Accordingly, the second oxide semiconductor film 108 can have a crystal portion that grows from the interface with the first oxide semiconductor film 106.

That is, the first oxide semiconductor film 106 suppresses oxygen release from the oxide film 104 at least at the time of the deposition of the second oxide semiconductor film 108, and also serves as a base film for the second oxide semiconductor film 108, resulting in higher crystallinity of the second oxide semiconductor film 108. After the second oxide semiconductor film 108 is formed, oxygen is released from the oxide film 104 by heat treatment or the like, and then the oxygen can pass through the first oxide semiconductor film 106 to be supplied to the second oxide semiconductor film 108.

A structure in which the first oxide semiconductor film 106 and the second oxide semiconductor film 108 are thus stacked has an excellent effect of suppressing the generation of oxygen deficiency in the second oxide semiconductor film 108 and of facilitating the crystallinity of the second oxide semiconductor film 108.

High crystallinity of the second oxide semiconductor film 108 can make the bonding state of metal atoms and oxygen atoms therein ordered, thereby suppressing the generation of oxygen deficiency. Even though oxygen deficiency is generated, it would be repaired by oxygen supply from the oxide film 104.

Note that in the first oxide semiconductor film 106, high-resistance regions 106a are formed in a region overlapping with the gate electrode 112 and regions outside the second oxide semiconductor film 108, and a pair of low-resistance regions 106b is formed adjacent to the region overlapping with the gate electrode 112. Further, in the second oxide semiconductor film 108, a channel region 108a is formed in a region overlapping with the gate electrode 112, and a pair of low-resistance regions 108b is formed adjacent to the region overlapping with the gate electrode 112.

The high-resistance region 106a formed outside the second oxide semiconductor film 108 serves as a separation layer between transistors. This is to prevent electrical connection between adjacent transistors, for example, which would occur in the case where the high-resistance region 106a is not provided outside the second oxide semiconductor film 108.

The semiconductor device may also include a protective insulating film 114 formed over the gate electrode 112, an interlayer insulating film 116 formed over the protective insulating film 114, and a source electrode 118a and a drain electrode 118b which are formed over the interlayer insulating film 116 and electrically connected to the second oxide semiconductor film 108. Note that since the source electrode 118a and the drain electrode 118b are in contact with the pair of low-resistance regions 108b formed in the second oxide semiconductor film 108, the contact resistance can be low.

The following will show each component that can be included in the semiconductor device of one embodiment of the present invention in detail.

[Detailed Description of Substrate]

Although there is no particular limitation on a substrate that can be used as a substrate 102, it is necessary that the substrate have heat resistance to withstand at least heat treatment performed later. For example, a glass substrate of barium borosilicate glass, aluminoborosilicate glass, or the like, a ceramic substrate, a quartz substrate, or a sapphire substrate can be used. Alternatively, a single-crystal semiconductor substrate of silicon, silicon carbide, or the like, a polycrystalline semiconductor substrate, a compound semiconductor substrate of silicon germanium or the like, an SOI substrate, or the like can be used.

[Detailed Description of Oxide Film]

The oxide film 104 has the effect of preventing diffusion of an impurity element such as hydrogen or moisture from the substrate 102, and can be formed with a single-layer structure or a stacked structure using one or more of a silicon oxide film, a silicon nitride oxide film, and a silicon oxynitride film. In addition, the oxide film 104 preferably has another effect to supply oxygen to the first oxide semiconductor film 106 and the second oxide semiconductor film 108, which are to be formed later. In the case where a silicon oxide film is used as the oxide film 104 for example, part of oxygen therein can be released by heating the oxide film 104, so that oxygen can be supplied to the first oxide semiconductor film 106 and the second oxide semiconductor film 108 to repair oxygen deficiency in the first oxide semiconductor film 106 and the second oxide semiconductor film 108.

In particular, the oxide film 104 preferably contains oxygen at an amount that exceeds at least the stoichiometry. For example, a silicon oxide film of $SiO_{2+\alpha}$ ($\alpha>0$) is preferably used as the oxide film 104. With the use of such a silicon oxide film as the oxide film 104, oxygen can be supplied to the first oxide semiconductor film 106 and the second oxide semiconductor film 108.

[Detailed Description of First Oxide Semiconductor Film]

The first oxide semiconductor film 106 is an oxide film containing at least indium, gallium, and zinc, and can be formed using an In—Ga—Zn-based oxide (also expressed as IGZO). Note that the In—Ga—Zn-based oxide means an oxide containing In, Ga, and Zn, and may contain a metal element other than In, Ga, or Zn. For example, it is possible to use an In—Sn—Ga—Zn-based oxide, an In—Hf—Ga—Zn-based oxide, or an In—Al—Ga—Zn-based oxide.

The first oxide semiconductor film 106 has a lower content percentage of indium and a higher content percentage of gallium than the second oxide semiconductor film 108. Further, in the first oxide semiconductor film 106, the content percentage of gallium is higher than or equal to that of indium. That is, it is preferable to use an oxide in which content percentages can be expressed as In≤Ga. For example, it is preferable to use an In—Ga—Zn-based oxide having an atomic ratio of In:Ga:Zn=1:1:1 or 1:3:2, or an oxide having a composition in the neighborhood of the above composition.

Further, the first oxide semiconductor film 106 can be formed by a sputtering method, an atomic layer deposition (ALD) method, an evaporation method, a coating method, or the like. The thickness of the first oxide semiconductor film 106 is greater than 5 nm and less than or equal to 200 nm, preferably greater than or equal to 10 nm and less than or equal to 30 nm. The first oxide semiconductor film 106 is in a single crystal state, a polycrystalline (also referred to as polycrystal) state, an amorphous state, or the like.

[Detailed Description of Second Oxide Semiconductor Film]

The second oxide semiconductor film 108 is an oxide film containing at least indium, gallium, and zinc, and can be formed using an In—Ga—Zn-based oxide (also expressed as IGZO). Note that the In—Ga—Zn-based oxide means an oxide containing In, Ga, and Zn, and may contain a metal element other than In, Ga, or Zn. For example, it is possible to use an In—Sn—Ga—Zn-based oxide, an In—Hf—Ga—Zn-based oxide, or an In—Al—Ga—Zn-based oxide.

The second oxide semiconductor film 108 has a higher content percentage of indium and a lower content percentage of gallium than the first oxide semiconductor film 106. Further, in the second oxide semiconductor film 108, the content percentage of indium is higher than that of gallium. That is, it is preferable to use an oxide in which content percentages can be expressed as In>Ga. For example, it is preferable to use an In—Ga—Zn-based oxide having an atomic ratio of In:Ga:Zn=3:1:2 or 2:1:3, or an oxide having a composition in the neighborhood of the above composition.

Further, the second oxide semiconductor film 108 can be formed by a sputtering method, an ALD method, an evaporation method, a coating method, or the like. The thickness of the second oxide semiconductor film 108 is greater than 5 nm and less than or equal to 200 nm, preferably greater than or equal to 10 nm and less than or equal to 30 nm. The second oxide semiconductor film 108 preferably has crystallinity, such as a single crystal state, a polycrystalline (also referred to as polycrystal) state, or a microcrystalline state.

Further, the second oxide semiconductor film 108 is preferably a CAAC-OS (c-axis aligned crystalline oxide semiconductor) film. The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electrical characteristics of the transistor due to irradiation with visible light or ultraviolet light can be reduced. Change and variation in threshold voltages can be suppressed. Thus, the transistor has high reliability.

In a crystal portion or a crystalline oxide semiconductor film, defects in the bulk can be further reduced. Further, when the surface planarity of the crystal portion or the crystalline oxide semiconductor film is enhanced, a transistor including the oxide semiconductor can have higher field-effect mobility than a transistor including an amorphous oxide semiconductor. In order to enhance the surface planarity of the oxide semiconductor film, the oxide semiconductor is preferably formed over a flat surface. Specifically, the oxide semiconductor is preferably formed over a surface with an average surface roughness ($R_a$) less than or equal to 0.15 nm, preferably less than or equal to 0.1 nm.

Note that $R_a$ is obtained by expanding arithmetic mean deviation, which is defined by JIS B 0601, into three dimensions so as to be applicable to a surface. Moreover, $R_a$ can be expressed as an average value of the absolute values of deviations from a reference surface to a specific surface and is defined by the following formula.

$$Ra = \frac{1}{S_0} \int_{y_1}^{y_2} \int_{x_1}^{x_2} |f(x,y) - Z_0| \, dx \, dy \qquad \text{[FORMULA 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(X_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

There are three methods for forming a CAAC-OS film when the CAAC-OS film is used as the second oxide semiconductor film 108. The first method is to form an oxide semiconductor film at a temperature higher than or equal to 200° C. and lower than or equal to 450° C. to form, in the oxide semiconductor film, crystal parts in which the c-axes are aligned in the direction parallel to a normal vector of a surface where the oxide semiconductor film is formed or a normal vector of a surface of the oxide semiconductor film. The second method is to form an oxide semiconductor film with a small thickness and then heat it at a temperature higher than or equal to 200° C. and lower than or equal to 700° C., to form, in the oxide semiconductor film, crystal parts in which the c-axes are aligned in the direction parallel to a normal vector of a surface where the oxide semiconductor film is formed or a normal vector of a surface of the oxide semiconductor film. The third method is to form one oxide semiconductor film with a small thickness, then heat it at a temperature higher than or equal to 200° C. and lower than or equal to 700° C., and form another oxide semiconductor film, to form, in the oxide semiconductor film, crystal parts in which the c-axes are aligned in the direction parallel to a normal vector of a surface where the oxide semiconductor film is formed or a normal vector of a surface of the oxide semiconductor film.

By heating the substrate 102 during deposition, the concentration of an impurity such as hydrogen or water in the second oxide semiconductor film 108 can be reduced. In addition, damage by sputtering can be reduced, which is preferable. The second oxide semiconductor film 108 may be formed by an ALD method, an evaporation method, a coating method, or the like.

Note that when an oxide semiconductor film (single crystal or microcrystalline) having crystallinity different from the CAAC-OS film is formed as the second oxide semiconductor film 108, the deposition temperature is not particularly limited.

The energy gap of the second oxide semiconductor film 108 is 2.8 eV to 3.2 eV, and is greater than that of silicon (1.1 eV). The minor carrier density of the second oxide semiconductor film 108 is $1 \times 10^{-9}/cm^3$, which is much smaller than the intrinsic carrier density of silicon ($1 \times 10^{11}/cm^3$).

Majority carriers (electrons) of the second oxide semiconductor film 108 flow only from a source of a transistor. Further, a channel formation region can be depleted completely. Thus, an off-state current of the transistor can be extremely small. The off-state current of the transistor including the second oxide semiconductor film 108 is as small as 10 yA/μm or less at room temperature, or 1 yA/μm or less at 85° C. to 95° C.

In the case of an n-channel transistor, the off-state current in this specification is current that flows between a source electrode and a drain electrode when the potential of a gate electrode is less than or equal to 0 V with the potential of the source electrode as a reference potential while the potential of the drain electrode is higher than those of the source electrode and the gate electrode. Alternatively, in the case of a p-channel transistor, the off-state current in this specification is current that flows between a source electrode and a drain electrode when the potential of a gate electrode is greater than or equal to 0 V with the potential of the source electrode as a reference potential while the potential of the drain electrode is lower than those of the source electrode and the gate electrode.

Further, a transistor including the second oxide semiconductor film 108 has an ideally low S value. The transistor also has high reliability.

[Detailed Description of Gate Insulating Film]

The gate insulating film 110 can be formed using a silicon oxide film, a gallium oxide film, an aluminum oxide film, a silicon nitride film, a silicon oxynitride film, an aluminum oxynitride film, a silicon nitride oxide film, or the like. It is preferable that the gate insulating film 110 contain oxygen in a portion which is in contact with the second oxide semiconductor film 108. In particular, the gate insulating film 110 preferably contains oxygen at an amount that exceeds at least the stoichiometry. For example, in the case where a silicon oxide film is used as the gate insulating film 110, a film of $SiO_{2+\alpha}$ ($\alpha>0$) is preferably used. With the use of the silicon oxide film as the gate insulating film 110, oxygen can be supplied to the second oxide semiconductor film 108 and excellent electric characteristics can be obtained.

The gate insulating film 110 can be formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide. With the use of such a material, gate leakage current can be reduced. Further, the gate insulating film 110 may have a single-layer structure or a stacked structure.

Further, the gate insulating film 110 can have a thickness greater than or equal to 1 nm and less than or equal to 500 nm There is no particular limitation on a method for forming the gate insulating film 110; for example, a sputtering method, an MBE method, a PE-CVD method, a pulse laser deposition method, an ALD method, or the like can be employed as appropriate.

[Detailed Description of Gate Electrode]

For the gate electrode 112, it is possible to use a metal material such as molybdenum, titanium, tantalum, tungsten, aluminum, copper, neodymium, or scandium, or an alloy material containing any of these materials, for example. Alternatively, the gate electrode 112 may be formed using a conductive metal oxide. As the conductive metal oxide, indium oxide ($In_2O_3$), tin oxide ($SnO_2$), zinc oxide ($ZnO$), indium tin oxide ($In_2O_3$—$SnO_2$, which is abbreviated to ITO in some cases), indium zinc oxide ($In_2O_3$—$ZnO$), or any of these metal oxide materials containing silicon or silicon oxide can be used. The gate electrode 112 can be formed to have a single-layer structure or a stacked structure using any of the above materials. There is no particular limitation on the method for forming the gate electrode 112, and a variety of deposition methods such as an evaporation method, a PE-CVD method, a sputtering method, or a spin coating method can be employed.

[Detailed Description of Protective Insulating Film]

The protective insulating film 114 is preferably formed using an inorganic insulating film and may be formed as a single layer or a stacked layer using any of oxide insulating films such as a silicon oxide film, a silicon oxynitride film, an aluminum oxide film, an aluminum oxynitride film, a gallium oxide film, and a hafnium oxide film. Further, over the above oxide insulating film, a single layer or a stacked layer using any of nitride insulating films such as a silicon nitride film, a silicon nitride oxide film, an aluminum nitride film, and an aluminum nitride oxide film may be formed. For example, as a stacked layer, a silicon oxide film and an aluminum oxide film can be formed in this order over the gate electrode 112 by a sputtering method. There is no particular limitation on a method for forming the protective insulating film 114; for example, a sputtering method, an MBE method, a PE-CVD method, a pulse laser deposition method, an ALD method, or the like can be employed as appropriate.

Alternatively, in particular, a dense inorganic insulating film is preferably formed as the protective insulating film 114. For example, an aluminum oxide film can be formed by a sputtering method. By forming an aluminum oxide film having high density (a film density of 3.2 $g/cm^3$ or higher, preferably 3.6 $g/cm^3$ or higher), a high shielding effect (blocking effect) of preventing the protective insulating film 114 from transmitting both oxygen and an impurity such as hydrogen or moisture which might enter the second oxide semiconductor film 108 can be obtained. Therefore, in and after the manufacturing process, the aluminum oxide film functions as a protective film to prevent an impurity such as hydrogen or moisture, which causes a change of the second oxide semiconductor film 108, from being mixed into the second oxide semiconductor film 108 and to prevent oxygen from being released, which is a main constituent material of the second oxide semiconductor film 108. Note that the film density can be measured by Rutherford backscattering spectrometry (RBS) or X-ray reflection (XRR).

[Detailed Description of Interlayer Insulating Film]

The interlayer insulating film 116 is preferably formed using an inorganic insulating film and may be formed as a single layer or a stacked layer using any of a silicon oxide film, a silicon oxynitride film, a silicon nitride film, and a silicon nitride oxide film. There is no particular limitation on a method for forming the interlayer insulating film 116; for example, a sputtering method, an MBE method, a PE-CVD method, a pulse laser deposition method, an ALD method, or the like can be employed as appropriate.

[Detailed Description of Source Electrode and Drain Electrode]

As each of the source electrode 118a and the drain electrode 118b, for example, a metal film containing an element selected from aluminum, chromium, copper, tantalum, titanium, molybdenum, or tungsten, or a metal nitride film containing any of the above elements as its component (e.g., a titanium nitride film, a molybdenum nitride film, or a tungsten nitride film) can be used. Alternatively, each of the source electrode 118a and the drain electrode 118b may have a structure in which a film of a high-melting-point metal such as titanium, molybdenum, or tungsten, or a nitride film of any of these metals (e.g., a titanium nitride film, a molybdenum nitride film, or a tungsten nitride film) is stacked on either or both of the bottom surface and the top surface of a metal film of aluminum, copper, or the like. Further, a conductive film used for the source electrode 118a and the drain electrode 118b may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, abbreviated to ITO), or indium zinc oxide ($In_2O_3$—ZnO) can be used. The conductive film used for the source electrode and the drain electrode can be formed with a single-layer structure or a stacked structure using any of the above materials. There is no particular limitation on the method for forming the conductive film, and a variety of deposition methods such as an evaporation method, a PE-CVD method, a sputtering method, or a spin coating method can be employed.

Note that details of the other components will be described in [Method 1 for Manufacturing Semiconductor Device] below, with reference to FIGS. 2A to 2D and FIGS. 3A to 3D.

[Method 1 for Manufacturing Semiconductor Device]

An example of a method for manufacturing the semiconductor device illustrated in FIGS. 1A to 1C of this embodiment will be described below with reference to FIGS. 2A to 2D and FIGS. 3A to 3D.

Figure 2A:
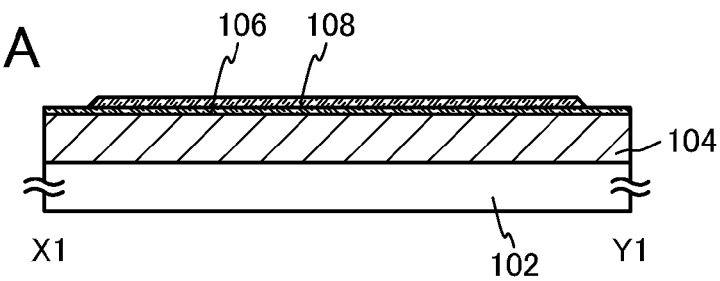
FIGS. 2A to 2D are cross-sectional views illustrating an example of a manufacturing process of a semiconductor device.

First, the substrate 102 is prepared, and then the oxide film 104, the first oxide semiconductor film 106, and the second oxide semiconductor film 108 are formed over the substrate 102 (see FIG. 2A).

The substrate 102 may be subjected to plasma treatment or the like before the oxide film 104 is formed. As plasma treatment, reverse sputtering in which an argon gas is introduced and plasma is generated can be performed. The reverse sputtering refers to a method in which an RF power source is used for application of a voltage to the substrate 102 side in an argon atmosphere so that plasma is generated in the vicinity of the substrate 102 to modify a surface of the substrate. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the substrate 102.

As a method for forming the second oxide semiconductor film 108, the oxide semiconductor film is etched by a dry etching method. As an etching gas, $BCl_3$, $Cl_2$, $O_2$, or the like can be used. A dry etching apparatus using a high-density plasma source such as ECR or ICP can be used to improve an etching rate. Etching conditions of the second oxide semiconductor film 108 may be selected as appropriate by a practitioner such that the first oxide semiconductor film 106 is not processed into an island shape in a step for forming the second oxide semiconductor film 108. An end portion of the second oxide semiconductor film 108 is preferably tapered at an angle of 20° to 50°.

Note that the oxide film 104, the first oxide semiconductor film 106, and the second oxide semiconductor film 108 are preferably deposited successively without being exposed to the air; in particular, the first oxide semiconductor film 106 and the second oxide semiconductor film 108 are preferably deposited successively. In this manner, by depositing the oxide film 104, the first oxide semiconductor film 106, and the second oxide semiconductor film 108 successively without being exposed to the air, it is possible to suppress mixing of an impurity element such as moisture or hydrogen contained in the air into each interface.

In a step for depositing the first oxide semiconductor film 106 and the second oxide semiconductor film 108, it is preferable that the first oxide semiconductor film 106 and the second oxide semiconductor film 108 do not contain hydrogen or water as much as possible. Thus, as pretreatment of the step for depositing the first oxide semiconductor film 106 and the second oxide semiconductor film 108, for example, it is preferable that the substrate 102 provided with the oxide film 104 be preheated in a preheating chamber of a sputtering apparatus to remove and exhaust an impurity such as hydrogen or moisture adsorbed to the substrate 102 and the oxide film 104. Note that the temperature of the pretreatment is set such that no oxygen, or little oxygen, if any, is released from the oxide film 104. The first oxide semiconductor film 106 and the second oxide semiconductor film 108 are preferably deposited in a deposition station (also referred to as a deposition chamber) from which remaining moisture is exhausted, and are more preferably deposited successively in vacuum with the use of a multichamber sputtering apparatus with a plurality of deposition stations.

To remove the moisture in a preheating chamber and the deposition chamber, an entrapment vacuum pump, for example, a cryopump, an ion pump, or a titanium sublimation pump is preferably used. Further, an exhaustion unit may be a turbo pump provided with a cold trap. From the preheating chamber and the deposition chamber which are exhausted with a cryopump, a hydrogen atom, a compound containing a hydrogen atom such as water ($H_2O$) (more preferably, also a compound containing a carbon atom), and the like are exhausted, whereby the concentration of an impurity such as hydrogen or moisture in the first oxide semiconductor film 106 and the second oxide semiconductor film 108 can be reduced.

Note that in this embodiment, the first oxide semiconductor film 106 and the second oxide semiconductor film 108 are deposited by a sputtering method using a metal oxide target with an atomic ratio of In:Ga:Zn=1:1:1 and a metal oxide target with an atomic ratio of In:Ga:Zn=3:1:2, respectively. Note that the targets that can be used for forming the first oxide semiconductor film 106 and the second oxide semiconductor film 108 are not limited to the targets including the above materials with the above ratios. Further, the targets that can be used for forming the first oxide semiconductor film 106 and the second oxide semiconductor film 108 preferably have crystallinity; that is, a single crystalline target, a polycrystalline target, or the like are preferably used. With the use of the target having crystallinity, formed thin films also have crystallinity; specifically, the formed thin films tend to have a c-axis-aligned crystal.

Here, methods for manufacturing sputtering targets each including an oxide semiconductor having a crystal region in which the direction of the c-axis is parallel to a normal vector of the top surface of the oxide semiconductor will be described (see FIG. 29).

First, raw materials for the sputtering target are weighed (step S101).

Here, an $InO_X$ raw material (a raw material containing In), a $GaO_Y$ raw material (a raw material containing Ga), and a $ZnO_Z$ raw material (a raw material containing Zn) are prepared as raw materials for the sputtering target. Note that X, Y, and Z are each a given positive number; for example, X, Y, and Z are 1.5, 1.5, and 1, respectively. It is needless to say that the above raw materials are an example, and raw materials can be selected as appropriate in order to obtain a desired compound. For example, a $MO_Y$ raw material may be used instead of the $GaO_Y$ raw material. Note that Sn, Hf, or Al can be used as M. Alternatively, the following lanthanoid may be used as M: La, Ce, Pr, Nd, Sm, Eu, Gd, Tb, Dy, Ho, Er, Tm, Yb, or Lu. Although the case where three kinds of raw materials are used is shown as an example in this embodiment, one embodiment of the present invention is not limited thereto. For example, this embodiment may be applied to the case where four or more kinds of raw materials are used.

Next, the $InO_X$ raw material, the $GaO_Y$ raw material, and the $ZnO_Z$ raw material are mixed in a predetermined ratio.

For example, the predetermined ratio of the $InO_X$ raw material, the $GaO_Y$ raw material, and the $ZnO_Z$ raw material is 2:2:1, 8:4:3, 3:1:1, 1:1:1, 4:2:3, 1:1:2, 3:1:4, or 3:1:2 in a molar ratio. With the use of a mixed material having such a ratio, a sputtering target including an oxide semiconductor having a crystal region in which the direction of the c-axis is parallel to a normal vector of the top surface of the oxide semiconductor can be easily obtained.

More specifically, in the case of forming a sputtering target of In—Ga—Zn-based oxide having a composition of In:Ga:Zn=1:1:1 [atomic ratio], the raw materials are weighed so that $In_2O_3$:$Ga_2O_3$:ZnO=1:1:2 [molar ratio].

Note that also in the case where the $MO_Y$ raw material is used instead of the $GaO_Y$ raw material, the ratio of the $InO_X$ raw material, the $MO_Y$ raw material, and the $ZnO_Z$ raw material is 2:2:1, 8:4:3, 3:1:1, 1:1:1, 4:2:3, 1:1:2, 3:1:4, or 3:1:2 in a molar ratio.

A method for forming the sputtering target using a wet method is described. The raw materials for the sputtering target are weighed, and then, the raw materials are ground and mixed with a ball mill or the like to obtain compound powder. Ion-exchange water, an organic additive, and the like are further mixed into the compound powder to form slurry (step S111).

Then, the slurry is poured into a mold provided with a moisture-permeable filter, so that moisture is removed. The mold may be formed using a metal or an oxide and the upper shape thereof is rectangular or rounded. The mold can be provided with one or more holes at the bottom. With the plural holes, moisture of the slurry can be removed rapidly. A porous resin, cloth, or the like may be used for the filter.

Moisture is removed from the slurry in such a manner that water is removed under reduced pressure through the hole provided at the bottom of the mold into which the slurry is poured. Next, the slurry from which moisture has been removed under reduced pressure is naturally dried. Thus, the slurry from which moisture has been removed is molded into the internal shape of the mold (step S113).

Then, the molded body is baked in an oxygen ($O_2$) atmosphere at 1400° C. (step S114). Through the above-described steps, the sputtering target can be obtained using a wet method.

Next, a method for forming the sputtering target using a dry method will be described. The raw materials for the sputtering target are weighed, and then, the raw materials are ground and mixed with a ball mill or the like to obtain compound powder (step S121).

The compound powder obtained is spread over a mold, and pressure is applied thereto with a pressing machine, whereby the compound powder is molded to obtain a molded body (step S122).

The molded body is placed in a heating apparatus such as an electric furnace and baked in an oxygen ($O_2$) atmosphere at a temperature of 1400° C. (step S123). Note that in this embodiment, a method in which a molding step and a baking step are separated as in step S122 and step S123 is referred to as a cold press method. As a comparison example of a cold press method, a hot press method in which a molding step and a baking step are concurrently performed will be described below.

First, the above-described steps up to and including step S121 are performed. The compound powder obtained is spread over the mold, and pressure is applied with a pressing machine to the compound powder provided on the inner side of the mold while the mold is heated in an argon (Ar) atmosphere at a temperature of 1000° C. In this manner, pressure is applied to the compound powder with the compound powder baked, whereby the compound powder can be molded to obtain a molded body (step S125). Through the above-described steps, the sputtering target can be obtained using a dry method.

Further, the first oxide semiconductor film 106 and the second oxide semiconductor film 108 can be formed by a sputtering method in a rare gas (typically argon) atmosphere, an oxygen atmosphere, or a mixed atmosphere of a rare gas and oxygen.

The temperature for depositing the first oxide semiconductor film 106 is preferably higher than or equal to room temperature and lower than or equal to 200° C., and the temperature for depositing the second oxide semiconductor film 108 is preferably higher than or equal to 250° C. and lower than or equal to 500° C., more preferably higher than or equal to 300° C. and lower than or equal to 400° C.

In this manner, by depositing the first oxide semiconductor film 106 at a low temperature (higher than or equal to room temperature and lower than or equal to 200° C.) and the second oxide semiconductor film 108 at a high temperature (higher than or equal to 250° C. and lower than or equal to 500° C.), oxygen release from the oxide film 104 can be suppressed and the second oxide semiconductor film 108 can have higher crystallinity.

In addition, shortly after the first oxide semiconductor film 106 and the second oxide semiconductor film 108 are deposited, it is preferable that the oxide semiconductor films contain oxygen at an amount that exceeds at least the stoichiometry, i.e., the oxide semiconductor films be supersaturated. As an example, in the case where the first oxide semiconductor film 106 and the second oxide semiconductor film 108 are deposited by a sputtering method, the deposition is preferably performed under the condition where the proportion of oxygen in a deposition gas is large, and in particular, the deposition is preferably performed in an oxygen atmosphere (an oxygen gas: 100%). For example, in the case where an In—Ga—Zn-based oxide (IGZO) is to be used for the first oxide semiconductor film 106 and the second oxide semiconductor film 108, and the deposition is performed under the condition where the proportion of oxygen in the deposition gas is large (in particular, in an atmosphere of an oxygen gas of 100%), Zn release from the films can be suppressed even when the deposition temperature is 300° C. or higher.

Further, when the first oxide semiconductor film 106 is formed using the above-described metal oxide target, the composition of the target is different from that of the thin film formed over the substrate in some cases. For example, when the metal oxide target of In:Ga:Zn=1:1:1 [atomic ratio] is used, the composition of the first oxide semiconductor film 106, which is a thin film, becomes In:Ga:Zn=1:1:0.6 to 1:1:0.8 [atomic ratio] in some cases, although it depends on the deposition conditions. This is because in deposition of the first oxide semiconductor film 106 and the second oxide semiconductor film 108, ZnO is sublimed, or because a sputtering rate differs between the components of $In_2O_3$, $Ga_2O_3$, and ZnO.

Accordingly, in order to form a thin film having a desired composition ratio, the composition of the metal oxide target needs to be adjusted in advance. For example, in order to make the composition of the first oxide semiconductor film 106, which is a thin film, be In:Ga:Zn=1:1:1 [atomic ratio], the composition of the metal oxide target is preferably In:Ga:Zn=1:1:1.5 [atomic ratio]. In other words, the content percentage of ZnO in the metal oxide target is preferably made higher in advance. The composition of the target is not limited to the above value, and can be adjusted as appropriate depending on the deposition conditions or the composition of the thin film to be formed. Further, it is preferable to increase the content percentage of ZnO in the metal oxide target because in that case, the obtained thin film can have higher crystallinity. The above description has been about the first oxide semiconductor film 106; in a similar manner, to form a thin film having a desired composition as the second oxide semiconductor film 108, the composition of the metal oxide target may be adjusted.

The relative density of the metal oxide target is 90% to 100% inclusive, preferably, 95% to 99.9% inclusive. With the use of the metal oxide target having high relative density, the first oxide semiconductor film 106 and the second oxide semiconductor film 108, which are deposited, can be dense.

As a sputtering gas used for depositing the first oxide semiconductor film 106 and the second oxide semiconductor film 108, it is preferable to use a high-purity gas from which an impurity such as hydrogen, water, a hydroxyl group, or hydride is removed.

After the second oxide semiconductor film 108 is formed, the second oxide semiconductor film 108 may be subjected to heat treatment. The temperature of the heat treatment is higher than or equal to 300° C. and lower than or equal to 700° C., or lower than the strain point of the substrate. The heat treatment can remove excess hydrogen (including water and a hydroxyl group) from the second oxide semiconductor film 108. Note that the heat treatment is also referred to as dehydration treatment (dehydrogenation treatment) in this specification and the like in some cases.

Oxygen might be released from the oxide film 104 during the dehydration treatment. To prevent this, the temperature of the dehydration treatment may be selected as appropriate by a practitioner such that excess hydrogen (including water and a hydroxyl group) can be removed from the second oxide semiconductor film 108 and oxygen release from the oxide film 104 can be suppressed. Note that the dehydration treatment might cause oxygen release from the oxide film 104; however, since the first oxide semiconductor film 106 is formed, the oxygen release from the oxide film 104 can be suppressed and the dehydration treatment can be performed effectively.

The heat treatment can be performed in such a manner that, for example, an object to be processed is introduced into an electric furnace in which a resistance heater or the like is used and heated at 450° C. in a nitrogen atmosphere for one hour. The second oxide semiconductor film 108 is not exposed to the air during the heat treatment so that the entry of water and hydrogen can be prevented.

A heat treatment apparatus is not limited to the electric furnace and may be an apparatus for heating an object to be processed by thermal conduction or thermal radiation from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp.

A GRTA apparatus is an apparatus for performing heat treatment using a high-temperature gas. As the gas, an inert gas which does not react with an object to be processed by heat treatment, such as nitrogen or a rare gas such as argon is used.

As the heat treatment, for example, a GRTA process may be performed as follows. The object is put in a heated inert gas atmosphere, heated for several minutes, and taken out of the inert gas atmosphere. The GRTA process enables high-temperature heat treatment for a short time. Moreover, the GRTA process can be employed even when the temperature exceeds the upper temperature limit of the object. Note that the inert gas may be switched to a gas containing oxygen during the process.

Note that as the inert gas atmosphere, an atmosphere that contains nitrogen or a rare gas (e.g., helium, neon, or argon) as its main component and does not contain water, hydrogen, or the like is preferably used. The purity of nitrogen or a rare gas such as helium, neon, or argon introduced into a heat treatment apparatus is, for example, 6N (99.9999%) or higher, preferably 7N (99.99999%) or higher (that is, the concentration of an impurity is 1 ppm or lower, preferably 0.1 ppm or lower).

The dehydration treatment (dehydrogenation treatment) might be accompanied by release of oxygen which is a main constituent material of the second oxide semiconductor film 108 to lead to a reduction in oxygen. Oxygen deficiency exists in a portion where oxygen is released in the second oxide semiconductor film 108, and a donor level which leads to a change in the electrical characteristics of a transistor is formed owing to the oxygen deficiency. Therefore, in the case where the dehydration treatment (dehydrogenation treatment) is performed, oxygen is preferably supplied to the second oxide semiconductor film 108. By supply of oxygen to the second oxide semiconductor film 108, oxygen deficiency in the second oxide semiconductor film 108 can be repaired.

The oxygen deficiency in the second oxide semiconductor film 108 may be repaired in the following manner for example: after the second oxide semiconductor film 108 is subjected to the dehydration treatment (dehydrogenation treatment), a high-purity oxygen gas, a high-purity nitrous oxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) is introduced into the same furnace. It is preferable that water, hydrogen, or the like not be contained in the oxygen gas or the nitrous oxide gas. The purity of the oxygen gas or the nitrous oxide gas which is introduced into the heat treatment apparatus is preferably 6N (99.9999%) or higher, more preferably 7N (99.99999%) or higher (i.e., the impurity concentration in the oxygen gas or the nitrous oxide gas is preferably 1 ppm or lower, more preferably 0.1 ppm or lower).

As an example of a method for supplying oxygen to the second oxide semiconductor film 108, oxygen (including at least any one of oxygen radicals, oxygen atoms, and oxygen ions) is added to the second oxide semiconductor film 108 in order to supply oxygen to the second oxide semiconductor film 108. An ion implantation method, an ion doping method, a plasma immersion ion implantation method, plasma treatment, or the like can be employed as a method for adding oxygen.

As another example of a method for supplying oxygen to the second oxide semiconductor film 108, oxygen is supplied to the second oxide semiconductor film 108 in such a manner that the oxide film 104, the gate insulating film 110 to be formed later, or the like is heated and part of oxygen is released. In particular, in this embodiment, oxygen that is released from the oxide film 104 is preferably transmitted through the first oxide semiconductor film 106 to be supplied to the second oxide semiconductor film 108.

As described above, after the second oxide semiconductor film 108 is formed, the dehydration treatment (dehydrogenation treatment) is preferably performed to remove hydrogen or moisture from the second oxide semiconductor film 108, so that the second oxide semiconductor film 108 is highly purified and does not contain an impurity as much as possible. Further, oxygen whose amount is reduced in the dehydration treatment (dehydrogenation treatment) is preferably added to the second oxide semiconductor film 108 or supplied to repair oxygen deficiency in the second oxide semiconductor film 108. In this specification and the like, supplying oxygen to the second oxide semiconductor film 108 may be expressed as oxygen adding treatment. Alternatively, making the second oxide semiconductor film 108 contain oxygen at an amount that exceeds the stoichiometry may be expressed as treatment for making an oxygen-excess state.

Note that in the above-described case, the dehydration treatment (dehydrogenation treatment) and the oxygen adding treatment are performed after the second oxide semiconductor film 108 is processed into an island shape; however, one embodiment of the disclosed invention is not construed as being limited to the case. Such treatment may be performed before the second oxide semiconductor film 108 is processed into an island shape. Alternatively, after the interlayer insulating film 116 is formed, which is to be formed later, heat treatment may be performed so that oxygen is supplied from the oxide film 104, the gate insulating film 110, or the like to the second oxide semiconductor film 108.

In this manner, hydrogen or moisture is removed from the second oxide semiconductor film 108 by the dehydration treatment (dehydrogenation treatment) and oxygen deficiency therein are repaired by the oxygen adding treatment, whereby the oxide semiconductor film can be turned into an electrically i-type (intrinsic) or substantially i-type oxide semiconductor film. The oxide semiconductor film formed in such a manner contains extremely few (close to zero) carriers derived from a donor, and the carrier concentration thereof is lower than $1 \times 10^{14}/cm^3$, preferably lower than $1 \times 10^{12}/cm^3$, more preferably lower than $1 \times 10^{11}/cm^3$.

It is preferable that the second oxide semiconductor film 108 be highly purified and hardly contain an impurity such as copper, aluminum, or chlorine. In a process for manufacturing a transistor, it is preferable to select steps as appropriate where such an impurity might not be mixed into the second oxide semiconductor film 108 or be attached onto a surface thereof. In the case where such an impurity is attached onto the surface of the second oxide semiconductor film 108, the second oxide semiconductor film 108 is preferably exposed to oxalic acid or dilute hydrofluoric acid or subjected to plasma (e.g., $N_2O$ plasma), for example, so that the impurity on the surface of the second oxide semiconductor film 108 can be removed. Specifically, the second oxide semiconductor film 108 has a copper concentration of $1 \times 10^{18}$ atoms/cm$^3$ or lower, preferably $1 \times 10^{17}$ atoms/cm$^3$ or lower, an aluminum concentration of $1 \times 10^{18}$ atoms/cm$^3$ or lower, and a chlorine concentration of $2 \times 10^{18}$ atoms/cm$^3$ or lower.

The second oxide semiconductor film 108 is preferably highly purified by sufficient removal of an impurity such as hydrogen or sufficient supply of oxygen so as to be supersaturated with oxygen. Specifically, the second oxide semiconductor film 108 has a hydrogen concentration of $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the concentration of hydrogen in the second oxide semiconductor film 108 is measured by secondary ion mass spectrometry (SIMS). In order that the second oxide semiconductor film 108 is supersaturated with oxygen by sufficient supply of oxygen, it is preferable that an insulating film containing excess oxygen (e.g., a $SiO_x$ film) be provided so as to cover and be in contact with the second oxide semiconductor film 108.

The insulating film containing excess oxygen is formed using, for example, a $SiO_x$ film or a silicon oxynitride film by a PE-CVD method or a sputtering method such as to contain much oxygen by setting its deposition conditions as appropriate. To make excess oxygen be further contained in the insulating film, oxygen is added to the insulating film by an ion implantation method, an ion doping method, or plasma treatment.

Further, in the case where the hydrogen concentration in an insulating film containing excess oxygen is $7.2 \times 10^{20}$ atoms/cm$^3$ or higher, variations in initial characteristics of transistors are increased, a channel length dependence of electrical characteristics of a transistor is increased, and a transistor is significantly degraded in the BT stress test; therefore, the hydrogen concentration in the insulating film containing excess oxygen is preferably less than $7.2 \times 10^{20}$ atoms/cm$^3$. In other words, the hydrogen concentration in the second oxide semiconductor film 108 is preferably less than or equal to $5 \times 10^{19}$ atoms/cm$^3$, and the hydrogen concentration in the insulating film containing excess oxygen is preferably less than $7.2 \times 10^{20}$ atoms/cm$^3$.

Further, a blocking film (e.g., an $AlO_x$ film) that suppresses oxygen release from the second oxide semiconductor film 108 is preferably formed to cover the second oxide semiconductor film 108 and to be provided outside the insulating film containing excess oxygen.

By being covered with the insulating film containing excess oxygen or the blocking film, the second oxide semiconductor film 108 can be kept in a state that is substantially the same as the stoichiometry or in a supersaturated state in which the amount of oxygen exceeds the stoichiometry.

Figure 2B:
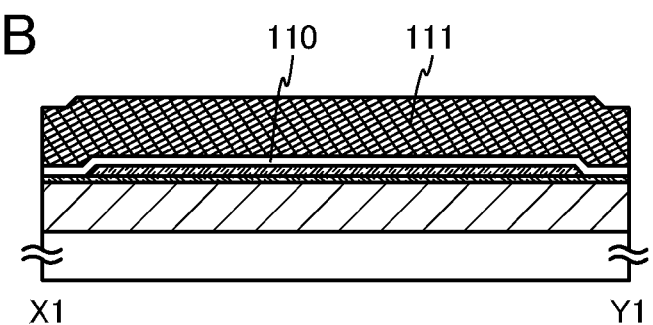

Next, the gate insulating film 110 and a conductive film 111 are formed over the first oxide semiconductor film 106 and the second oxide semiconductor film 108 (see FIG. 2B).

Figure 2C:
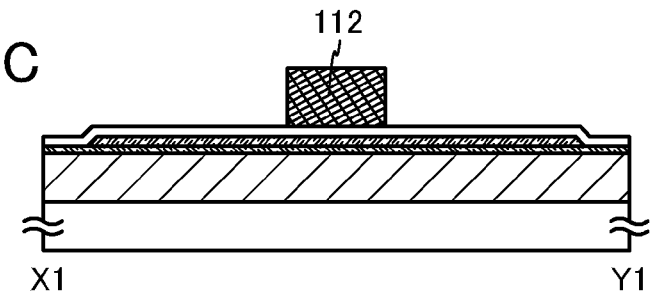

Next, through a photolithography step, a resist mask is formed over the conductive film 111, and selective etching is performed to form the gate electrode 112, and then the resist mask is removed (see FIG. 2C).

Note that a resist mask for forming the gate electrode 112 may be formed by an inkjet method, in which case manufacturing costs can be reduced because a photomask is not used. The gate electrode 112 may be etched by either dry etching or wet etching, or by both of them.

Figure 2D:
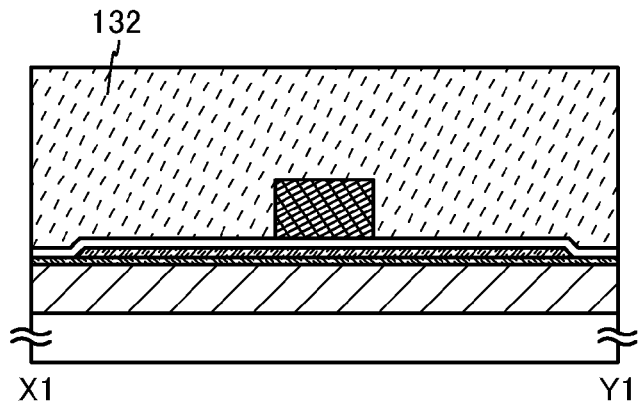

Then, a resist mask 132 is formed over the gate insulating film 110 and the gate electrode 112 (see FIG. 2D).

Next, the resist mask 132 is selectively subjected to light exposure and development through a photolithography step to form a resist mask 132a. After that, with the use of the gate electrode 112 and the resist mask 132a as masks, a dopant 142 is introduced into the first oxide semiconductor film 106 and the second oxide semiconductor film 108. The introduction of the dopant 142 makes the first oxide semiconductor film 106 have the high-resistance regions 106a and the pair of low-resistance regions 106b which are adjacent to a region overlapping with the gate electrode 112. The introduction of the dopant 142 also makes the second oxide semiconductor film 108 have the channel region 108a and the pair of low-resistance regions 108b which are adjacent to a region overlapping with the gate electrode 112 (see FIG. 3A).

The dopant 142 is an impurity that changes the conductivity of the first oxide semiconductor film 106 and the second oxide semiconductor film 108. One or more selected from the following can be used as the dopant 142: Group 15 elements (typical examples thereof are nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn).

Alternatively, the dopant 142 can be introduced into the first oxide semiconductor film 106 and the second oxide semiconductor film 108 through another film (e.g., the gate insulating film 110) by an implantation method. As the method for introducing the dopant 142, an ion implantation method, an ion doping method, a plasma immersion ion implantation method, or the like can be used. In that case, it is preferable to use a single ion of the dopant 142, or a fluoride ion or chloride ion thereof The introduction of the dopant 142 may be controlled by setting as appropriate the implantation conditions such as the acceleration voltage and the dosage, or the thickness of the film through which the dopant passes. In this embodiment, phosphorus is used as the dopant 142, whose ion is implanted by an ion implantation method. Note that the dosage of the dopant 142 may be greater than or equal to $1 \times 10^{13}$ ions/cm$^2$ and less than or equal to $5 \times 10^{16}$ ions/cm$^2$.

The concentration of the dopant 142 in the low-resistance regions 108b is preferably higher than or equal to $5 \times 10^{18}$/cm$^3$ and lower than or equal to $1 \times 10^{22}$/cm$^3$.

The dopant 142 may be introduced with the substrate 102 heated.

The introduction of the dopant 142 into the first oxide semiconductor film 106 and the second oxide semiconductor film 108 may be performed plural times, and the number of kinds of dopant may be plural.

Further, heat treatment may be performed after the introduction of the dopant 142. The heat treatment is preferably performed at a temperature higher than or equal to 300° C. and lower than or equal to 700° C. (more preferably higher than or equal to 300° C. and lower than or equal to 450° C.) for one hour in an oxygen atmosphere. The heat treatment may be performed in a nitrogen atmosphere, reduced pressure, or the air (ultra-dry air).

In the case where the second oxide semiconductor film 108 is a crystalline oxide semiconductor film or a CAAC-OS film, part of the second oxide semiconductor film 108 becomes amorphous owing to the introduction of the dopant 142 in some cases. In this case, the crystallinity of the second oxide semiconductor film 108 can be recovered by performing heat treatment thereon after the introduction of the dopant 142.

Figure 3A:
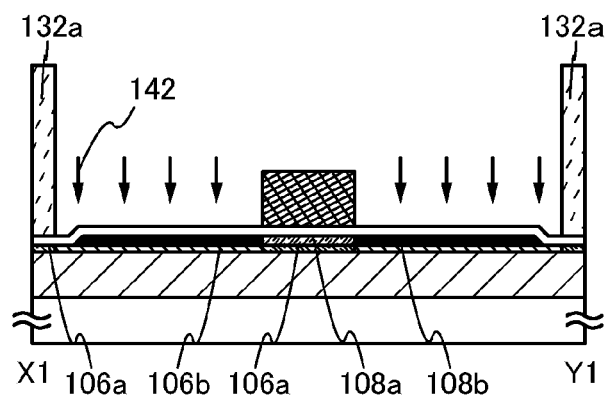
FIGS. 3A to 3D are cross-sectional views illustrating an example of a manufacturing process of a semiconductor device.
Figure 3B:
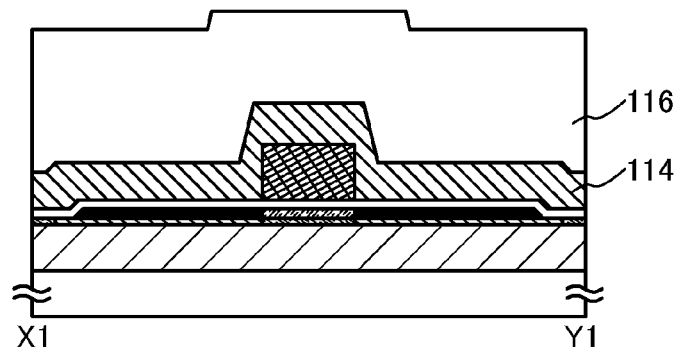

Next, the resist mask 132a is removed and the protective insulating film 114 and the interlayer insulating film 116 are formed over the gate insulating film 110 and the gate electrode 112 (see FIG. 3B).

Figure 3C:
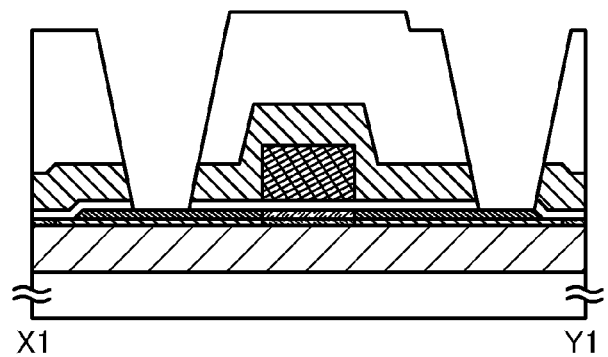

Then, through a photolithography step, a resist mask is formed over the interlayer insulating film 116, and then the gate insulating film 110, the protective insulating film 114, and the interlayer insulating film 116 are selectively etched, so that openings reaching the second oxide semiconductor film 108 (more specifically, the low-resistance regions 108b formed in the second oxide semiconductor film 108) are formed, and then the resist mask is removed (see FIG. 3C).

Figure 3D:
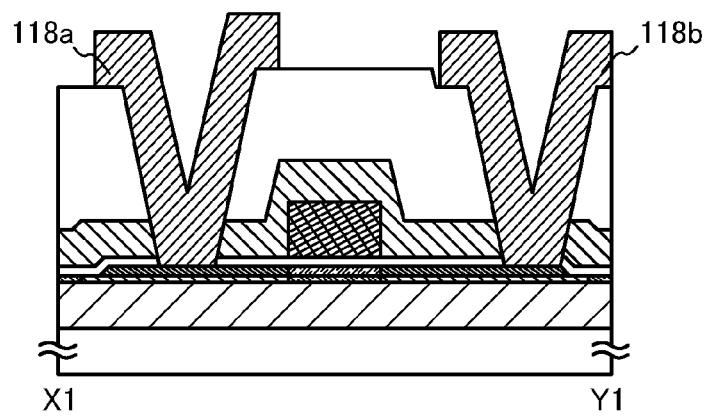

Then, a conductive film is deposited in the openings, followed by a photolithography step through which a resist mask is formed over the conductive film and etching is selectively performed to form the source electrode 118a and the drain electrode 118b (see FIG. 3D).

Note that in this embodiment, as illustrated in FIG. 3D, in a cross section taken along the channel length direction, the distance between the gate electrode 112 and the opening where the source electrode 118a is formed and the distance between the gate electrode 112 and the opening where the drain electrode 118b is formed are different. Such a structure enables suppression of off-state current.

Through the above manufacturing steps, the semiconductor device illustrated in FIGS. 1A to 1C can be manufactured.

As described in this embodiment, a technical idea of the present invention is as follows. By forming the first oxide semiconductor film over the oxide film and the second oxide semiconductor film to be stacked over the first oxide semiconductor film, at least during the deposition of the second oxide semiconductor film, oxygen release from the oxide film can be suppressed. Further, since the first oxide semiconductor film serves as a base film for the second oxide semiconductor film, the second oxide semiconductor film can have higher crystallinity. The high crystallinity of the second oxide semiconductor film can suppress the generation of oxygen deficiency in the second oxide semiconductor film, and a transistor with stable electrical characteristics can be provided.

The methods and structures described in this embodiment can be combined as appropriate with any of the methods and structures described in the other embodiments.

(Embodiment 2)

In this embodiment, a modification example of the semiconductor device in Embodiment 1 and a method for manufacturing a semiconductor device, which is different from that in Embodiment 1, will be described with reference to FIGS. 4A to 4C, FIGS. 5A to 5D, and FIGS. 6A to 6C. Note that portions similar to those in FIGS. 1A to 1C, FIGS. 2A to 2D, and FIGS. 3A to 3D are denoted by the same reference numerals, and description thereof is omitted. In addition, detailed description of the same portions is not repeated, either.

[Structural Example 2 of Semiconductor Device]

Figure 4A:
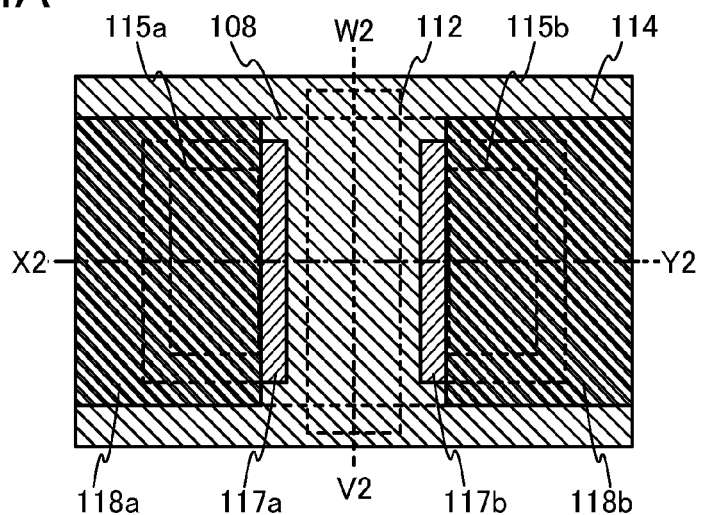
FIG. 4A is a plan view illustrating one embodiment of a semiconductor device and FIGS. 4B and 4C are cross-sectional views thereof.
Figure 4B:
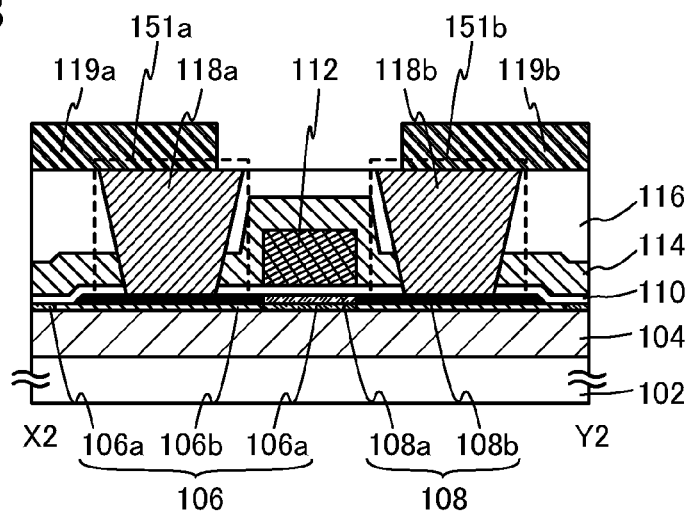
Figure 4C:
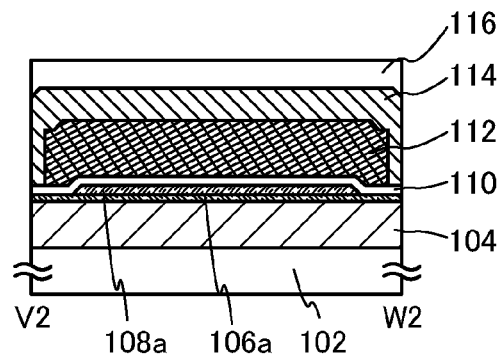

A plan view and cross-sectional views of a top-gate transistor as an example of the semiconductor device are illustrated in FIGS. 4A to 4C. FIG. 4A is the plan view, FIG. 4B corresponds to a cross-sectional view taken along line X2-Y2 in FIG. 4A, and FIG. 4C corresponds to a cross-sectional view taken along line V2-W2 in FIG. 4A. Note that in FIG. 4A, some components of the semiconductor device (e.g., a gate insulating film 110) are omitted for simplicity.

The semiconductor device illustrated in FIGS. 4A to 4C include an oxide film 104; a first oxide semiconductor film 106 formed over the oxide film 104; a second oxide semiconductor film 108 formed over the first oxide semiconductor film 106; the gate insulating film 110 formed over the second oxide semiconductor film 108; and a gate electrode 112 which is in contact with the gate insulating film 110 and formed in a region overlapping with the second oxide semiconductor film 108.

The first oxide semiconductor film 106 and the second oxide semiconductor film 108 are each formed using an oxide film containing at least indium, gallium, and zinc, and the content percentage of gallium in the first oxide semiconductor film 106 is higher than in the second oxide semiconductor film 108.

Further, in the first oxide semiconductor film 106, the content percentage of gallium is higher than or equal to that of indium. Furthermore, in the second oxide semiconductor film 108, the content percentage of indium is higher than that of gallium. The high content percentage of indium in the second oxide semiconductor film 108 can lead to higher crystallinity of the second oxide semiconductor film 108.

The first oxide semiconductor film 106 and the second oxide semiconductor film 108 are stacked and have different compositions as described above. Further, the first oxide semiconductor film 106 can suppress oxygen release from the oxide film 104 at the time of the formation of the second oxide semiconductor film 108.

Further, the second oxide semiconductor film 108 is formed over the first oxide semiconductor film 106 which is formed using the same kinds of materials as the second oxide semiconductor film 108. Accordingly, the second oxide semiconductor film 108 can have a crystal portion that grows from the interface with the first oxide semiconductor film 106.

That is, the first oxide semiconductor film 106 suppresses oxygen release from the oxide film 104 at least at the time of the deposition of the second oxide semiconductor film 108, and also serves as a base film for the second oxide semiconductor film 108, resulting in higher crystallinity of the second oxide semiconductor film 108. After the second oxide semiconductor film 108 is formed, oxygen is released from the oxide film 104 by heat treatment or the like, and then the oxygen can pass through the first oxide semiconductor film 106 to be supplied to the second oxide semiconductor film 108.

A structure in which the first oxide semiconductor film 106 and the second oxide semiconductor film 108 are thus stacked has an excellent effect of suppressing the generation of oxygen deficiency in the second oxide semiconductor film 108 and of facilitating the crystallinity of the second oxide semiconductor film 108.

Note that in the first oxide semiconductor film 106, high-resistance regions 106a are formed in a region overlapping with the gate electrode 112 and regions outside the second oxide semiconductor film 108, and a pair of low-resistance regions 106b is formed adjacent to the region overlapping with the gate electrode 112. Further, in the second oxide semiconductor film 108, a channel region 108a is formed in a region overlapping with the gate electrode 112, and a pair of low-resistance regions 108b is formed adjacent to the region overlapping with the gate electrode 112.

The high-resistance region 106a formed outside the second oxide semiconductor film 108 serves as a separation layer between transistors. This is to prevent electrical connection between adjacent transistors, for example, which would occur in the case where the high-resistance region 106a is not provided outside the second oxide semiconductor film 108.

The semiconductor device may also include a protective insulating film 114 formed over the gate electrode 112; an interlayer insulating film 116 formed over the protective insulating film 114; a source electrode 118a and a drain electrode 118b which are embedded in a first opening 151a and a second opening 151b, respectively, formed in the gate insulating film 110, the protective insulating film 114, and the interlayer insulating film 116, and are electrically connected to the second oxide semiconductor film 108; and a wiring 119a and a wiring 119b which are electrically connected to the source electrode 118a and the drain electrode 118b, respectively. Note that since the source electrode 118a and the drain electrode 118b are in contact with the pair of low-resistance regions 108b formed in the second oxide semiconductor film 108, the contact resistance can be low.

A structure of the semiconductor device in this embodiment differs from that of the semiconductor device in Embodiment 1 in that the source electrode 118a is embedded in the first opening 151a formed in the gate insulating film 110, the protective insulating film 114, and the interlayer insulating film 116; the drain electrode 118b is embedded in the second opening 151b formed in the gate insulating film 110, the protective insulating film 114, and the interlayer insulating film 116; and the wiring 119a and the wiring 119b are formed, which are electrically connected to the source electrode 118a and the drain electrode 118b, respectively.

The openings (the first opening 151a and the second opening 151b) of the semiconductor device in this embodiment, in which the source electrode 118a and the drain electrode 118b are embedded, are formed through two steps described later in [Method 2 for Manufacturing the Semiconductor Device]. Further, the source electrode 118a and the drain electrode 118b are formed by division of a conductive film 118 by CMP treatment. Thus, it is unnecessary to employ a photolithography step to form the source electrode 118a and the drain electrode 118b, and accordingly, the source electrode 118a and the drain electrode 118b can be formed without any concerns about the accuracy of a light-exposure machine and misalignment of a photomask(s). Thus, the semiconductor device in this embodiment has a structure suitable for miniaturization. Further, with such a structure, the distance between the gate electrode 112 and a source side contact region or a drain side contact region can be reduced to, for example, 0.05 μm to 0.1 μm. Accordingly, the resistance between the source and the drain can be reduced, resulting in more excellent electrical characteristics of the semiconductor device (e.g., higher on-state current characteristics of a transistor).

Note that each component that can be used for the semiconductor device in this embodiment can be similar to that in Embodiment 1; therefore, detailed description thereof is omitted and components that are not employed in Embodiment 1 will be described below.

[Detailed Description of Wirings]

As each of the wiring 119a and the wiring 119b, for example, a metal film containing an element selected from aluminum, chromium, copper, tantalum, titanium, molybdenum, or tungsten, or a metal nitride film containing any of the above elements as its component (e.g., a titanium nitride film, a molybdenum nitride film, or a tungsten nitride film) can be used. Alternatively, each of the wiring 119a and the wiring 119b may have a structure in which a film of a high-melting-point metal such as titanium, molybdenum, or tungsten, or a nitride film of any of these metals (e.g., a titanium nitride film, a molybdenum nitride film, or a tungsten nitride film) is stacked on either or both of the bottom surface and the top surface of a metal film of aluminum, copper, or the like. Further, a conductive film used for the wiring 119a and the wiring 119b may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, abbreviated to ITO), or indium zinc oxide ($In_2O_3$—ZnO) can be used. The conductive film used for the wiring 119a and the wiring 119b can be formed with a single-layer structure or a stacked structure using any of the above materials. There is no particular limitation on the method for forming the conductive film, and a variety of deposition methods such as an evaporation method, a PE-CVD method, a sputtering method, or a spin coating method can be employed.

Note that details of the other components will be described in [Method 2 for Manufacturing Semiconductor Device] below, with reference to FIGS. 5A to 5D and FIGS. 6A to 6C.

[Method 2 for Manufacturing Semiconductor Device]

An example of a method for manufacturing the semiconductor device illustrated in FIGS. 4A to 4C of this embodiment will be described below with reference to FIGS. 5A to 5D and FIGS. 6A to 6C.

Figure 5A:
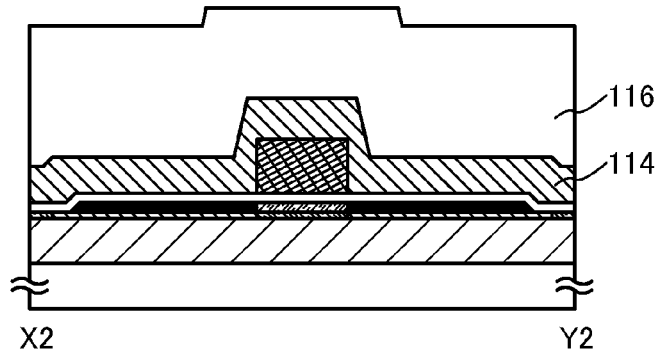
FIGS. 5A to 5D are cross-sectional views illustrating an example of a manufacturing process of a semiconductor device.

First, referring to the manufacturing method in Embodiment 1, a semiconductor device in a state illustrated in FIG. 5A can be manufactured. Note that a cross-sectional view illustrated in FIG. 5A is the same as the cross-sectional view illustrated in FIG. 3B.

Figure 5B:
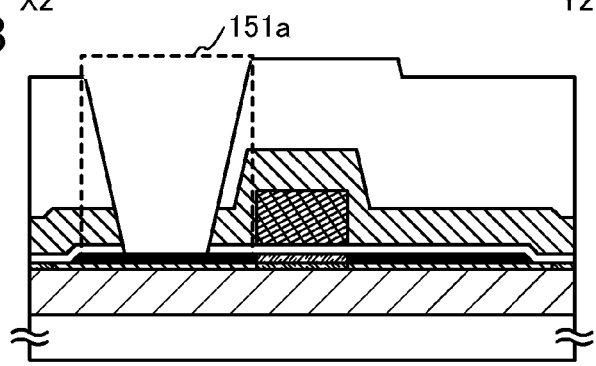

Then, through a photolithography step, a resist mask is formed over the interlayer insulating film 116, and then the gate insulating film 110, the protective insulating film 114, and the interlayer insulating film 116 are selectively etched, so that a first opening 151a reaching the second oxide semiconductor film 108 (more specifically, the low-resistance region 108b) is formed, and then the resist mask is removed (see FIG. 5B).

For light exposure at the above photolithography step, extreme ultraviolet light having a wavelength as short as several nanometers to several tens of nanometers is preferably used. In the light exposure with extreme ultraviolet light, the resolution is high and the focus depth is large. Thus, a fine pattern can be formed. As long as it is possible to form a resist mask having a sufficiently fine pattern, a different method such as an inkjet method may be used to form the resist mask. In this case, it is unnecessary to use a material having a photosensitivity, as a material of the resist mask.

Figure 5C:
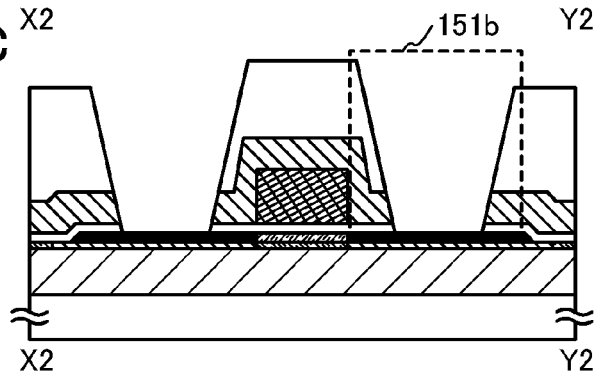

Then, a resist mask is formed over the first opening 151a and the interlayer insulating film 116, and then the gate insulating film 110, the protective insulating film 114, and the interlayer insulating film 116 are selectively etched, so that a second opening 151b reaching the second oxide semiconductor film 108 (more specifically, the low-resistance region 108b) is formed, and then the resist mask is removed (see FIG. 5C). Thus, a pair of openings with the gate electrode 112 interposed therebetween is formed in the gate insulating film 110, the protective insulating film 114, and the interlayer insulating film 116.

Figure 5D:
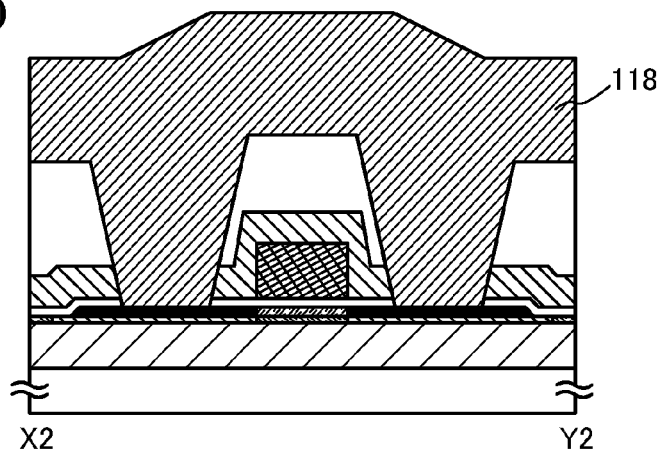

Next, the conductive film 118 is formed over the interlayer insulating film 116 to be embedded in the first opening 151a and the second opening 151b (see FIG. 5D).

Figure 6A:
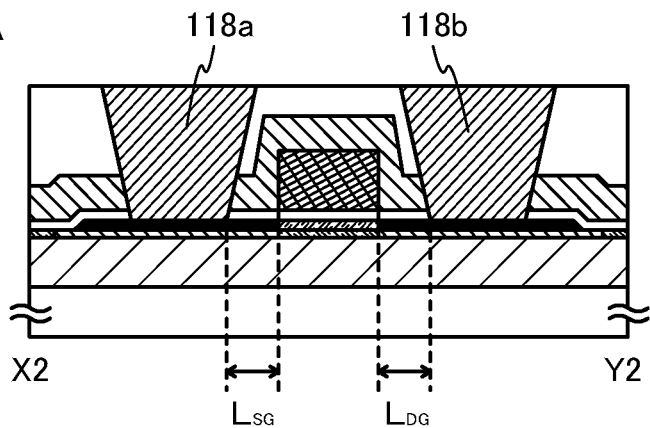
FIGS. 6A to 6C are cross-sectional views illustrating an example of a manufacturing process of a semiconductor device.

Next, CMP (chemical mechanical polishing) treatment is performed on the conductive film 118 in order to remove the conductive film 118 provided over the interlayer insulating film 116 (at least a region overlapping with the gate electrode 112); thus, the source electrode 118a and the drain electrode 118b embedded in the first opening 151a and the second opening 151b, respectively, are formed (see FIG. 6A).

In this embodiment, through the CMP treatment performed on the conductive film 118 under such conditions that a surface of the interlayer insulating film 116 can be exposed, the source electrode 118a and the drain electrode 118b are formed. Note that the surface of the protective insulating film 114 may also be polished depending on conditions of the CMP treatment.

The CMP treatment is a method for planarizing a surface of an object to be processed by a combination of chemical and mechanical actions. More specifically, the CMP treatment is a method in which a polishing cloth is attached to a polishing stage, the polishing stage and an object to be processed are each rotated or swung while slurry (abrasive) is supplied between the object to be processed and the polishing cloth, and the surface of the object to be processed is polished by a chemical reaction between the slurry and the surface of the object to be processed and by a mechanical polishing action of the polishing cloth on the object to be processed.

Note that the CMP treatment may be performed only once or plural times. When the CMP treatment is performed plural times, first polishing is preferably performed with a high polishing rate followed by final polishing with a low polishing rate. By performing polishing at different polishing rates, the planarity of the surfaces of the source electrode 118a, the drain electrode 118b, and the interlayer insulating film 116 can be further improved.

Note that in this embodiment, the CMP treatment is employed to remove the conductive film 118; however, another polishing (grinding or cutting) treatment may be employed. Alternatively, the polishing treatment such as the CMP treatment may be combined with etching (dry etching or wet etching) treatment or plasma treatment. For example, after the CMP treatment, dry etching treatment or plasma treatment (e.g., reverse sputtering) may be performed in order to improve the planarity of a surface to be processed. In the case where the polishing treatment is combined with etching treatment, plasma treatment, or the like, the order of the steps may be set as appropriate, without particular limitation, depending on the material, thickness, and roughness of the surface of the conductive film 118.

As described above, the source electrode 118a and the drain electrode 118b are formed to be embedded in the openings (the first opening 151a and the second opening 151b) provided in the interlayer insulating film 116, the protective insulating film 114, and the gate insulating film 110. Therefore, the distance ($L_{SG}$ in FIG. 6A) between the gate electrode 112 and a region (a source side contact region) where the source electrode 118a is in contact with the second oxide semiconductor film 108 is determined by the width from the gate electrode 112 to an edge of the first opening 151a. In a similar manner, the distance ($L_{DG}$ in FIG. 6A) between the gate electrode 112 and a region (a drain side contact region) where the drain electrode 118b is in contact with the second oxide semiconductor film 108 is determined by the width from the gate electrode 112 to an edge of the second opening 151b.

In the case of forming the first opening 151a for providing the source electrode 118a and the second opening 151b for providing the drain electrode 118b by one-time treatment, the minimum feature size of the width between the first opening 151a and the second opening 151b in the channel length direction is restricted by the resolution limit of a light-exposure machine used for forming a mask. Therefore, it is difficult to scale down the distance between the first opening 151a and the second opening 151b sufficiently, so that it is also difficult to scale down the distance ($L_{SG}$) between the gate electrode 112 and the source side contact region, and the distance ($L_{DG}$) between the gate electrode 112 and the drain side contact region.

However, according to the manufacturing method in this embodiment, the first opening 151a and the second opening 151b are formed with the use of two masks; therefore, the positions of the openings can be set freely without depending on the resolution limit of the light-exposure machine. Thus, the distance ($L_{SG}$ or $L_{DG}$) between the gate electrode 112 and the source side contact region or the drain side contact region can be reduced to 0.05 μm to 0.1 μm, for example. By reducing $L_{SG}$ and $L_{DG}$, the resistance between the source and the drain can be reduced, so that the electrical characteristics of the semiconductor device (e.g., on-state current characteristics of the transistor) can be improved.

Further, since etching treatment using a resist mask is not performed in a step for removing the conductive film 118 over the interlayer insulating film 116 in order to form the source electrode 118a and the drain electrode 118b, fine processing can be performed accurately even in the case where the width between the source electrode 118a and the drain electrode 118b in the channel length direction is scaled-down. Thus, in a process for manufacturing the semiconductor device, a miniaturized structure having little variation in shapes and characteristics can be manufactured with a high yield.

Figure 6B:
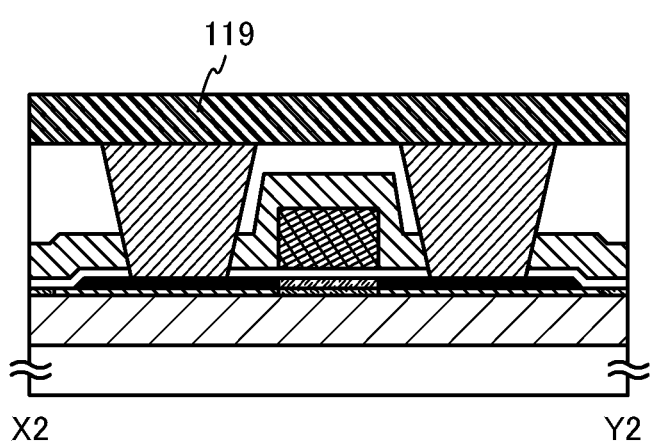

Next, a conductive film 119 is deposited over the interlayer insulating film 116, the source electrode 118a, and the drain electrode 118b (see FIG. 6B).

Figure 6C:
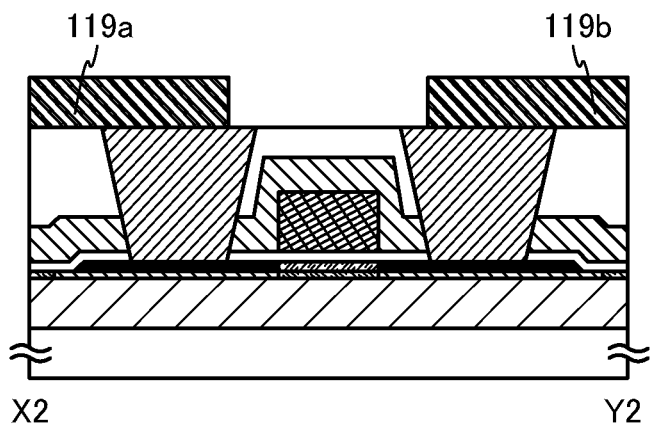

After that, through a photolithography step, a resist mask is formed over the conductive film 119, and a wiring 119a which is electrically connected to the source electrode 118a and a wiring 119b which is electrically connected the drain electrode 118b are formed (see FIG. 6C).

Through the above manufacturing steps, the semiconductor device illustrated in FIGS. 4A to 4C can be manufactured.

As described in this embodiment, a technical idea of the present invention is as follows. By forming the first oxide semiconductor film over the oxide film and the second oxide semiconductor film to be stacked over the first oxide semiconductor film, at least during the deposition of the second oxide semiconductor film, oxygen release from the oxide film can be suppressed. Further, since the first oxide semiconductor film serves as a base film for the second oxide semiconductor film, the second oxide semiconductor film can have higher crystallinity. The high crystallinity of the second oxide semiconductor film can suppress the generation of oxygen deficiency in the second oxide semiconductor film, and a transistor with stable electrical characteristics can be provided.

The methods and structures described in this embodiment can be combined as appropriate with any of the methods and structures described in the other embodiments.

(Embodiment 3)

In this embodiment, a modification example of the semiconductor device in Embodiment 1 or Embodiment 2 and a method for manufacturing a semiconductor device, which is different from that in Embodiment 1 or Embodiment 2, will be described with reference to FIGS. 7A to 7C, FIGS. 8A to 8D, FIGS. 9A to 9C, FIGS. 10A to 10C, FIGS. 11A to 11D, and FIGS. 12A to 12C. Note that portions similar to those in FIGS. 1A to 1C, FIGS. 2A to 2D, FIGS. 3A to 3D, FIGS. 4A to 4C, FIGS. 5A to 5D, and FIGS. 6A to 6C are denoted by the same reference numerals, and description thereof is omitted. In addition, detailed description of the same portions is not repeated, either.

[Structural Example 3 of Semiconductor Device]

Figure 7A:
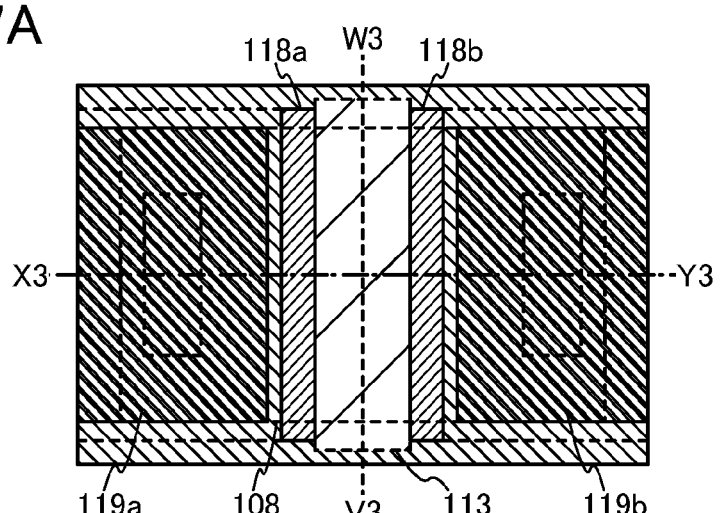
FIG. 7A is a plan view illustrating one embodiment of a semiconductor device and FIGS. 7B and 7C are cross-sectional views thereof.
Figure 7B:
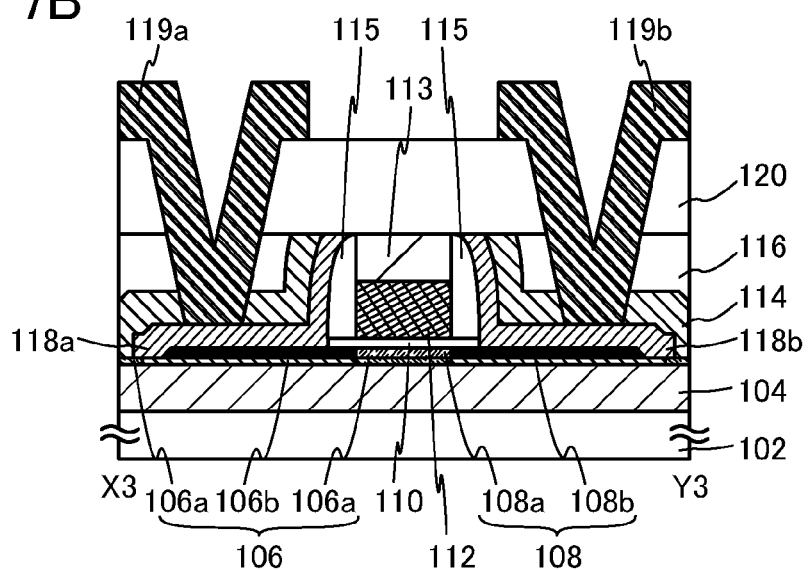
Figure 7C:
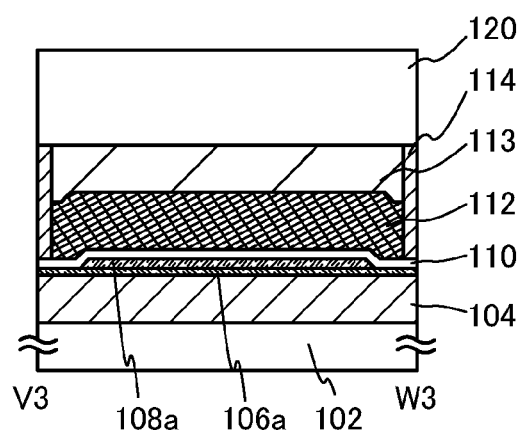

A plan view and cross-sectional views of a top-gate transistor as an example of the semiconductor device are illustrated in FIGS. 7A to 7C. FIG. 7A is the plan view, FIG. 7B corresponds to a cross-sectional view taken along line X3-Y3 in FIG. 7A, and FIG. 7C corresponds to a cross-sectional view taken along line V3-W3 in FIG. 7A. Note that in FIG. 7A, some components of the semiconductor device (e.g., a gate insulating film 110) are omitted for simplicity.

The semiconductor device illustrated in FIGS. 7A to 7C include an oxide film 104; a first oxide semiconductor film 106 formed over the oxide film 104; a second oxide semiconductor film 108 formed over the first oxide semiconductor film 106; the gate insulating film 110 formed over the second oxide semiconductor film 108; and a gate electrode 112 which is in contact with the gate insulating film 110 and formed in a region overlapping with the second oxide semiconductor film 108.

The first oxide semiconductor film 106 and the second oxide semiconductor film 108 are each formed using an oxide film containing at least indium, gallium, and zinc, and the content percentage of gallium in the first oxide semiconductor film 106 is higher than in the second oxide semiconductor film 108.

Further, in the first oxide semiconductor film 106, the content percentage of gallium is higher than or equal to that of indium. Furthermore, in the second oxide semiconductor film 108, the content percentage of indium is higher than that of gallium. The high content percentage of indium in the second oxide semiconductor film 108 can lead to higher crystallinity of the second oxide semiconductor film 108.

The first oxide semiconductor film 106 and the second oxide semiconductor film 108 are stacked and have different compositions as described above. Further, the first oxide semiconductor film 106 can suppress oxygen release from the oxide film 104 at the time of the formation of the second oxide semiconductor film 108.

Further, the second oxide semiconductor film 108 is formed over the first oxide semiconductor film 106 which is formed using the same kinds of materials as the second oxide semiconductor film 108. Accordingly, the second oxide semiconductor film 108 can have a crystal portion that grows from the interface with the first oxide semiconductor film 106.

That is, the first oxide semiconductor film 106 suppresses oxygen release from the oxide film 104 at least at the time of the deposition of the second oxide semiconductor film 108, and also serves as a base film for the second oxide semiconductor film 108, resulting in higher crystallinity of the second oxide semiconductor film 108. After the second oxide semiconductor film 108 is formed, oxygen is released from the oxide film 104 by heat treatment or the like, and then the oxygen can pass through the first oxide semiconductor film 106 to be supplied to the second oxide semiconductor film 108.

A structure in which the first oxide semiconductor film 106 and the second oxide semiconductor film 108 are thus stacked has an excellent effect of suppressing the generation of oxygen deficiency in the second oxide semiconductor film 108 and of facilitating the crystallinity of the second oxide semiconductor film 108.

Note that in the first oxide semiconductor film 106, high-resistance regions 106a are formed in a region overlapping with the gate electrode 112 and regions outside the second oxide semiconductor film 108, and a pair of low-resistance regions 106b is formed adjacent to the region overlapping with the gate electrode 112. Further, in the second oxide semiconductor film 108, a channel region 108a is formed in a region overlapping with the gate electrode 112, and a pair of low-resistance regions 108b is formed adjacent to the region overlapping with the gate electrode 112.

The high-resistance region 106a formed outside the second oxide semiconductor film 108 serves as a separation layer between transistors. This is to prevent electrical connection between adjacent transistors, for example, which would occur in the case where the high-resistance region 106a is not provided outside the second oxide semiconductor film 108.

The semiconductor device may also include an insulating film 113 formed in a region overlapping with the gate electrode 112; sidewall insulating films 115 which are formed along side surfaces of the gate electrode 112 and the insulating film 113; a source electrode 118a and a drain electrode 118b which are formed in contact with the sidewall insulating films 115 and electrically connected to the second oxide semiconductor film 108; a protective insulating film 114 and an interlayer insulating film 116 which are formed at least over the source electrode 118a and the drain electrode 118b; an insulating film 120 formed over the interlayer insulating film 116; and a wiring 119a and a wiring 119b which are electrically connected to the source electrode 118a and the drain electrode 118b, respectively, through openings formed in the insulating film 120, the interlayer insulating film 116, and the protective insulating film 114. Note that since the source electrode 118a and the drain electrode 118b are in contact with the pair of low-resistance regions 108b formed in the second oxide semiconductor film 108, the contact resistance can be low.

The structure of the semiconductor device in this embodiment differs from that of the semiconductor device in Embodiment 1 in that the insulating film 113 over the gate electrode 112 is formed, the sidewall insulating films 115 along the side surfaces of the gate electrode 112 are formed, the source electrode 118a and the drain electrode 118b are formed in contact with the sidewall insulating films 115, and the insulating film 120 is formed.

Further, in the semiconductor device in this embodiment, a conductive film to be used for the source electrode 118a and the drain electrode 118b is formed over the insulating film 113 and the sidewall insulating films 115, and then is subjected to planarization treatment (also referred to as polishing treatment) so as to be partly removed, whereby the source electrode 118a and the drain electrode 118b are formed. Thus, it is unnecessary to employ a photolithography step to form the source electrode 118a and the drain electrode 118b, and accordingly, the source electrode 118a and the drain electrode 118b can be formed without any concerns about the accuracy of a light-exposure machine and misalignment of a photomask(s). Thus, the semiconductor device in this embodiment has a structure suitable for miniaturization.

Note that each component that can be used for the semiconductor device in this embodiment can be similar to that in Embodiment 1 or Embodiment 2; therefore, detailed description thereof is omitted and components that are not employed in Embodiment 1 or Embodiment 2 will be described below.

[Detailed Description of Insulating Film and Sidewall Insulating Films]

The insulating film 113, the sidewall insulating films 115, and the insulating film 120 are each preferably formed using an inorganic insulating film and may be formed as a single layer or a stacked layer using any of a silicon oxide film, a silicon oxynitride film, a silicon nitride film, and a silicon nitride oxide film. There is no particular limitation on a method for forming the insulating film 113, the sidewall insulating films 115, and the insulating film 120; for example, a sputtering method, an MBE method, a PE-CVD method, a pulse laser deposition method, an ALD method, or the like can be employed as appropriate.

Note that details of the other components will be described in [Method 3 for Manufacturing Semiconductor Device] below, with reference to FIGS. 8A to 8D, FIGS. 9A to 9C, FIGS. 10A to 10C, FIGS. 11A to 11D, and FIGS. 12A to 12C.

[Method 3 for Manufacturing Semiconductor Device]

An example of a method for manufacturing the semiconductor device illustrated in FIGS. 7A to 7C of this embodiment will be described below with reference to FIGS. 8A to 8D, FIGS. 9A to 9C, FIGS. 10A to 10C, FIGS. 11A to 11D, and FIGS. 12A to 12C.

Figure 8A:
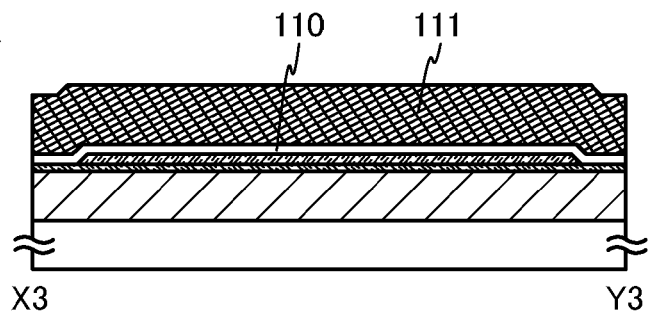
FIGS. 8A to 8D are cross-sectional views illustrating an example of a manufacturing process of a semiconductor device.

First, referring to the manufacturing method in Embodiment 1, a semiconductor device in a state illustrated in FIG. 8A can be manufactured. Note that a cross-sectional view illustrated in FIG. 8A is the same as the cross-sectional view illustrated in FIG. 2B.

Figure 8B:
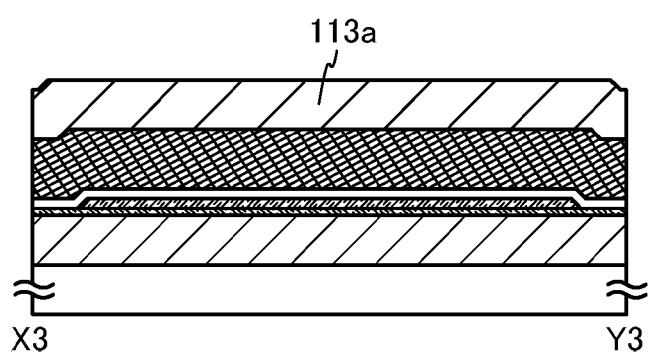

Next, an insulating film 113a is formed over a conductive film 111 (see FIG. 8B).

Figure 8C:
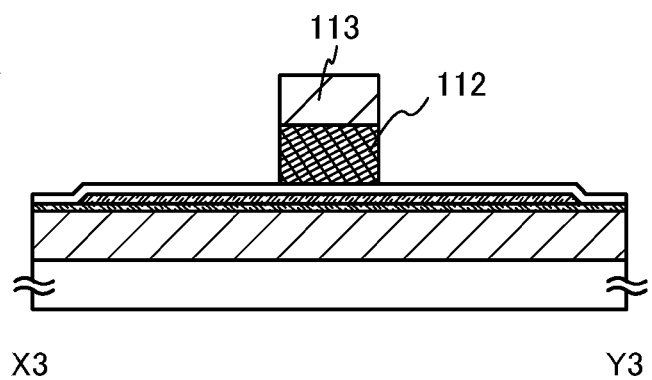

Next, through a photolithography step, a resist mask is formed over the insulating film 113a, and selective etching is performed on the insulating film 113a and the conductive film 111 to form the insulating film 113 and the gate electrode 112 (see FIG. 8C).

Figure 8D:
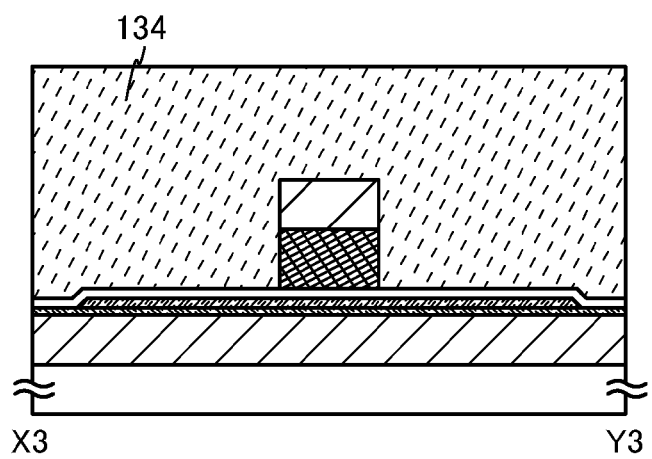

Then, a resist mask 134 is formed over the gate insulating film 110 and the insulating film 113 (see FIG. 8D).

Next, the resist mask 134 is selectively subjected to light exposure and development through a photolithography step to form a resist mask 134a or a resist mask 134b. After that, with the use of the gate electrode 112, the insulating film 113, and the resist mask (the resist mask 134a or the resist mask 134b) as masks, a dopant 142 is introduced into the first oxide semiconductor film 106 and the second oxide semiconductor film 108. The introduction of the dopant 142 makes the first oxide semiconductor film 106 have the high-resistance regions 106a and the pair of low-resistance regions 106b which are adjacent to a region overlapping with the gate electrode 112. The introduction of the dopant 142 also makes the second oxide semiconductor film 108 have the channel region 108a and the pair of low-resistance regions 108b which are adjacent to a region overlapping with the gate electrode 112 (see FIGS. 9B and 10B).

To clearly show the positions where the dopant 142 is introduced and the low-resistance regions 106b and the low-resistance regions 108b are formed, this embodiment will be described with reference to cross-sectional views and plan views in FIGS. 9A to 9C and FIGS. 10A to 10C.

Figure 9A:
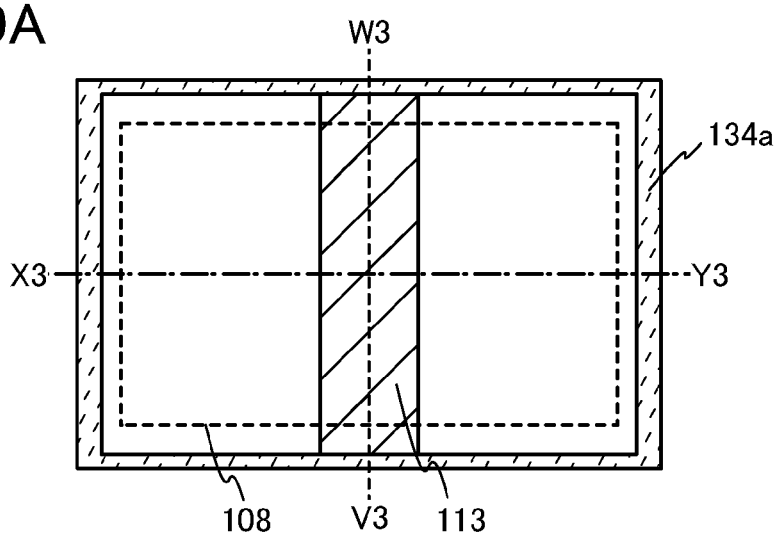
FIG. 9A is a plan view illustrating an example of a manufacturing process of a semiconductor device and FIGS. 9B and 9C are cross-sectional views thereof.
Figure 9B:
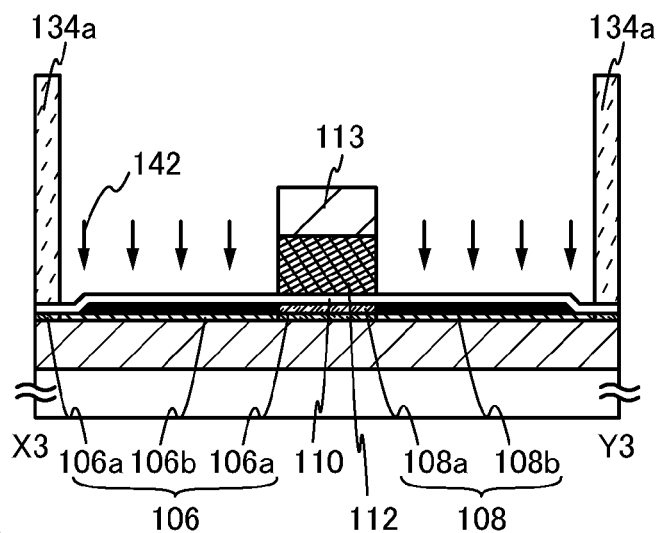
Figure 9C:
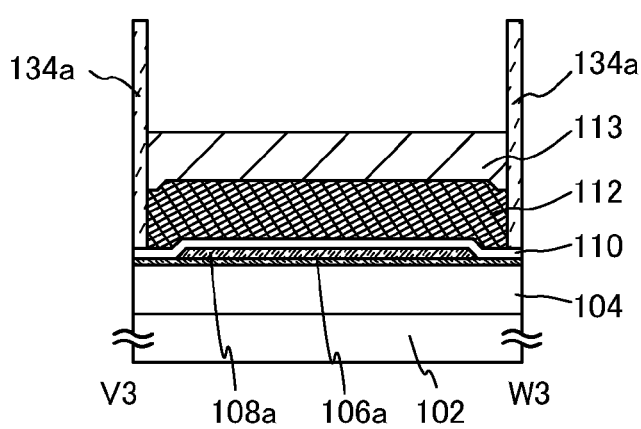
Figure 10A:
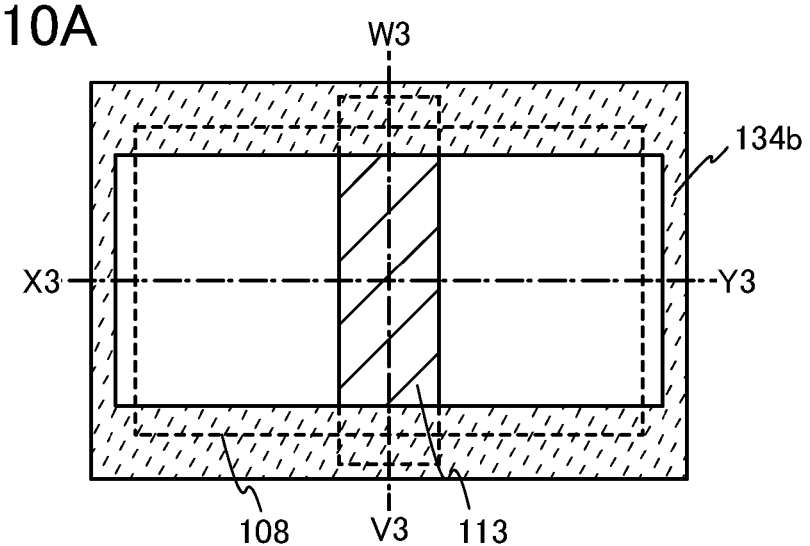
FIG. 10A is a plan view illustrating an example of a manufacturing process of a semiconductor device and FIGS. 10B and 10C are cross-sectional views thereof.

FIG. 9A is the plan view, FIG. 9B corresponds to a cross-sectional view taken along line X3-Y3 in FIG. 9A, and FIG. 9C corresponds to a cross-sectional view taken along line V3-W3 in FIG. 9A. Note that in FIG. 9A, some components of the semiconductor device (e.g., the gate insulating film 110) are omitted for simplicity. Further, FIG. 10A is the plan view, FIG. 10B corresponds to a cross-sectional view taken along line X3-Y3 in FIG. 10A, and FIG. 10C corresponds to a cross-sectional view taken along line V3-W3 in FIG. 10A. Note that in FIG. 10A, some components of the semiconductor device (e.g., the gate insulating film 110) are omitted for simplicity.

Further, two kinds of manufacturing methods about the positions where the low-resistance regions 106b and the low-resistance regions 108b are formed will be described with reference to FIGS. 9A to 9C and FIGS. 10A to 10C. Note that the method shown in FIGS. 9A to 9C and the method shown in FIGS. 10A to 10C are each one embodiment of the present invention.

The following will show a difference between the manufacturing methods shown in FIGS. 9A to 9C and FIGS. 10A to 10C.

In accordance with the manufacturing method shown in FIGS. 9A to 9C, the resist mask 134a is formed outside the second oxide semiconductor film 108 (see FIGS. 9A to 9C).

Figure 10B:
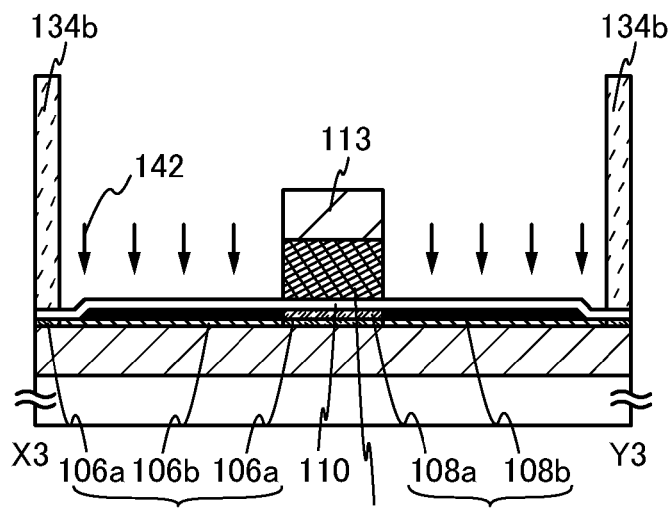
Figure 10C:
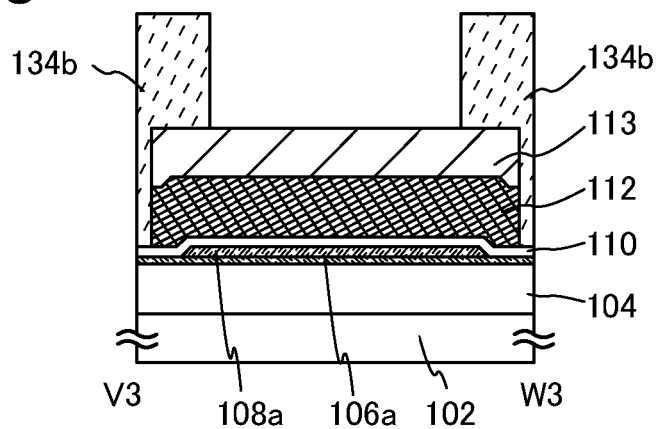

In contrast, in accordance with the manufacturing method shown in FIGS. 10A to 10C, the resist mask 134b is formed also a region between the long sides of the second oxide semiconductor film 108 (see FIGS. 10A to 10C).

In accordance with the manufacturing method shown in FIGS. 9A to 9C, the entire surface except the channel region 108a becomes the low-resistance region 108b; accordingly, contact regions with the source electrode 118a and the drain electrode 118b, which are formed later, can be large. In contrast, in accordance with the manufacturing method shown in FIGS. 10A to 10C, the region between the long sides of the second oxide semiconductor film 108 is made to have higher resistance than the low-resistance region 108b as in the channel region 108a; thus, the generation of a parasitic channel (also referred to as a parasitic transistor) that can occur in the long-side direction of the second oxide semiconductor film 108 can be suppressed.

By changing the shape of the resist mask 134a and the shape of the resist mask 134b in the above manner, semiconductor devices having different effects can be manufactured.

Figure 11A:
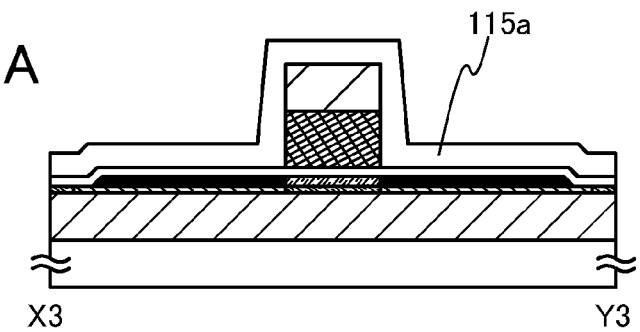
FIGS. 11A to 11D are cross-sectional views illustrating an example of a manufacturing process of a semiconductor device.
Figure 11B:
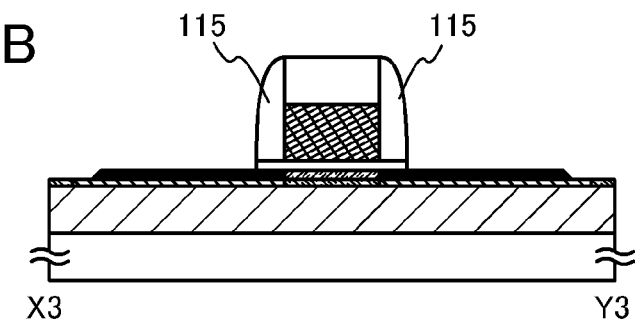
Figure 11C:
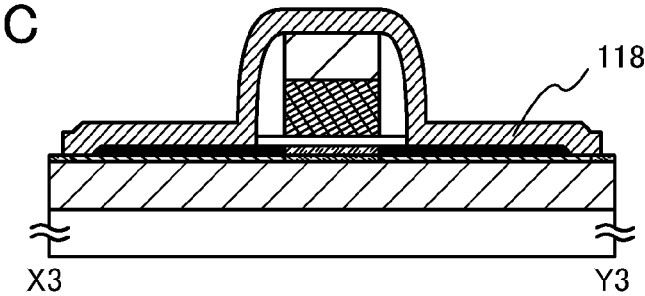

Next, the resist mask (the resist mask 134a or the resist mask 134b) is removed, and then an insulating film 115a is formed over the gate insulating film 110 and the insulating film 113 (see FIG. 11A).

Then, the sidewall insulating films 115 are formed by etching the insulating film 115a. The sidewall insulating films 115 can be formed in a self-aligned manner by performing a highly anisotropic etching step on the insulating film 115a. As an example of an etching method, a dry etching method is preferably employed. As an example of an etching gas used for the dry etching method, a gas containing fluorine such as trifluoromethane, octafluorocyclobutane, or tetrafluoromethane can be used. A rare gas or hydrogen may be added to the etching gas. As the dry etching method, a reactive ion etching (RIE) method in which high-frequency voltage is applied to a substrate is preferably employed. After the sidewall insulating films 115 are formed, the gate insulating film 110 is processed with the use of the gate electrode 112, the insulating film 113, and the sidewall insulating films 115 as masks, whereby the first oxide semiconductor film 106 and the second oxide semiconductor film 108 are exposed (see FIG. 11B). Note that the gate insulating film 110 may be processed at the time of the formation of the sidewall insulating films 115.

Note that in this embodiment, in a step shortly after the formation of the gate electrode 112 and the insulating film 113, the dopant 142 is introduced into the first oxide semiconductor film 106 and the second oxide semiconductor film 108 with the use of the gate electrode 112, the insulating film 113, and the resist mask (the resist mask 134a or the resist mask 134b) as masks. However, after the sidewall insulating films 115 are formed, the dopant 142 may be introduced into the first oxide semiconductor film 106 and the second oxide semiconductor film 108 with the use of the gate electrode 112, the insulating film 113, and the sidewall insulating films 115, and a resist mask as masks. In such a manner, regions of the first oxide semiconductor film 106 and the second oxide semiconductor film 108, which overlap with the sidewall insulating films 115, can be included in the high-resistance regions.

Next, a conductive film is formed to cover the first oxide semiconductor film 106, the second oxide semiconductor film 108, the insulating film 113, and the sidewall insulating film 115. The conductive film is subjected to a photolithography step and an etching step to form a conductive film 118 (see FIG. 11C).

Figure 11D:
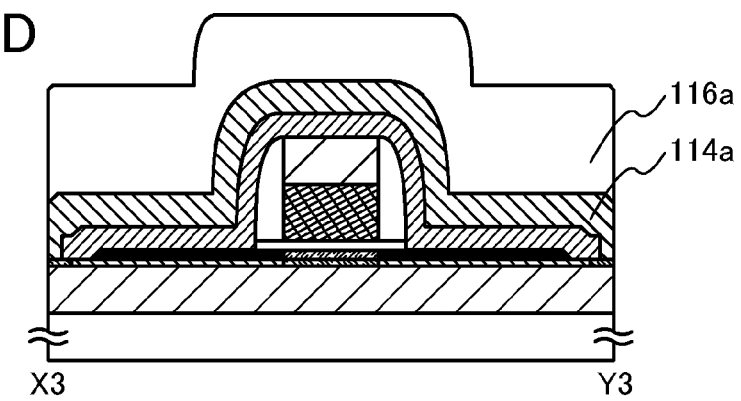

Then, an insulating film 114a and an insulating film 116a are formed over the first oxide semiconductor film 106 and the conductive film 118 (see FIG. 11D).

Next, in order to remove the conductive film 118 provided over the insulating film 113 (at least in a region overlapping with the gate electrode 112), CMP treatment is performed on the insulating film 114a, the insulating film 116a, and the conductive film 118. Thus, the insulating film 114a, the insulating film 116a, and the conductive film 118 are divided, and the protective insulating film 114, the interlayer insulating film 116, the source electrode 118a, and the drain electrode 118b are formed in the state where the gate electrode 112 is interposed between divided parts of the protective insulating film 114, divided parts of the interlayer insulating film 116, and the source electrode 118a and the drain electrode 118b (see FIG. 12A).

Figure 12A:
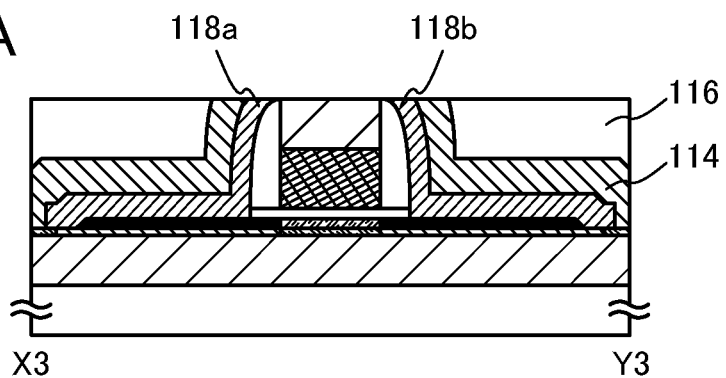
FIGS. 12A to 12C are cross-sectional views illustrating an example of a manufacturing process of a semiconductor device.

Note that surfaces of the source electrode 118a and the drain electrode 118b are flush with surfaces of the insulating film 113 and the interlayer insulating film 116 in FIG. 12A. However, in the case where the surfaces of the source electrode 118a and the drain electrode 118b, the insulating film 113, and the interlayer insulating film 116 are polished with a CMP apparatus and polishing speeds (or polishing rates) are different among the source electrode 118a, the drain electrode 118b, the insulating film 113, and the interlayer insulating film 116, the surfaces of the source electrode 118a and the drain electrode 118b might not be flush with the surfaces of the insulating film 113 or the interlayer insulating film 116, generating steps. For example, the surfaces of the source electrode 118a and the drain electrode 118b become lower than the surface of the insulating film 113 (a depression is formed) in some cases. Depending on CMP treatment conditions, the sidewall insulating films 115 might be polished too.

Note that for the CMP treatment here, the description of the CMP treatment performed on the conductive film 118 in Embodiment 2 can be referred to.

Figure 12B:
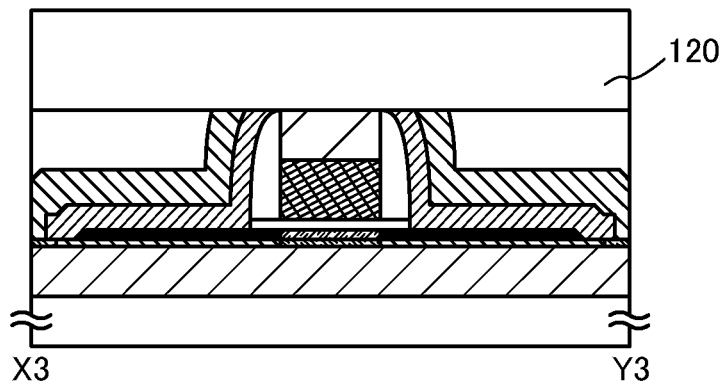
Figure 12C:
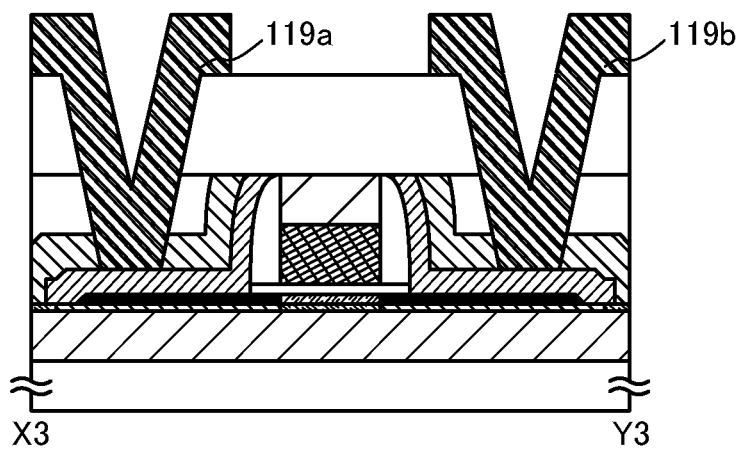

Next, the insulating film 120 is formed over the protective insulating film 114, the interlayer insulating film 116, the source electrode 118a, and the drain electrode 118b (see FIG. 12B).

Then, through a photolithography step, a resist mask is formed over the insulating film 120, and the protective insulating film 114, the interlayer insulating film 116, and the insulating film 120 are selectively etched so that openings reaching the source electrode 118a and the drain electrode 118b are formed, and then the resist mask is removed. Then, a conductive film is deposited to cover the openings, followed by a photolithography step through which a resist mask is formed over the conductive film and etching is selectively performed on the conductive film to form the wiring 119a and wiring 119b (see FIG. 12C).

Through the above manufacturing steps, the semiconductor device illustrated in FIGS. 7A to 7C can be manufactured.

As described in this embodiment, a technical idea of the present invention is as follows. By forming the first oxide semiconductor film over the oxide film and the second oxide semiconductor film to be stacked over the first oxide semiconductor film, at least during the deposition of the second oxide semiconductor film, oxygen release from the oxide film can be suppressed. Further, since the first oxide semiconductor film serves as a base film for the second oxide semiconductor film, the second oxide semiconductor film can have higher crystallinity. The high crystallinity of the second oxide semiconductor film can suppress the generation of oxygen deficiency in the second oxide semiconductor film, and a transistor with stable electrical characteristics can be provided.

The methods and structures described in this embodiment can be combined as appropriate with any of the methods and structures described in the other embodiments.

(Embodiment 4)

In this embodiment, a modification example of the semiconductor device in any of Embodiments 1 to 3 and a method for manufacturing a semiconductor device, which is different from that in any of Embodiments 1 to 3, will be described with reference to FIGS. 13A to 13C, FIGS. 14A to 14D, FIGS. 15A to 15D, FIGS. 16A to 16D, and FIGS. 17A and 17B. Note that portions similar to those in FIGS. 1A to 1C, FIGS. 2A to 2D, FIGS. 3A to 3D, FIGS. 4A to 4C, FIGS. 5A to 5D, FIGS. 6A to 6C, FIGS. 7A to 7C, FIGS. 8A to 8D, FIGS. 9A to 9C, FIGS. 10A to 10C, FIGS. 11A to 11D, and FIGS. 12A to 12C are denoted by the same reference numerals, and description thereof is omitted. In addition, detailed description of the same portions is not repeated, either.

[Structural Example 4 of Semiconductor Device]

Figure 13A:
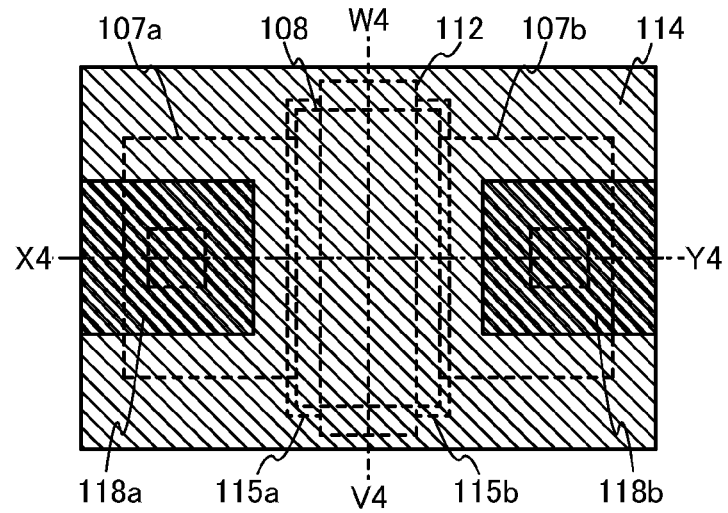
FIG. 13A is a plan view illustrating one embodiment of a semiconductor device and FIGS. 13B and 13C are cross-sectional views thereof.
Figure 13B:
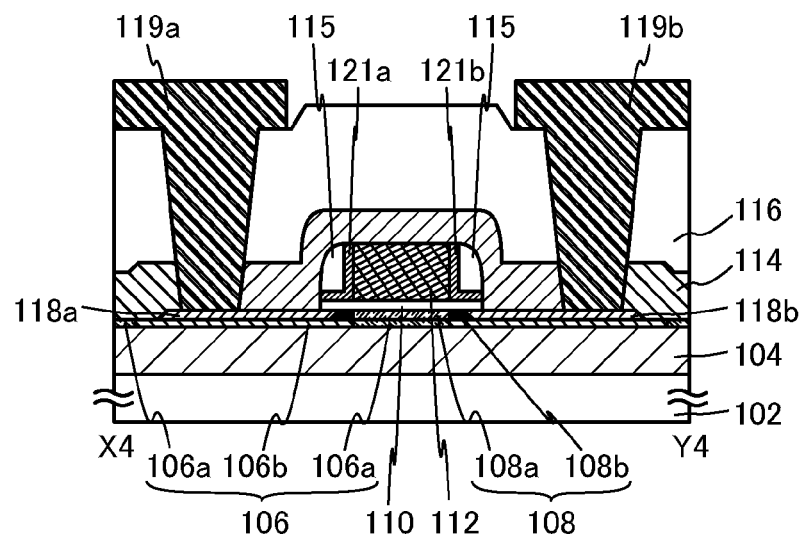
Figure 13C:
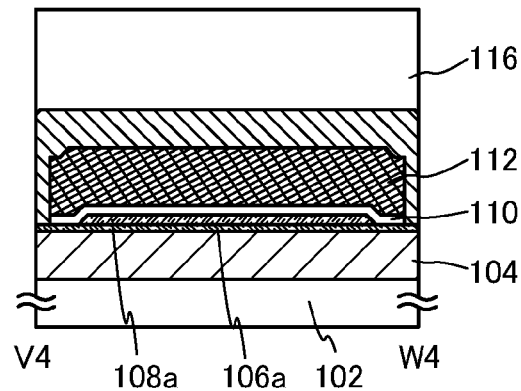

A plan view and cross-sectional views of a top-gate transistor as an example of the semiconductor device are illustrated in FIGS. 13A to 13C. FIG. 13A is the plan view, FIG. 13B corresponds to a cross-sectional view taken along line X4-Y4 in FIG. 13A, and FIG. 13C corresponds to a cross-sectional view taken along line V4-W4 in FIG. 13A. Note that in FIG. 13A, some components of the semiconductor device (e.g., a gate insulating film 110) are omitted for simplicity.

The semiconductor device illustrated in FIGS. 13 to 13C include an oxide film 104; a first oxide semiconductor film 106 formed over the oxide film 104; a second oxide semiconductor film 108 formed over the first oxide semiconductor film 106; the gate insulating film 110 formed over the second oxide semiconductor film 108; and a gate electrode 112 which is in contact with the gate insulating film 110 and formed in a region overlapping with the second oxide semiconductor film 108.

The first oxide semiconductor film 106 and the second oxide semiconductor film 108 are each formed using an oxide film containing at least indium, gallium, and zinc, and the content percentage of gallium in the first oxide semiconductor film 106 is higher than in the second oxide semiconductor film 108.

Further, in the first oxide semiconductor film 106, the content percentage of gallium is higher than or equal to that of indium. Furthermore, in the second oxide semiconductor film 108, the content percentage of indium is higher than that of gallium. The high content percentage of indium in the second oxide semiconductor film 108 can lead to higher crystallinity of the second oxide semiconductor film 108.

The first oxide semiconductor film 106 and the second oxide semiconductor film 108 are stacked and have different compositions as described above. Further, the first oxide semiconductor film 106 can suppress oxygen release from the oxide film 104 at the time of the formation of the second oxide semiconductor film 108.

Further, the second oxide semiconductor film 108 is formed over the first oxide semiconductor film 106 which is formed using the same kinds of materials as the second oxide semiconductor film 108, whereby the second oxide semiconductor film 108 can have a crystal portion that grows from the interface with the first oxide semiconductor film 106.

That is, the first oxide semiconductor film 106 suppresses oxygen release from the oxide film 104 at least at the time of the deposition of the second oxide semiconductor film 108, and also serves as a base film for the second oxide semiconductor film 108, resulting in higher crystallinity of the second oxide semiconductor film 108. After the second oxide semiconductor film 108 is formed, oxygen is released from the oxide film 104 by heat treatment or the like, and then the oxygen can pass through the first oxide semiconductor film 106 to be supplied to the second oxide semiconductor film 108.

A structure in which the first oxide semiconductor film 106 and the second oxide semiconductor film 108 are thus stacked has an excellent effect of suppressing the generation of oxygen deficiency in the second oxide semiconductor film 108 and of facilitating the crystallinity of the second oxide semiconductor film 108.

Note that in the first oxide semiconductor film 106, high-resistance regions 106a are formed in a region overlapping with the gate electrode 112 and regions outside the second oxide semiconductor film 108, and a pair of low-resistance regions 106b is formed adjacent to the region overlapping with the gate electrode 112. Further, in the second oxide semiconductor film 108, a channel region 108a is formed in a region overlapping with the gate electrode 112, and a pair of low-resistance regions 108b is formed adjacent to the region overlapping with the gate electrode 112.

The high-resistance region 106a formed outside the second oxide semiconductor film 108 serves as a separation layer between transistors. This is to prevent electrical connection between adjacent transistors, for example, which would occur in the case where the high-resistance region 106a is not provided outside the second oxide semiconductor film 108.

The semiconductor device may also include, in a cross section taken along the channel length, a source electrode 118a in contact with one side surface of the second oxide semiconductor film 108; a drain electrode 118b in contact with the other side surface of the second oxide semiconductor film 108; a first conductive film 121a formed along one side surface of the gate electrode 112; a second conductive film 121b formed along the other side surface of the gate electrode 112; sidewall insulating films 115 which are formed on side surfaces of the first conductive film 121a and the second conductive films 121b; a protective insulating film 114 formed over the first oxide semiconductor film 106, the source electrode 118a, the drain electrode 118b, the sidewall insulating films 115, and the gate electrode 112; an interlayer insulating film 116 formed over the protective insulating film 114; a wiring 119a and a wiring 119b which are electrically connected to the source electrode 118a and the drain electrode 118b, respectively. Note that since the source electrode 118a and the drain electrode 118b are in contact with the pair of low-resistance regions 108b formed in the second oxide semiconductor film 108, the contact resistance can be low.

The structure of the semiconductor device in this embodiment differs from that of the semiconductor device in Embodiment 1 in that the first conductive film 121a, the second conductive film 121b, and the sidewall insulating films 115 are formed along both side surfaces of the gate electrode 112, and the source electrode 118a and the drain electrode 118b are in contact with one side surface and the other side surface of the second oxide semiconductor film 108, respectively, in a cross section taken along the channel length.

Further, in the semiconductor device in this embodiment, at least part of the first conductive film 121a formed along the one side surface of the gate electrode 112 is formed over the source electrode 118a with the gate insulating film 110 interposed therebetween, and at least part of the second conductive film 121b formed along the other side surface of the gate electrode 112 is formed over the drain electrode 118b with the gate insulating film 110 interposed therebetween. In this manner, it is possible to provide a region (also referred to as an Lov region) in which part of the gate electrode 112 (more specifically, the gate electrode 112, the first conductive film 121a, and the second conductive film 121b) overlaps with the source electrode 118a and the drain electrode 118b with the gate insulating film 110 interposed therebetween. Thus, the semiconductor device in this embodiment has a structure suitable for miniaturization and can suitably suppress a reduction in on-state current due to miniaturization.

Note that each component that can be used for the semiconductor device in this embodiment can be similar to that in any of Embodiments 1 to 3; therefore, detailed description thereof is omitted and components that are not employed in any of Embodiment 1 to 3 will be described below.

[Detailed Description of First Conductive Film and Second Conductive Film]

The first conductive film 121a and the second conductive film 121b can be formed, for example, by processing a metal film of tungsten, titanium, or the like or a silicon film or the like containing an impurity element such as phosphorus or boron as long as the first conductive film 121a and the second conductive film 121b have conductivity. Alternatively, the first conductive film 121a and the second conductive film 121b which have conductivity may be provided by forming a polycrystalline silicon film over the gate electrode 112, forming a conductive film in contact with the gate electrode 112 by etching, introducing an impurity element such as phosphorus or boron into the conductive film by doping, and performing heat treatment.

Note that details of the other components will be described in [Method 4 for Manufacturing Semiconductor Device] below, with reference to FIGS. 14A to 14D, FIGS. 15A to 15D, FIGS. 16A to 16D, and FIGS. 17A and 17B.

[Method 4 for Manufacturing Semiconductor Device]

An example of a method for manufacturing the semiconductor device illustrated in FIGS. 13A to 13C of this embodiment will be described below with reference to FIGS. 14A to 14D, FIGS. 15A to 15D, FIGS. 16A to 16D, and FIGS. 17A and 17B.

Figure 14A:
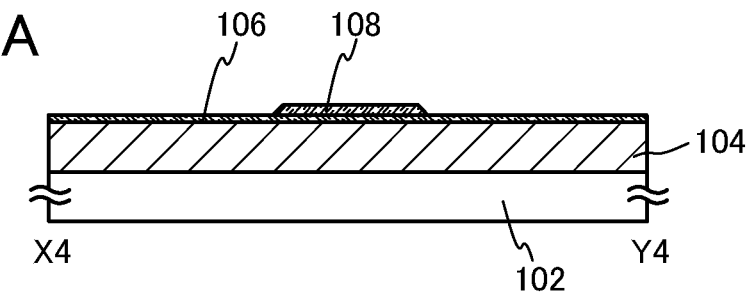
FIGS. 14A to 14D are cross-sectional views illustrating an example of a manufacturing process of a semiconductor device.

First, referring to the manufacturing method in Embodiment 1, a semiconductor device in a state illustrated in FIG. 14A can be manufactured. Note that a cross section in FIG. 14A is a modulation example of the semiconductor device in FIG. 2B, and is different only in the area of the second oxide semiconductor film 108.

Figure 14B:
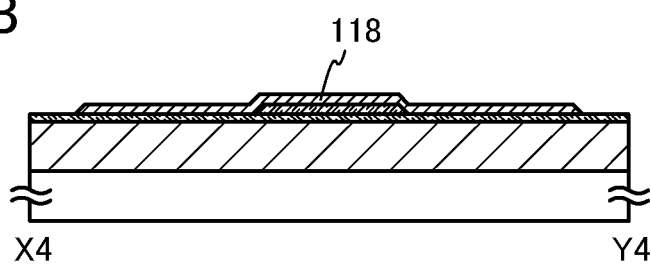
Figure 14C:
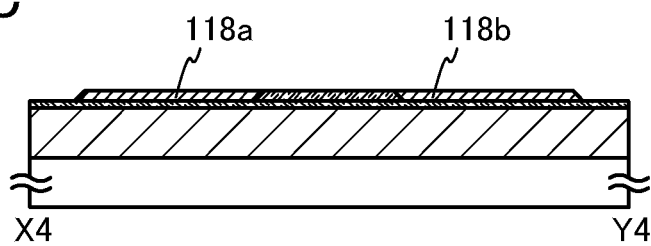

Then, a conductive film is deposited over the first oxide semiconductor film 106 and the second oxide semiconductor film 108, followed by a photolithography step through which a resist mask is formed over the conductive film and etching is selectively performed on the conductive film to form a conductive film 118 (see FIG. 14B).

Next, CMP treatment is performed on the conductive film 118 to remove part of the conductive film 118, so that the second semiconductor film 108 is exposed. The CMP treatment can remove a region of the conductive film 118, which overlaps with the second oxide semiconductor film 108, whereby the source electrode 118a and the drain electrode 118b are formed (see FIG. 14C).

Note that for the CMP treatment here, the description of the CMP treatment performed on the conductive film 118 in Embodiment 2 can be referred to.

Figure 14D:
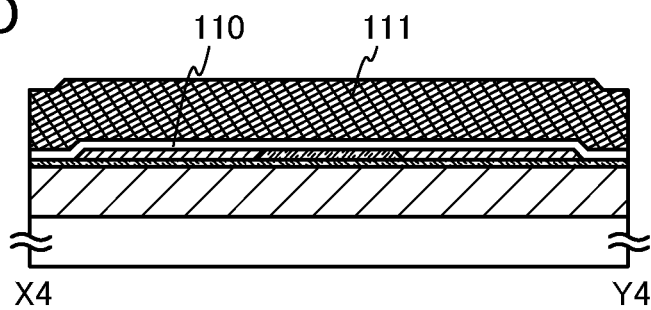

Next, the gate insulating film 110 and a conductive film 111 are formed over the first oxide semiconductor film 106, the second oxide semiconductor film 108, the source electrode 118a, and the drain electrode 118b (see FIG. 14D).

Figure 15A:
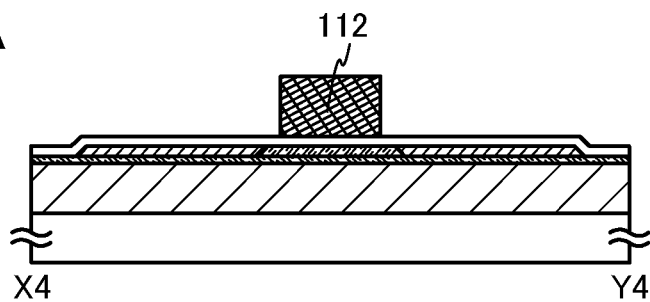
FIGS. 15A to 15D are cross-sectional views illustrating an example of a manufacturing process of a semiconductor device.

Next, through a photolithography step, a resist mask is formed over the conductive film 111, and selective etching is performed on the conductive film 111 to form the gate electrode 112 (see FIG. 15A).

Figure 15B:
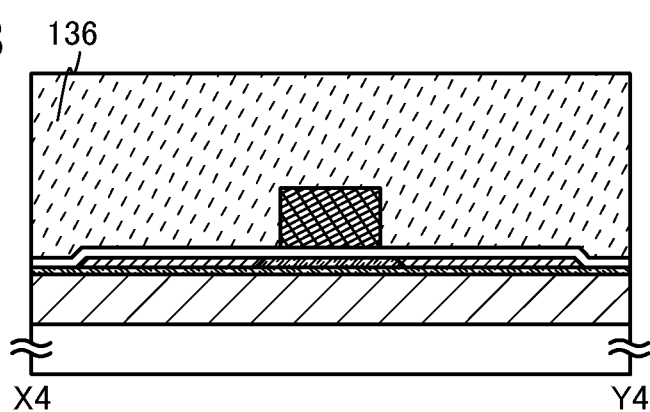
Figure 15C:
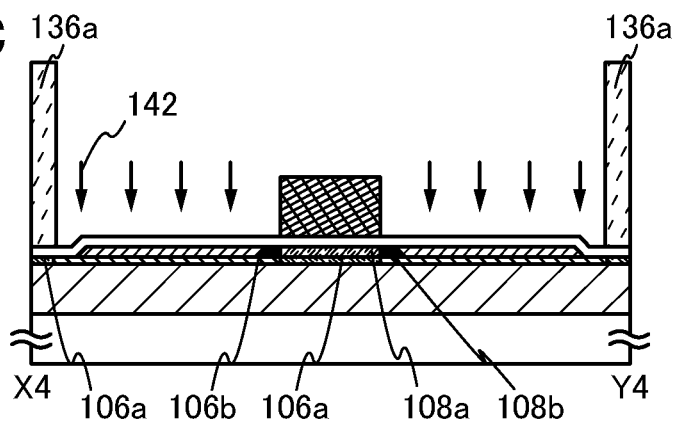

Then, a resist mask 136 is formed over the gate insulating film 110 and the gate electrode 112 (see FIG. 15B).

Next, the resist mask 136 is selectively subjected to light exposure and development through a photolithography step to form a resist mask 136a. After that, with the use of the gate electrode 112 and the resist mask 136a as masks, a dopant 142 is introduced into the first oxide semiconductor film 106 and the second oxide semiconductor film 108. The introduction of the dopant 142 makes the first oxide semiconductor film 106 have the high-resistance regions 106a and the pair of low-resistance regions 106b which are adjacent to a region overlapping with the gate electrode 112. The introduction of the dopant 142 also makes the second oxide semiconductor film 108 have the channel region 108a and the pair of low-resistance regions 108b which are adjacent to a region overlapping with the gate electrode 112 (see FIG. 15C).

Note that this embodiment has shown a structure in which the dopant 142 is introduced into the first oxide semiconductor film 106 through the source electrode 118a and the drain electrode 118b to form the low-resistance region 106b; however, the present invention is not limited thereto. Regions of the first oxide semiconductor film 106, which overlap with the source electrode 118a and the drain electrode 118b, may have the same impurity concentration as the high-resistance region 106a.

Figure 15D:
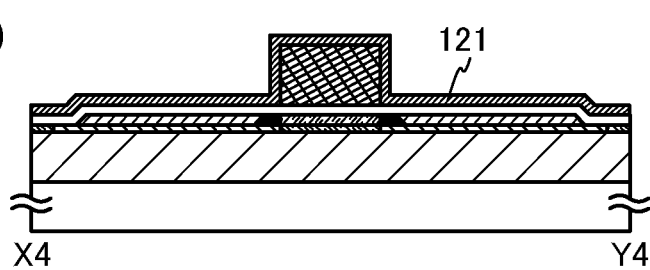

Next, the resist mask 136a is removed and a conductive film 121 is formed over the gate insulating film 110 and the gate electrode 112 (see FIG. 15D).

Figure 16A:
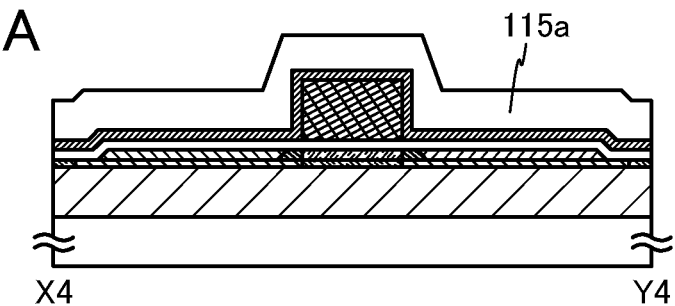
FIGS. 16A to 16D are cross-sectional views illustrating an example of a manufacturing process of a semiconductor device.
Figure 16B:
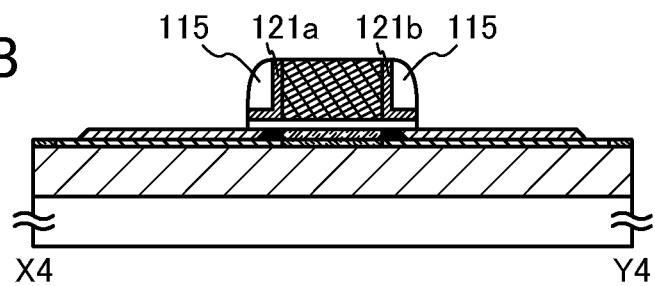

Next, an insulating film 115a is formed over a conductive film 121 (see FIG. 16A).

Then, the sidewall insulating films 115 are formed by etching the insulating film 115a. The sidewall insulating films 115 can be formed in a self-aligned manner by performing a highly anisotropic etching step on the insulating film 115a. As an example of an etching method, a dry etching method is preferably employed. As an example of an etching gas used for the dry etching method, a gas containing fluorine such as trifluoromethane, octafluorocyclobutane, or tetrafluoromethane can be used. A rare gas or hydrogen may be added to the etching gas. As the dry etching method, a reactive ion etching (RIE) method in which high-frequency voltage is applied to a substrate is preferably employed. After the sidewall insulating films 115 are formed, the conductive film 121 and the gate insulating film 110 are processed with the use of the gate electrode 112 and the sidewall insulating films 115 as masks, whereby the first oxide semiconductor film 106, the source electrode 118a, and the drain electrode 118b are exposed (see FIG. 16B). Note that the conductive film 121 and the gate insulating film 110 may be processed at the time of the formation of the sidewall insulating films 115. In this embodiment, the conductive film 121 is divided into the first conductive film 121a and the second conductive film 121b, part of the gate insulating film 110 is removed, and part of surfaces of the source electrode 118a and the drain electrode 118b is exposed.

Figure 16C:
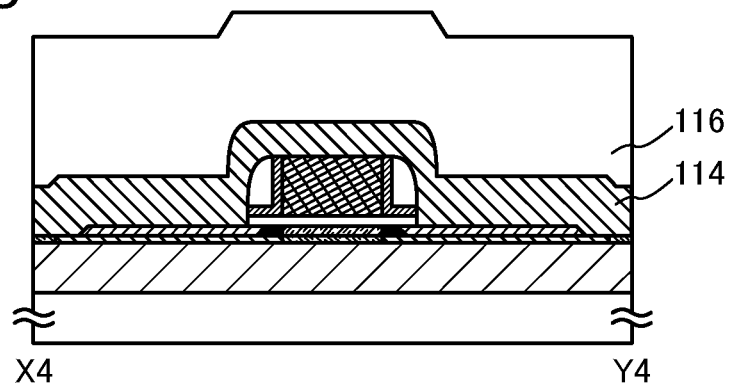

Next, the protective insulating film 114 and the interlayer insulating film 116 are formed to cover the first oxide semiconductor film 106, the gate electrode 112, the sidewall insulating films 115, the first conductive film 121a, the second conductive film 121b, the source electrode 118a, and the drain electrode 118b (see FIG. 16C).

Figure 16D:
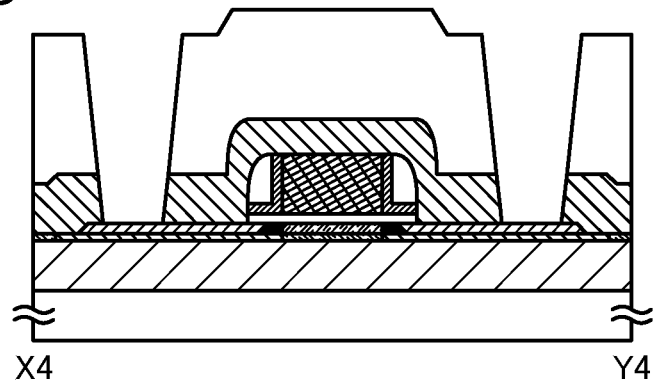

Then, through a photolithography step, a resist mask is formed over the interlayer insulating film 116, and the protective insulating film 114 and the interlayer insulating film 116 are selectively etched so that openings reaching the source electrode 118a and the drain electrode 118b are formed, and then the resist mask is removed (see FIG. 16D).

Figure 17A:
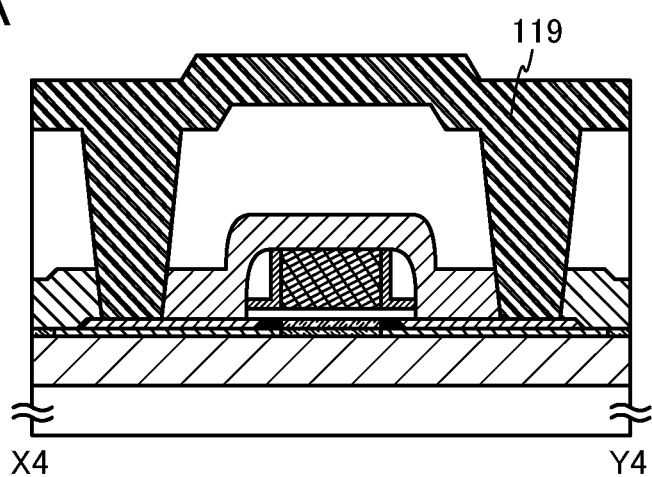
FIGS. 17A and 17B are cross-sectional views illustrating an example of a manufacturing process of a semiconductor device.

Next, the conductive film 119 is formed over the interlayer insulating film 116 to be embedded in the openings (see FIG. 17A).

Figure 17B:
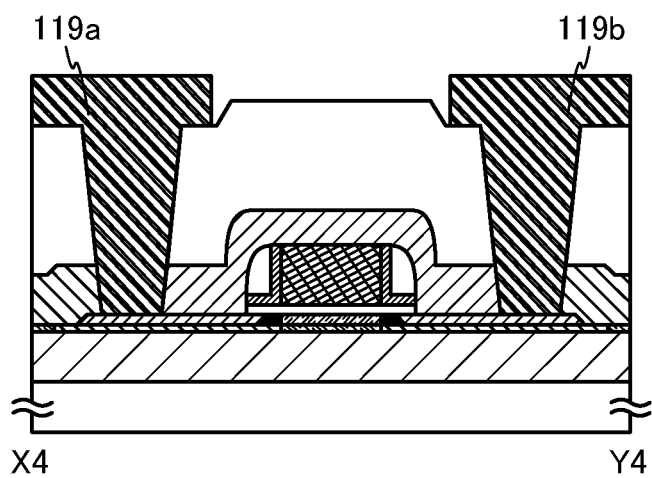

Then, through a photolithography step, a resist mask is formed over the conductive film 119, and the conductive film 119 is selectively etched, so that the wiring 119a and wiring 119b are formed (see FIG. 17B).

Through the above manufacturing steps, the semiconductor device illustrated in FIGS. 13A to 13C can be manufactured.

As described in this embodiment, a technical idea of the present invention is as follows. By forming the first oxide semiconductor film over the oxide film and the second oxide semiconductor film to be stacked over the first oxide semiconductor film, at least during the deposition of the second oxide semiconductor film, oxygen release from the oxide film can be suppressed. Further, since the first oxide semiconductor film serves as a base film for the second oxide semiconductor film, the second oxide semiconductor film can have higher crystallinity. The high crystallinity of the second oxide semiconductor film can suppress the generation of oxygen deficiency in the second oxide semiconductor film, and a transistor with stable electrical characteristics can be provided.

The methods and structures described in this embodiment can be combined as appropriate with any of the methods and structures described in the other embodiments.

(Embodiment 5)

In this embodiment, a modification example of the semiconductor device in any of Embodiments 1 to 4 and a method for manufacturing a semiconductor device, which is different from that in any of Embodiments 1 to 4, will be described with reference to FIGS. 18A to 18C, FIGS. 19A to 19D, FIGS. 20A to 20D, and FIGS. 21A to 21C. Note that portions similar to those in FIGS. 1A to 1C, FIGS. 2A to 2D, FIGS. 3A to 3D, FIGS. 4A to 4C, FIGS. 5A to 5D, FIGS. 6A to 6C, FIGS. 7A to 7C, FIGS. 8A to 8D, FIGS. 9A to 9C, FIGS. 10A to 10C, FIGS. 11A to 11D, FIGS. 12A to 12C, FIGS. 13A to 13C, FIGS. 14A to 14D, FIGS. 15A to 15D, FIGS. 16A to 16D, and FIGS. 17A and 17B are denoted by the same reference numerals, and description thereof is omitted. In addition, detailed description of the same portions is not repeated, either.

[Structural Example 5 of Semiconductor Device]

Figure 18A:
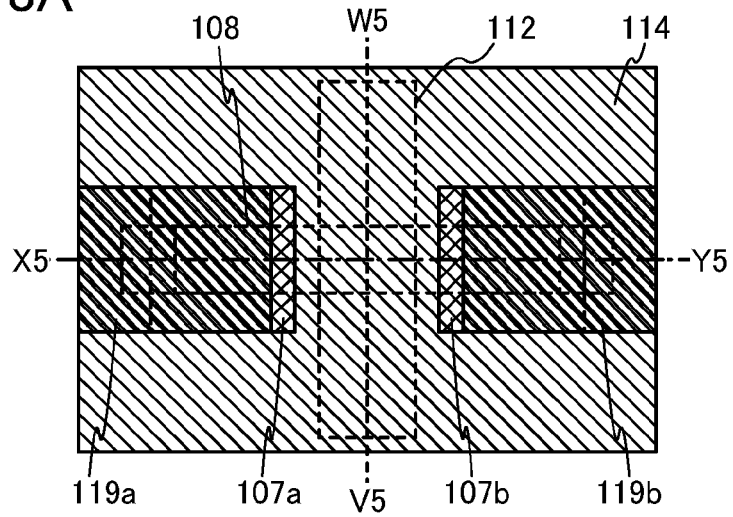
FIG. 18A is a plan view illustrating one embodiment of a semiconductor device and FIGS. 18B and 18C are cross-sectional views thereof.
Figure 18B:
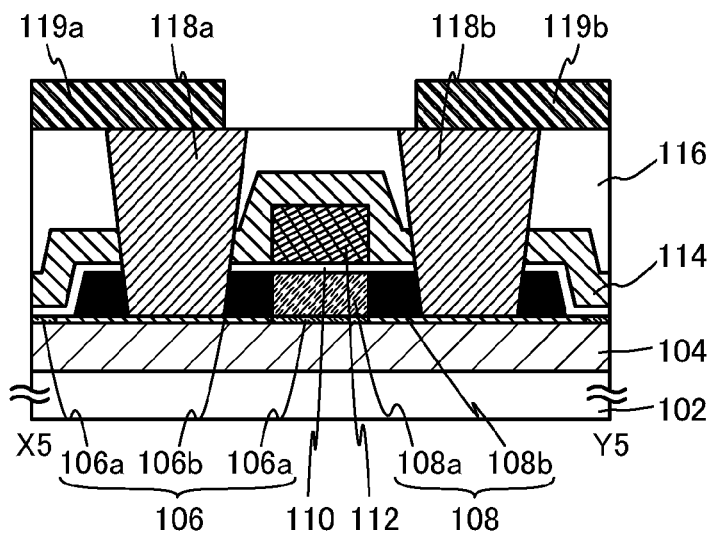
Figure 18C:
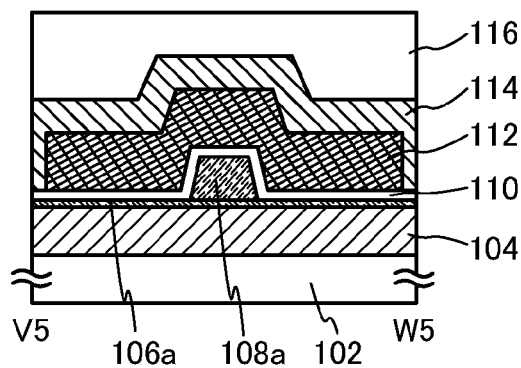

A plan view and cross-sectional views of a top-gate transistor as an example of the semiconductor device are illustrated in FIGS. 18A to 18C. FIG. 18A is the plan view, FIG. 18B corresponds to a cross-sectional view taken along line X5-Y5 in FIG. 18A, and FIG. 18C corresponds to a cross-sectional view taken along line V5-W5 in FIG. 18A. Note that in FIG. 18A, some components of the semiconductor device (e.g., a gate insulating film 110) are omitted for simplicity.

The semiconductor device illustrated in FIGS. 18A to 18C include an oxide film 104; a first oxide semiconductor film 106 formed over the oxide film 104; a second oxide semiconductor film 108 formed over the first oxide semiconductor film 106; the gate insulating film 110 formed over the second oxide semiconductor film 108; and a gate electrode 112 which is in contact with the gate insulating film 110 and formed in a region overlapping with the second oxide semiconductor film 108.

The first oxide semiconductor film 106 and the second oxide semiconductor film 108 are each formed using an oxide film containing at least indium, gallium, and zinc, and the content percentage of gallium in the first oxide semiconductor film 106 is higher than in the second oxide semiconductor film 108.

Further, in the first oxide semiconductor film 106, the content percentage of gallium is higher than or equal to that of indium. Furthermore, in the second oxide semiconductor film 108, the content percentage of indium is higher than that of gallium. The high content percentage of indium in the second oxide semiconductor film 108 can lead to higher crystallinity of the second oxide semiconductor film 108.

The first oxide semiconductor film 106 and the second oxide semiconductor film 108 are stacked and have different compositions as described above. Further, the first oxide semiconductor film 106 can suppress oxygen release from the oxide film 104 at the time of the formation of the second oxide semiconductor film 108.

Further, the second oxide semiconductor film 108 is formed over the first oxide semiconductor film 106 which is formed using the same kinds of materials as the second oxide semiconductor film 108, whereby the second oxide semiconductor film 108 can have a crystal portion that grows from the interface with the first oxide semiconductor film 106.

That is, the first oxide semiconductor film 106 suppresses oxygen release from the oxide film 104 at least at the time of the deposition of the second oxide semiconductor film 108, and also serves as a base film for the second oxide semiconductor film 108, resulting in higher crystallinity of the second oxide semiconductor film 108. After the second oxide semiconductor film 108 is formed, oxygen is released from the oxide film 104 by heat treatment or the like, and then the oxygen can pass through the first oxide semiconductor film 106 to be supplied to the second oxide semiconductor film 108.

A structure in which the first oxide semiconductor film 106 and the second oxide semiconductor film 108 are thus stacked has an excellent effect of suppressing the generation of oxygen deficiency in the second oxide semiconductor film 108 and of facilitating the crystallinity of the second oxide semiconductor film 108.

Note that in the first oxide semiconductor film 106, high-resistance regions 106a are formed in a region overlapping with the gate electrode 112 and regions outside the second oxide semiconductor film 108, and a pair of low-resistance regions 106b is formed adjacent to the region overlapping with the gate electrode 112. Further, in the second oxide semiconductor film 108, a channel region 108a is formed in a region overlapping with the gate electrode 112, and a pair of low-resistance regions 108b is formed adjacent to the region overlapping with the gate electrode 112.

The high-resistance region 106a formed outside the second oxide semiconductor film 108 serves as a separation layer between transistors. This is to prevent electrical connection between adjacent transistors, for example, which would occur in the case where the high-resistance region 106a is not provided outside the second oxide semiconductor film 108.

The semiconductor device may also include a protective insulating film 114 formed over the gate electrode 112; an interlayer insulating film 116 formed over the protective insulating film 114; a source electrode 118a and a drain electrode 118b which are, in a cross section in the channel length direction, in contact with side surfaces of the second oxide semiconductor film 108 in openings penetrating through the interlayer insulating film 116, the protective insulating film 114, the gate insulating film 110, and the second oxide semiconductor film 108; and a wiring 119a and a wiring 119b which are electrically connected to the source electrode 118a and the drain electrode 118b, respectively. Note that since the source electrode 118a and the drain electrode 118b are in contact with the pair of low-resistance regions 108b formed in the second oxide semiconductor film 108, the contact resistance can be low.

A structure of the semiconductor device in this embodiment differs from that of the semiconductor device in Embodiment 1 in that the source electrode 118a and the drain electrode 118b are embedded in the openings formed in the gate insulating film 110, the protective insulating film 114, the interlayer insulating film 116, and the second oxide semiconductor film 108; and the wiring 119a and the wiring 119b are formed, which are electrically connected to the source electrode 118a and the drain electrode 118b, respectively.

The structure of the semiconductor device in this embodiment differs from that of the semiconductor device in Embodiment 1 also in the shapes of the second oxide semiconductor film 108, the gate insulating film 110 which cover the top surface and side surfaces of the channel region 108a in the second oxide semiconductor film 108, and the gate electrode 112.

Note that in the semiconductor device in this embodiment, a channel is formed in the top surface and side surfaces of the second oxide semiconductor film 108 (more specifically, in the channel region 108a).

In this manner, in the semiconductor device in this embodiment, the second oxide semiconductor film 108 in a thick state (so-called a plate shape) is formed, the gate insulating film 110 is formed to cover the top surface and side surfaces of the second oxide semiconductor film 108, and the gate electrode 112 is formed over the gate insulating film 110. Thus, the channel width corresponds to the total length of the top surface and side surfaces of the second oxide semiconductor film 108 (more specifically, the channel region 108a); therefore, the substantial channel width can be larger without increasing a width of the top surface of the second oxide semiconductor film 108. The increase in the channel width can suppress a reduction in the on-state current of the transistor and variations in electrical characteristics of transistors.

Note that each component that can be used for the semiconductor device in this embodiment can be similar to that in any of Embodiments 1 to 4; therefore, detailed description thereof is omitted and components that are not employed in any of Embodiments 1 to 4 will be described below.

[Detailed Description of Second Oxide Semiconductor Film]

The second oxide semiconductor film 108 can be formed in the same manner as in Embodiment 1 except for a difference in the thickness. The thickness of the second oxide semiconductor film 108 in this embodiment is greater than 5 nm and less than or equal to 500 nm, preferably greater than or equal to 100 nm and less than or equal to 300 nm.

Note that details of the other components will be described in [Method 5 for Manufacturing Semiconductor Device] below, with reference to FIGS. 19A to 19D, FIGS. 20A to 20C, and FIGS. 21A to 21C.

[Method 5 for Manufacturing Semiconductor Device]

An example of a method for manufacturing the semiconductor device illustrated in FIGS. 18A to 18C of this embodiment will be described below with reference to FIGS. 19A to 19D, FIGS. 20A to 20C, and FIGS. 21A to 21C.

Figure 19A:
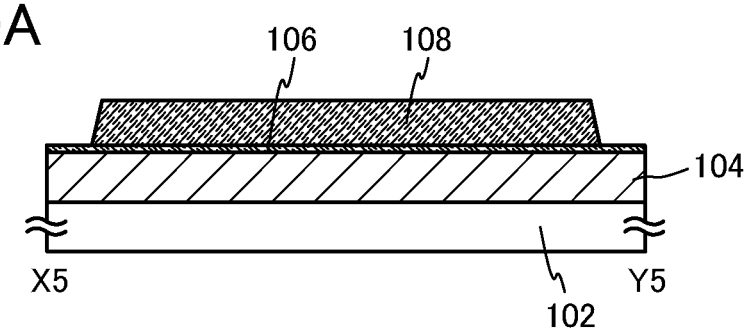
FIGS. 19A to 19D are cross-sectional views illustrating an example of a manufacturing process of a semiconductor device.

First, referring to the manufacturing method in Embodiment 1, a semiconductor device in a state illustrated in FIG. 19A can be manufactured. Note that a cross section in FIG. 19A is a modulation example of the semiconductor device in FIG. 2A, and is different only in the thickness of the second oxide semiconductor film 108.

Figure 19B:
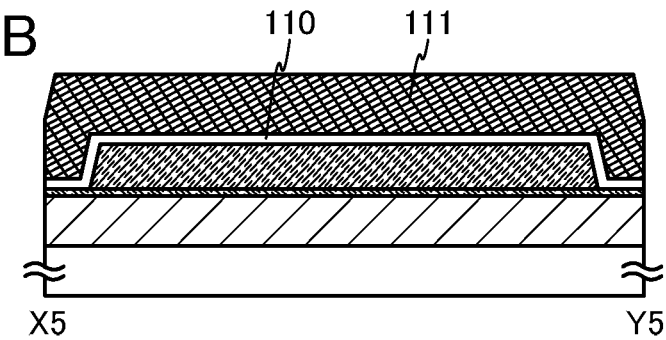

Next, the gate insulating film 110 and a conductive film 111 are formed over the first oxide semiconductor film 106 and the second oxide semiconductor film 108 (see FIG. 19B).

Figure 19C:
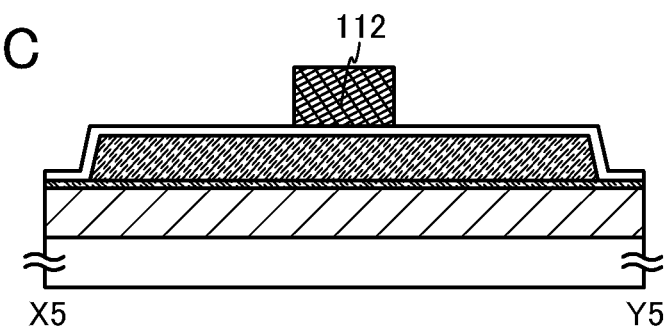

Next, through a photolithography step, a resist mask is formed over the conductive film 111, and selective etching is performed on the conductive film 111 to form the gate electrode 112 (see FIG. 19C).

Figure 19D:
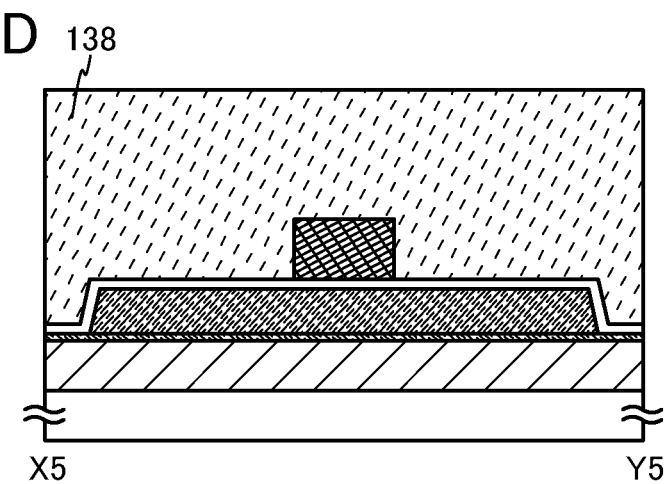

Then, a resist mask 138 is formed over the gate insulating film 110 and the gate electrode 112 (see FIG. 19D).

Next, the resist mask 138 is selectively subjected to light exposure and development through a photolithography step to form a resist mask 138a. After that, with the use of the gate electrode 112 and the resist mask 138a as masks, a dopant 142 is introduced into the first oxide semiconductor film 106 and the second oxide semiconductor film 108. The introduction of the dopant 142 makes the first oxide semiconductor film 106 have the high-resistance regions 106a and the pair of low-resistance regions 106b which are adjacent to a region overlapping with the gate electrode 112. The introduction of the dopant 142 also makes the second oxide semiconductor film 108 have the channel region 108a and the pair of low-resistance regions 108b which are adjacent to a region overlapping with the gate electrode 112 (see FIG. 20A).

Note that this embodiment has shown a structure in which the dopant 142 is introduced into the first oxide semiconductor film 106 through the second oxide semiconductor film 108 to form the low-resistance region 106b; however, the present invention is not limited thereto. Regions of the first oxide semiconductor film 106, which overlap with the second oxide semiconductor film 108, may have the same impurity concentration as the high-resistance region 106a.

Figure 20A:
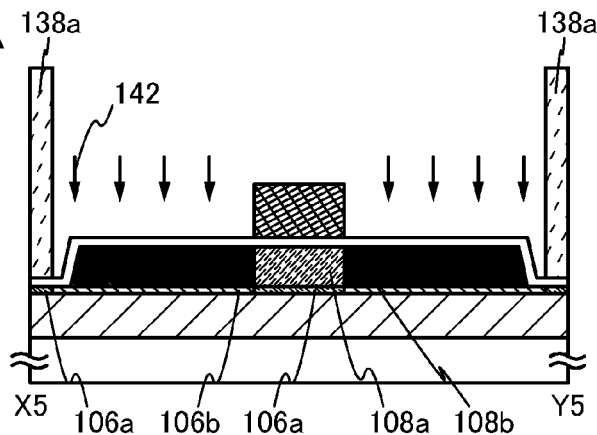
FIGS. 20A to 20D are cross-sectional views illustrating an example of a manufacturing process of a semiconductor device.
Figure 20B:
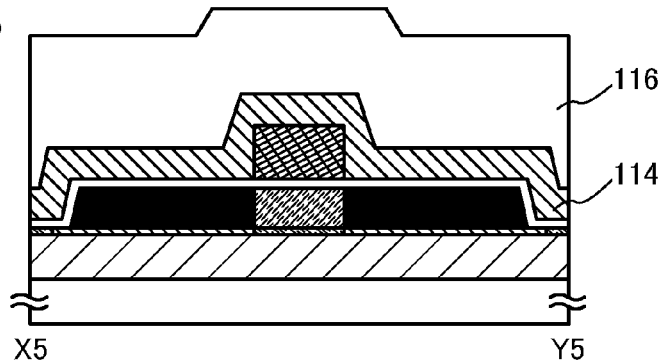

Next, the resist mask 138a is removed and the protective insulating film 114 and the interlayer insulating film 116 are formed over the gate insulating film 110 and the gate electrode 112 (see FIG. 20B).

Figure 20C:
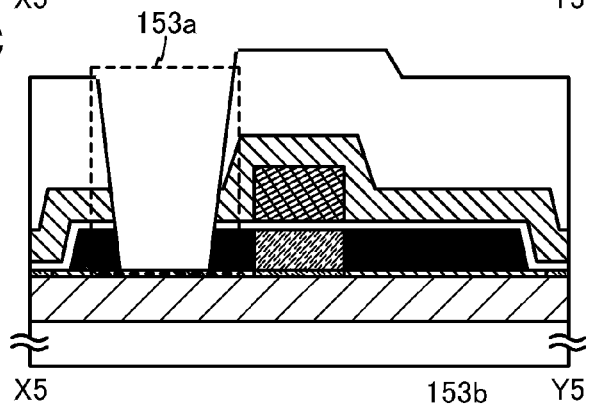

Then, through a photolithography step, a resist mask is formed over the interlayer insulating film 116, and then the interlayer insulating film 116, the protective insulating film 114, and the second oxide semiconductor film 108 are selectively etched, so that an openings 153a reaching the first oxide semiconductor film 106 is formed, and then the resist mask is removed (see FIG. 20C).

Figure 20D:
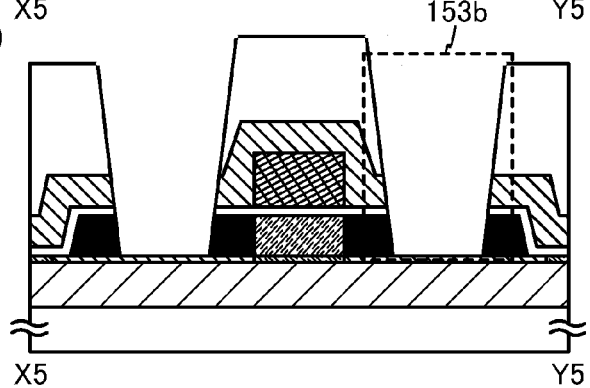

Then, through a photolithography step, a resist mask is formed over the opening 153a and the interlayer insulating film 116, and then the interlayer insulating film 116, the protective insulating film 114, and the second oxide semiconductor film 108 are selectively etched, so that an openings 153b reaching the first oxide semiconductor film 106 is formed, and then the resist mask is removed (see FIG. 20D). Thus, a pair of openings with the gate electrode 112 and the channel region 108a interposed therebetween is formed.

Note that this embodiment has shown a structure in which the opening 153a and the opening 153b reach the first oxide semiconductor film 106; however, the present invention is not limited thereto. For example, the opening 153a and the opening 153b may reach the oxide film 104.

However, according to the manufacturing method in this embodiment, as in the manufacturing method in Embodiment 2, the opening 153a and the opening 153b are formed with the use of two masks; therefore, the positions of the openings can be set freely without depending on the resolution limit of the light-exposure machine. Thus, the distance between the gate electrode 112 and the source side contact region or the drain side contact region can be reduced to 0.05 μm to 0.1 μm, for example. By reducing the distance between the gate electrode 112 and the source side contact region or the drain side contact region, the resistance between the source and the drain can be reduced, so that the electrical characteristics of the semiconductor device (e.g., on-state current characteristics of the transistor) can be improved.

Figure 21A:
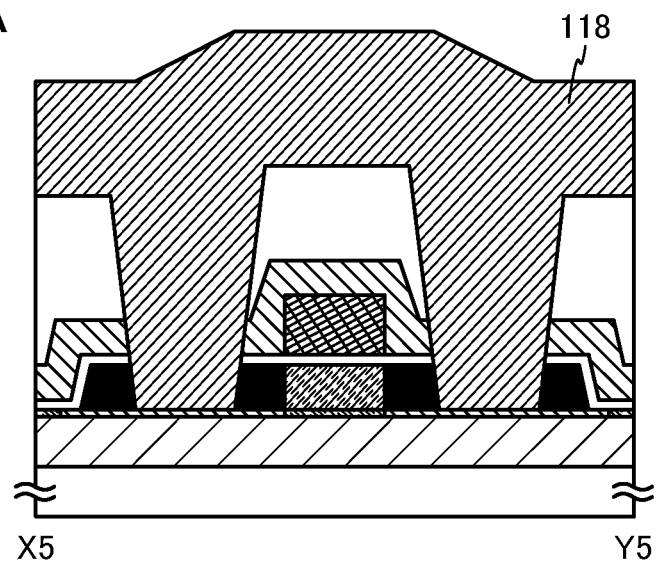
FIGS. 21A to 21C are cross-sectional views illustrating an example of a manufacturing process of a semiconductor device.

Next, the conductive film 118 is formed over the interlayer insulating film 116 to be embedded in the opening 153a and the opening 153b (see FIG. 21A).

Figure 21B:
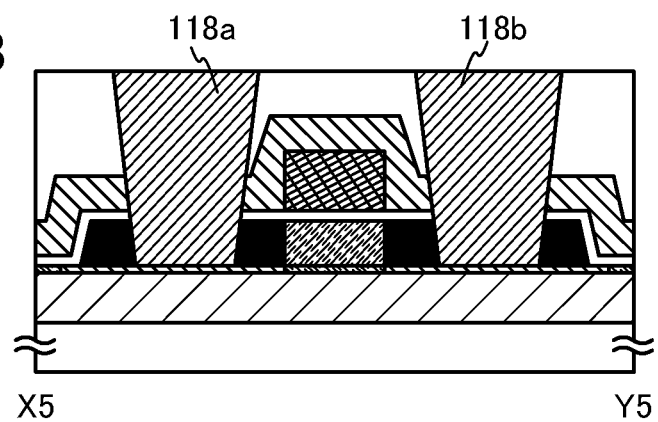

Next, CMP treatment is performed on the conductive film 118 in order to remove the conductive film 118 provided over the interlayer insulating film 116 (at least a region overlapping with the gate electrode 112); thus, the source electrode 118a and the drain electrode 118b embedded in the opening 153a and the opening 153b, respectively, are formed (see FIG. 21B).

Note that in this embodiment, contact regions between the source electrode 118a and the second oxide semiconductor film 108 and between the drain electrode 118b and the second oxide semiconductor film 108 are side surfaces of the second oxide semiconductor film 108 in the openings penetrating through the interlayer insulating film 116, the protective insulating film 114, the gate insulating film 110, and the second oxide semiconductor film 108.

Figure 21C:
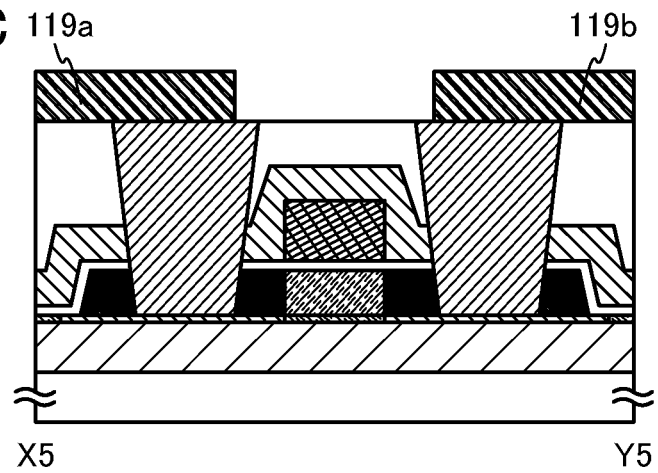

After that, a conductive film is formed over the interlayer insulating film 116, the source electrode 118a, and the drain electrode 118b, and then, through a photolithography step, a resist mask is formed over the conductive film, and a wiring 119a which is electrically connected to the source electrode 118a and a wiring 119b which is electrically connected the drain electrode 118b are formed (see FIG. 21C).

Through the above manufacturing steps, the semiconductor device illustrated in FIGS. 18A to 18C can be manufactured.

As described in this embodiment, a technical idea of the present invention is as follows. By forming the first oxide semiconductor film over the oxide film and the second oxide semiconductor film to be stacked over the first oxide semiconductor film, at least during the deposition of the second oxide semiconductor film, oxygen release from the oxide film can be suppressed. Further, since the first oxide semiconductor film serves as a base film for the second oxide semiconductor film, the second oxide semiconductor film can have higher crystallinity. The high crystallinity of the second oxide semiconductor film can suppress the generation of oxygen deficiency in the second oxide semiconductor film, and a transistor with stable electrical characteristics can be provided.

The methods and structures described in this embodiment can be combined as appropriate with any of the methods and structures described in the other embodiments.

(Embodiment 6)

In this embodiment, an example of a structure which includes a semiconductor device described in this specification, which can hold stored data even when not powered, and which has an unlimited number of write cycles will be described with reference to drawings.

Figure 22A:
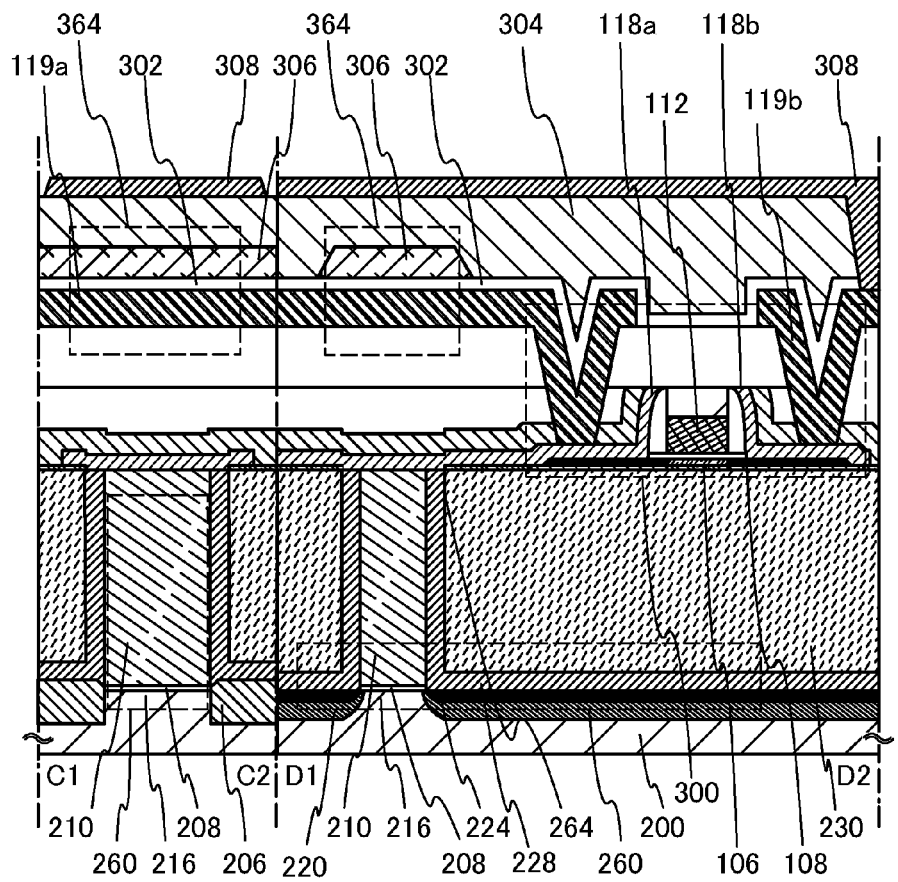
FIGS. 22A to 22C are a cross-sectional view, a plan view, and a circuit diagram illustrating one embodiment of a semiconductor device.
Figure 22B:
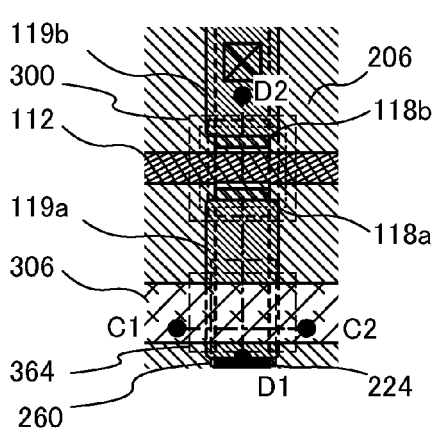
Figure 22C:
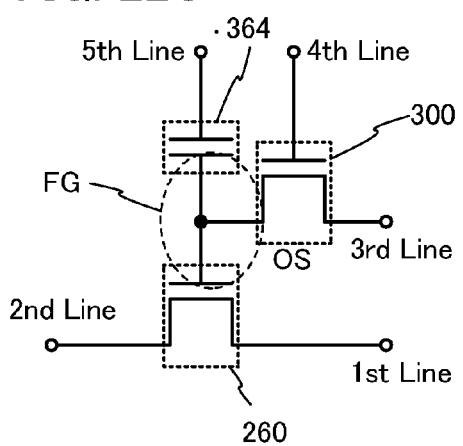

FIGS. 22A to 22C illustrate an example of a structure of the semiconductor device. FIGS. 22A to 22C illustrate a cross-sectional view, a plan view, and a circuit diagram, respectively, of the semiconductor device. Here, FIG. 22A corresponds to a cross section along line C1-C2 and line D1-D2 in FIG. 22B.

The semiconductor device illustrated in FIGS. 22A and 22B includes a transistor 260 including a first semiconductor material in a lower portion, and a transistor 300 including a second semiconductor material in an upper portion. As the transistor 300 including the second semiconductor material, any of the structures of the semiconductor devices described in Embodiment 3 can be employed. Although not described in this embodiment, any of the structures of the semiconductor devices described in Embodiment 1, Embodiment 2, Embodiment 4, and Embodiment 5 can also be employed.

Here, the first semiconductor material and the second semiconductor material are preferably materials having different band gaps. For example, the first semiconductor material can be a semiconductor material other than an oxide semiconductor (e.g., crystalline silicon) and the second semiconductor material can be an oxide semiconductor. A transistor including a material other than an oxide semiconductor, such as crystalline silicon, can operate at high speed easily. On the other hand, a transistor including an oxide semiconductor can hold charge for a long time owing to its characteristics.

Although all the transistors are n-channel transistors here, it is needless to say that p-channel transistors can be used.

The transistor 260 illustrated in FIG. 22A includes a channel formation region 216 provided in a substrate 200 including a semiconductor material (e.g., crystalline silicon), impurity regions 220 with the channel formation region 216 provided therebetween, intermetallic compound regions 224 in contact with the impurity regions 220, a gate insulating film 208 provided over the channel formation region 216, and a gate electrode 210 provided over the gate insulating film 208. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode", and a drain region and a drain electrode are collectively referred to as a "drain electrode". That is, in this specification, the term "source electrode" may include a source region.

An element isolation insulating film 206 is provided over the substrate 200 so as to surround the transistor 260, and an insulating film 228 and an oxide film 230 are provided to cover the transistor 260. Note that for high integration, it is preferable that, as illustrated in FIG. 22A, the transistor 260 does not have a sidewall insulating film. On the other hand, when the characteristics of the transistor 260 have priority, the sidewall insulating film may be formed along a side surface of the gate electrode 210 and the impurity regions 220 may include a region having different impurity concentrations.

The transistor 260 formed using a crystalline semiconductor substrate can operate at high speed. Thus, when the transistor is used as a reading transistor, data can be read at a high speed. An insulating film and an oxide film are formed so as to cover the transistor 260. As treatment prior to formation of the transistor 300 and a capacitor 264, CMP treatment is performed on the insulating film and the oxide film, whereby the insulating film 228 and the oxide film 230 which are planarized are formed and, at the same time, an upper surface of the gate electrode 210 is exposed.

As the insulating film 228, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used typically. As the oxide film 230, an oxide film such as a silicon oxide film, a silicon oxynitride film, or a silicon nitride oxide film can be used. The insulating film 228 and the oxide film 230 can be formed by a plasma CVD method, a sputtering method, or the like.

Alternatively, an organic material such as a polyimide-based resin, an acrylic-based resin, or a benzocyclobutene-based resin can be used for the insulating film 228. Other than such organic materials, it is also possible to use a low-dielectric constant material (a low-k material) or the like. In the case of using an organic material, the insulating film 228 may be formed by a wet method such as a spin coating method or a printing method.

Note that in this embodiment, a silicon nitride film is used as the insulating film 228, and a silicon oxide film is used as the oxide film 230.

A first oxide semiconductor film 106 and a second oxide semiconductor film 108 are formed over the oxide film 230 which is sufficiently planarized by polishing treatment (such as CMP treatment). Note that the average plane roughness of a surface of the oxide film 230 is preferably less than or equal to 0.15 nm.

The transistor 300 illustrated in FIG. 22A includes an oxide semiconductor in the channel formation region. Here, the second oxide semiconductor film 108 included in the transistor 300 is preferably highly purified. By using a highly purified oxide semiconductor, the transistor 300 which has extremely favorable off-state current characteristics can be obtained.

Since the off-state current of the transistor 300 is small, stored data can be held for a long time by using this transistor. In other words, power consumption can be sufficiently reduced because a semiconductor memory device in which refresh operation is unnecessary or the frequency of refresh operation is extremely low can be provided.

An insulating film 302 and an insulating film 304 each having a single-layer structure or a stacked-layer structure are provided over the transistor 300. In this embodiment, a stack in which a silicon oxide film and an aluminum oxide film are stacked from the transistor 300 side is used as the insulating film 302 and the insulating film 304. Note that when the aluminum oxide film has high density (e.g., a film density higher than or equal to $3.2 \text{ g/cm}^3$, preferably higher than or equal to $3.6 \text{ g/cm}^3$), the transistor 300 can have stable electrical characteristics.

In addition, a conductive film 306 is provided in a region overlapping with a wiring 119a which is connected to a source electrode 118a of the transistor 300 with the insulating film 302 provided therebetween, and the wiring 119a, the insulating film 302, and the conductive film 306 form a capacitor 364. That is, the source electrode 118a of the transistor 300 functions as one electrode of the capacitor 364, and the conductive film 306 functions as the other electrode of the capacitor 364. Note that in the case where a capacitor is not needed, the capacitor 364 may be omitted. Alternatively, the capacitor 364 may be separately provided above the transistor 300.

The insulating film 304 is provided over the transistor 300 and the capacitor 364. Further, a wiring 308 for connecting the transistor 300 to another transistor is provided over the insulating layer 304. The wiring 308 is formed to be embedded in an opening formed in the insulating film 302, the insulating film 304, and the like, and to be electrically connected to a drain electrode 118b.

In FIGS. 22A and 22B, the transistor 260 and the transistor 300 are provided so as to at least partly overlap with each other. The source region or the drain region of the transistor 260 is preferably provided so as to overlap with part of the second oxide semiconductor film 108. Further, the transistor 300 and the capacitor 364 are provided so as to overlap with at least part of the transistor 260. For example, the conductive film 306 of the capacitor 364 is provided so as to overlap with at least part of the gate electrode 210 of the transistor 260. With such a planar layout, the area occupied by the semiconductor device can be reduced; thus, higher integration can be achieved.

Next, an example of a circuit configuration corresponding to FIGS. 22A and 22B is illustrated in FIG. 22C.

In FIG. 22C, a first wiring (1st Line) is electrically connected to one of the source electrode and the drain electrode of the transistor 260, and a second wiring (2nd Line) is electrically connected to the other of the source electrode and the drain electrode of the transistor 260. A third line (3rd line) is electrically connected to one of the source electrode and a drain electrode of the transistor 300, and a fourth line (4th line) is electrically connected to a gate electrode of the transistor 300. The gate electrode of the transistor 260 and the other of the source electrode and the drain electrode of the transistor 300 are electrically connected to one electrode of the capacitor 364. A fifth wiring (5th Line) is electrically connected to the other electrode of the capacitor 364.

The semiconductor device in FIG. 22C utilizes a characteristic in which the potential of the gate electrode of the transistor 260 can be held, and can thus write, hold, and read data as follows.

Writing and holding of data will be described. The potential of the fourth wiring is set to a potential at which the transistor 300 is turned on, whereby the transistor 300 is turned on. Thus, the potential of the third wiring is supplied to the gate electrode of the transistor 260 and the capacitor 365. In other words, a predetermined charge is supplied to the gate electrode of the transistor 260 (i.e., writing of data). Here, charge for supply of a potential level or charge for supply of a different potential level (hereinafter referred to as Low level charge and High level charge) is given. After that, the potential of the fourth wiring is set to a potential at which the transistor 300 is turned off, so that the transistor 300 is turned off. Thus, the charge given to the gate electrode of the transistor 260 is held (holding).

Since the amount of off-state current of the transistor 300 is significantly small, the charge of the gate electrode of the transistor 260 is held for a long time.

Next, reading of data is described. By supplying an appropriate potential (reading potential) to the fifth wiring while a predetermined potential (constant potential) is supplied to the first wiring, the potential of the second wiring varies depending on the amount of charge retained in the gate electrode of the transistor 260. This is because in general, when the transistor 260 is an n-channel transistor, an apparent threshold voltage $V_{th\_H}$ in the case where High level charge is given to the gate electrode of the transistor 260 is lower than an apparent threshold voltage $V_{th\_L}$ in the case where Low level charge is given to the gate electrode of the transistor 260. Here, an apparent threshold voltage refers to the potential of the fifth wiring, which is needed to turn on the transistor 260. Thus, the potential of the fifth wiring is set to a potential $V_0$ existing between $V_{th\_H}$ and $V_{th\_L}$, whereby charge given to the gate electrode of the transistor 260 can be determined. For example, in the case where High level charge is given in writing, when the potential of the fifth wiring is set to $V_0$ ($>V_{th\_H}$), the transistor 260 is turned on. In the case where Low level charge is given in writing, even when the potential of the fifth wiring is set to $V_0$ ($<V_{th\_L}$), the transistor 260 remains in an off state. Therefore, the stored data can be read by the potential of the second line.

Note that in the case where memory cells are arrayed to be used, only data of desired memory cells needs to be read. In the case where data is not read, a potential at which the transistor 260 is turned off regardless of the state of the gate electrode, that is, a potential lower than $V_{th\_H}$ may be supplied to the fifth wiring. Alternatively, a potential at which the transistor 260 is turned on, that is, a potential higher than $V_{th\_L}$ may be supplied to the fifth wiring regardless of the state of the gate electrode.

When a transistor having a channel formation region formed using an oxide semiconductor and having extremely small off-state current is used in the semiconductor device in this embodiment, the semiconductor device can store data for an extremely long time. In other words, power consumption can be adequately reduced because refresh operation becomes unnecessary or the frequency of refresh operation can be extremely low. Moreover, stored data can be held for a long time even when power is not supplied (note that a potential is preferably fixed).

Further, in the semiconductor device in this embodiment, a high voltage is not needed for writing data and there is no problem of deterioration of elements. For example, unlike in a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing, which is a problem in a conventional nonvolatile memory, and reliability thereof is drastically improved. Furthermore, data is written depending on the on state and the off state of the transistor, whereby high-speed operation can be easily achieved.

The transistor 300 includes the first oxide semiconductor film 106 formed over the oxide film 230; the second oxide semiconductor film 108 formed over the first oxide semiconductor film 106; a gate insulating film 110 formed over the second oxide semiconductor film 108; and a gate electrode 112 which is in contact with the gate insulating film 110 and formed in a region overlapping with the second oxide semiconductor film 108.

The first oxide semiconductor film 106 and the second oxide semiconductor film 108 are each formed using an oxide film containing at least indium, gallium, and zinc, and the content percentage of gallium in the first oxide semiconductor film 106 is higher than in the second oxide semiconductor film 108.

Further, in the first oxide semiconductor film 106, the content percentage of gallium is higher than or equal to that of indium. Furthermore, in the second oxide semiconductor film 108, the content percentage of indium is higher than that of gallium. The high content percentage of indium in the second oxide semiconductor film 108 can lead to higher crystallinity of the second oxide semiconductor film 108.

The first oxide semiconductor film 106 and the second oxide semiconductor film 108 are stacked and have different compositions as described above. Further, the first oxide semiconductor film 106 can suppress oxygen release from the oxide film 104 at the time of the formation of the second oxide semiconductor film 108.

Further, the second oxide semiconductor film 108 is formed over the first oxide semiconductor film 106 which is formed using the same kinds of materials as the second oxide semiconductor film 108, whereby the second oxide semiconductor film 108 can have a crystal portion that grows from the interface with the first oxide semiconductor film 106.

That is, the first oxide semiconductor film 106 suppresses oxygen release from the oxide film 104 at least at the time of the deposition of the second oxide semiconductor film 108, and also serves as a base film for the second oxide semiconductor film 108, resulting in higher crystallinity of the second oxide semiconductor film 108. After the second oxide semiconductor film 108 is formed, oxygen is released from the oxide film 104 by heat treatment or the like, and then the oxygen can pass through the first oxide semiconductor film 106 to be supplied to the second oxide semiconductor film 108.

A structure in which the first oxide semiconductor film 106 and the second oxide semiconductor film 108 are thus stacked has an excellent effect of suppressing the generation of oxygen deficiency in the second oxide semiconductor film 108 and of facilitating the crystallinity of the second oxide semiconductor film 108.

As described in this embodiment, a technical idea of the present invention is as follows. By forming the first oxide semiconductor film over the oxide film and the second oxide semiconductor film to be stacked over the first oxide semiconductor film, at least during the deposition of the second oxide semiconductor film, oxygen release from the oxide film can be suppressed. Further, since the first oxide semiconductor film serves as a base film for the second oxide semiconductor film, the second oxide semiconductor film can have higher crystallinity. The high crystallinity of the second oxide semiconductor film can suppress the generation of oxygen deficiency in the second oxide semiconductor film, and a transistor with stable electrical characteristics can be provided.

The methods and structures described in this embodiment can be combined as appropriate with any of the methods and structures described in the other embodiments.

(Embodiment 7)

In this embodiment, a structure which includes the semiconductor device described in any of Embodiments 1 to 5, which can hold stored data even when not powered, and which does not have a limitation on the number of write cycles, and which has a structure different from the structure described in Embodiment 6 will be described with reference to FIGS. 23A and 23B and FIGS. 24A and 24B.

Figure 23A:
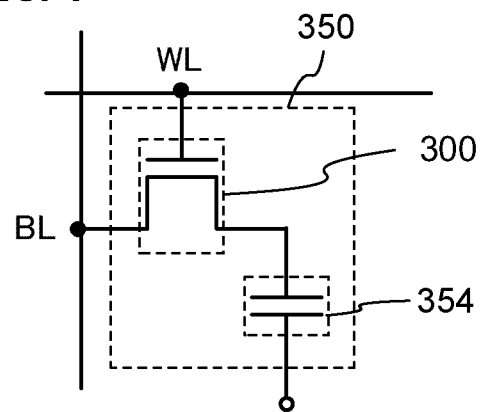
FIGS. 23A and 23B are a circuit diagram and a perspective view illustrating one embodiment of a semiconductor device.
Figure 23B:
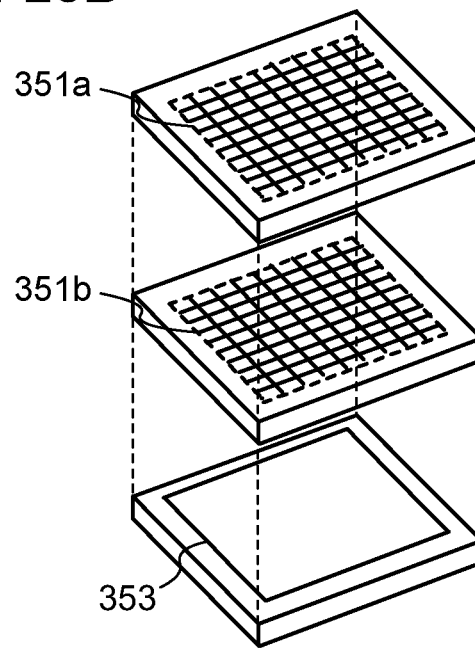

FIG. 23A illustrates an example of a circuit configuration of a semiconductor device, and FIG. 23B is a conceptual diagram illustrating an example of a semiconductor device. First, the semiconductor device illustrated in FIG. 23A will be described, and then, the semiconductor device illustrated in FIG. 23B will be described.

In the semiconductor device illustrated in FIG. 23A, a bit line BL is electrically connected to a source electrode or a drain electrode of a transistor 300, a word line WL is electrically connected to a gate electrode of the transistor 300, and the source electrode or the drain electrode of the transistor 300 is electrically connected to a first terminal of a capacitor 354.

The transistor 300 including an oxide semiconductor has extremely small off-state current. For that reason, the potential of the first terminal of the capacitor 354 (or a charge accumulated in the capacitor 354) can be held for an extremely long time by turning off the transistor 300.

Next, writing and holding of data in the semiconductor device (a memory cell 350) illustrated in FIG. 23A will be described.

First, the potential of the word line WL is set to a potential at which the transistor 300 is turned on, so that the transistor 300 is turned on. Accordingly, the potential of the bit line BL is supplied to the first terminal of the capacitor 354 (writing). After that, the potential of the word line WL is set to a potential at which the transistor 300 is turned off, so that the transistor 300 is turned off. Thus, the potential of the first terminal of the capacitor 354 is held (holding).

Because the off-state current of the transistor 300 is extremely small, the potential of the first terminal of the capacitor 354 (or the charge accumulated in the capacitor) can be held for a long time.

Secondly, reading of data will be described. When the transistor 300 is turned on, the bit line BL which is in a floating state and the capacitor 354 are electrically connected to each other, and the charge is redistributed between the bit line BL and the capacitor 354. As a result, the potential of the bit line BL is changed. The amount of change in potential of the bit line BL fluctuates depending on the potential of the first terminal of the capacitor 354 (or the charge accumulated in the capacitor 354).

For example, the potential of the bit line BL after charge redistribution is $(C_B \times V_{BO} + C \times V)/(C_B + C)$, where V is the potential of the first terminal of the capacitor 354, C is the capacitance of the capacitor 354, $C_B$ is the capacitance of the bit line BL (hereinafter also referred to as bit line capacitance), and $V_{BO}$ is the potential of the bit line BL before the charge redistribution. Therefore, it can be found that assuming that the memory cell 350 is in either of two states in which the potentials of the first terminal of the capacitor 354 are $V_1$ and $V_0$ ($V_1 > V_0$), the potential of the bit line BL in the case of holding the potential $V_1$ ($=(C_B \times V_{BO} + C \times V_1)/(C_B + C)$) is higher than the potential of the bit line BL in the case of holding the potential $V_0$ ($=(C_B \times V_{BO} + C \times V_0)/(C_B + C)$).

By comparing the potential of the bit line BL with a predetermined potential, data can be read.

As described above, the semiconductor device illustrated in FIG. 23A can hold charge that is accumulated in the capacitor 354 for a long time because the off-state current of the transistor 300 is extremely small. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 23B will be described.

The semiconductor device illustrated in FIG. 23B includes memory cell arrays 351a and 351b including a plurality of memory cells 350 illustrated in FIG. 23A as a memory circuit in an upper portion, and a peripheral circuit 353 in a lower portion which is necessary for operation of the memory cell arrays 351a and 351b. Note that the peripheral circuit 353 is electrically connected to the memory cell arrays 351a and 351b.

In the structure illustrated in FIG. 23B, the peripheral circuit 353 can be provided under the memory cell arrays 351a and 351b. Thus, the size of the semiconductor device can be decreased.

It is preferable that a semiconductor material of the transistor provided in the peripheral circuit 353 be different from that of the transistor 300. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably achieved by the transistor.

Note that FIG. 23B illustrates, as an example, the semiconductor device in which two memory cell arrays of the memory cell arrays 351a and 351b are stacked; however, the number of memory cells to be stacked is not limited thereto. Three or more memory cell arrays may be stacked.

Next, a specific structure of the memory cell 350 illustrated in FIG. 23A will be described with reference to FIGS. 24A and 24B.

Figure 24A:
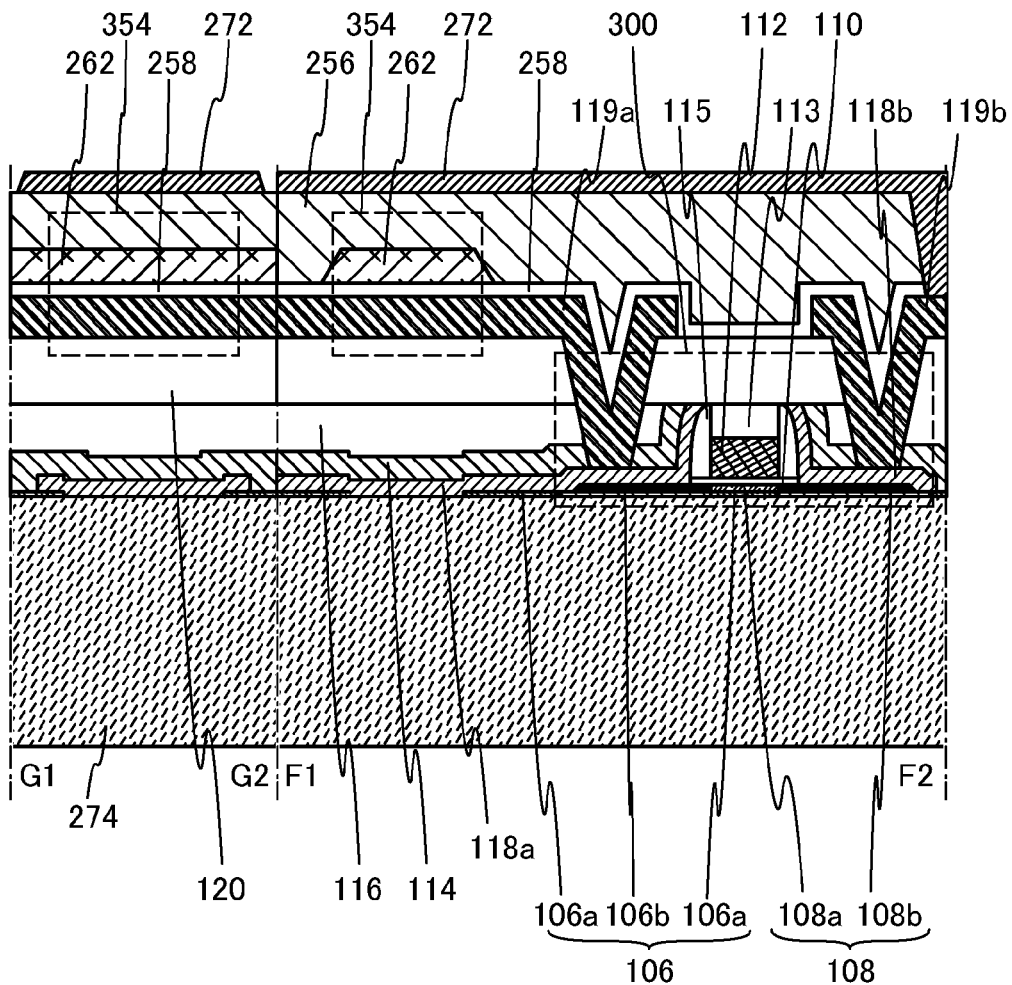
FIG. 24A is a cross-sectional view illustrating one embodiment of a semiconductor device and FIG. 24B is a plan view thereof.
Figure 24B:
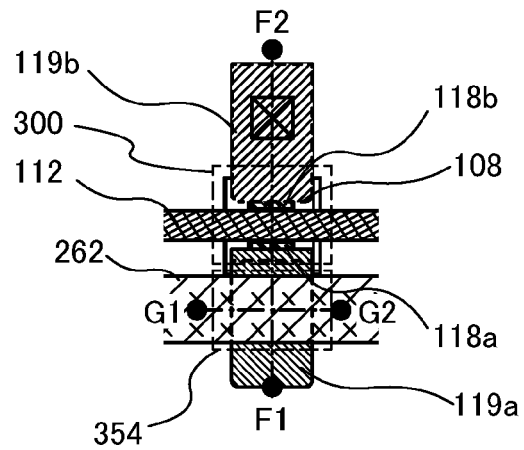

FIGS. 24A and 24B illustrate an example of a structure of the memory cell 350. FIG. 24A is a cross-sectional view of the memory cell 350, and FIG. 24B is a plan view of the memory cell 350. Here, FIG. 24A illustrates cross sections taken along chain line F1-F2 and chain line G1-G2 in FIG. 24B.

The transistor 300 illustrated in FIGS. 24A and 24B can have the same structure as the transistor in Embodiment 3 or Embodiment 6. Note that any of the structures of the transistors described in the other Embodiments may be employed.

The transistor 300 includes a first oxide semiconductor film 106 formed over an oxide film 274; a second oxide semiconductor film 108 formed over the first oxide semiconductor film 106; a gate insulating film 110 formed over the second oxide semiconductor film 108; and a gate electrode 112 which is in contact with the gate insulating film 110 and formed in a region overlapping with the second oxide semiconductor film 108.

The first oxide semiconductor film 106 and the second oxide semiconductor film 108 are each formed using an oxide film containing at least indium, gallium, and zinc, and the content percentage of gallium in the first oxide semiconductor film 106 is higher than in the second oxide semiconductor film 108.

Further, in the first oxide semiconductor film 106, the content percentage of gallium is higher than or equal to that of indium. Furthermore, in the second oxide semiconductor film 108, the content percentage of indium is higher than that of gallium. The high content percentage of indium in the second oxide semiconductor film 108 can lead to higher crystallinity of the second oxide semiconductor film 108.

The first oxide semiconductor film 106 and the second oxide semiconductor film 108 are stacked and have different compositions as described above. Further, the first oxide semiconductor film 106 can suppress oxygen release from the oxide film 104 at the time of the formation of the second oxide semiconductor film 108.

Further, the second oxide semiconductor film 108 is formed over the first oxide semiconductor film 106 which is formed using the same kinds of materials as the second oxide semiconductor film 108, whereby the second oxide semiconductor film 108 can have a crystal portion that grows from the interface with the first oxide semiconductor film 106.

That is, the first oxide semiconductor film 106 suppresses oxygen release from the oxide film 104 at least at the time of the deposition of the second oxide semiconductor film 108, and also serves as a base film for the second oxide semiconductor film 108, resulting in higher crystallinity of the second oxide semiconductor film 108. After the second oxide semiconductor film 108 is formed, oxygen is released from the oxide film 104 by heat treatment or the like, and then the oxygen can pass through the first oxide semiconductor film 106 to be supplied to the second oxide semiconductor film 108.

A structure in which the first oxide semiconductor film 106 and the second oxide semiconductor film 108 are thus stacked has an excellent effect of suppressing the generation of oxygen deficiency in the second oxide semiconductor film 108 and of facilitating the crystallinity of the second oxide semiconductor film 108.

Note that in the first oxide semiconductor film 106, high-resistance regions 106a are formed in a region overlapping with the gate electrode 112 and regions outside the second oxide semiconductor film 108, and a pair of low-resistance regions 106b is formed adjacent to the region overlapping with the gate electrode 112. Further, in the second oxide semiconductor film 108, a channel region 108a is formed in a region overlapping with the gate electrode 112, and a pair of low-resistance regions 108b is formed adjacent to the region overlapping with the gate electrode 112.

The high-resistance region 106a formed outside the second oxide semiconductor film 108 serves as a separation layer between transistors. This is to prevent electrical connection between adjacent transistors, for example, which would occur in the case where the high-resistance region 106a is not provided outside the second oxide semiconductor film 108.

The semiconductor device may also include an insulating film 113 formed in a region overlapping with the gate electrode 112; sidewall insulating films 115 which are formed along side surfaces of the gate electrode 112 and the insulating film 113; a source electrode 118a and a drain electrode 118b which are electrically connected to the second oxide semiconductor film 108; an insulating film 120 formed over an interlayer insulating film 116; and a wiring 119a and a wiring 119b which are electrically connected to the source electrode 118a and the drain electrode 118b, respectively, through openings formed in the insulating film 120, the interlayer insulating film 116, and a protective insulating film 114. Note that since the source electrode 118a and the drain electrode 118b are in contact with the pair of low-resistance regions 108b formed in the second oxide semiconductor film 108, the contact resistance can be low.

In addition, an insulating film 258 is formed over the transistor 300, and a conductive film 262 is provided in a region overlapping with a wiring 119a which is connected to a source electrode 118a of the transistor 300 with the insulating film 258 provided therebetween, and the wiring 119a, the insulating film 258, and the conductive film 262 form the capacitor 354. That is, the source electrode 118a of the transistor 300 functions as one electrode of the capacitor 354, and the conductive film 262 functions as the other electrode of the capacitor 354.

An insulating film 256 having a single-layer structure or a stacked-layer structure is provided over the transistor 300 and the capacitor 354. In addition, a wiring 272 for connecting the memory cell to an adjacent memory cell is provided over the insulating film 256. The wiring 272 is electrically connected to the drain electrode 118b of the transistor 300 through an opening which is provided in the insulating film 256, the insulating film 258, and the like and the wiring 119b. Note that the wiring 272 and the drain electrode 118b may be directly connected to each other. The wiring 272 corresponds to the bit line BL in the circuit configuration of FIG. 23A.

In FIGS. 24A and 24B, the drain electrode 118b of the transistor 300 can also function as a source electrode of a transistor included in the adjacent memory cell.

In this manner, when the planar layout in FIG. 24B is employed, the area occupied by the semiconductor device can be reduced; thus, the degree of integration can be increased.

As described above, the plurality of memory cells formed in multiple layers each include a transistor including an oxide semiconductor. Since the off-state current of the transistor including an oxide semiconductor is small, stored data can be held for a long time by using this transistor. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

As described above, a miniaturized and highly integrated semiconductor device having high electric characteristics and a method for manufacturing the semiconductor device can be provided.

As described in this embodiment, a technical idea of the present invention is as follows. By forming the first oxide semiconductor film over the oxide film and the second oxide semiconductor film to be stacked over the first oxide semiconductor film, at least during the deposition of the second oxide semiconductor film, oxygen release from the oxide film can be suppressed. Further, since the first oxide semiconductor film serves as a base film for the second oxide semiconductor film, the second oxide semiconductor film can have higher crystallinity. The high crystallinity of the second oxide semiconductor film can suppress the generation of oxygen deficiency in the second oxide semiconductor film, and a transistor with stable electrical characteristics can be provided.

This embodiment can be implemented in appropriate combination with any of the structures described in the other embodiments.

(Embodiment 8)

In this embodiment, examples of application of the semiconductor device described in any of the above embodiments to portable devices such as a mobile phone, a smartphone, or an e-book reader will be described with reference to FIGS. 25A and 25B, FIG. 26, FIG. 27, and FIG. 28.

In portable devices such as a mobile phone, a smartphone, and an e-book reader, an SRAM or a DRAM is used to store image data temporarily. This is because response speed of a flash memory is low and thus a flash memory is not suitable for image processing. On the other hand, an SRAM or a DRAM has the following characteristics when used for temporary storage of image data.

Figure 25A:
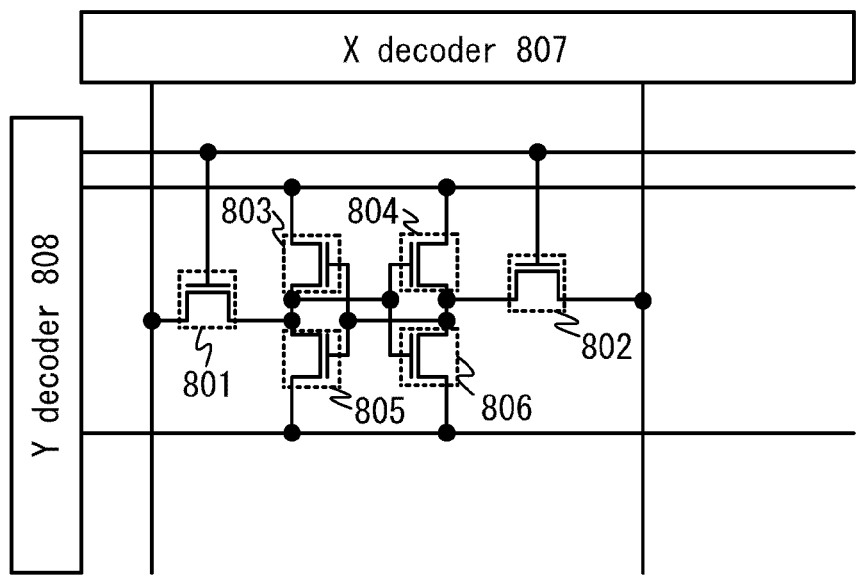
FIGS. 25A and 25B are circuit diagrams illustrating one embodiment of a semiconductor device.

In an ordinary SRAM, as illustrated in FIG. 25A, one memory cell includes six transistors, that is, transistors 801 to 806, which are driven with an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 25B:
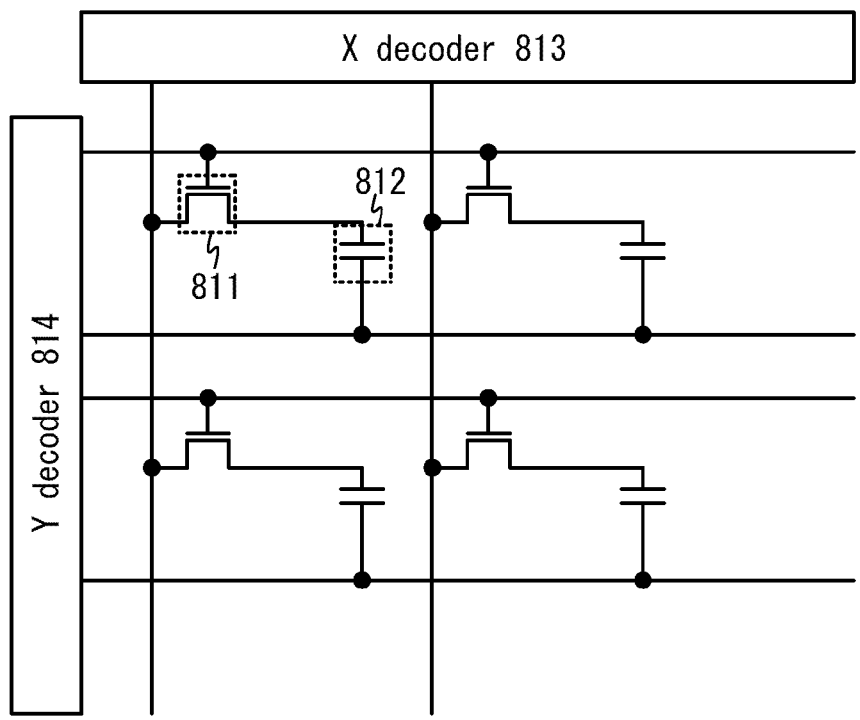

In contrast, in a DRAM, as illustrated in FIG. 25B, a memory cell includes a transistor 811 and a storage capacitor 812, which are driven with an X decoder 813 and a Y decoder 814. One cell includes one transistor and one capacitor and thus the area of a memory cell is small. The area of a memory cell of a DRAM is generally less than or equal to 10 $F^2$. Note that in the case of a DRAM, a refresh operation is always necessary and power is consumed even when a rewriting operation is not performed.

However, the area of the memory cell of the semiconductor device described in any of the above embodiments is about 10 $F^2$ and frequent refreshing is not needed. Therefore, the area of the memory cell is reduced, and the power consumption can be reduced.

Figure 26:
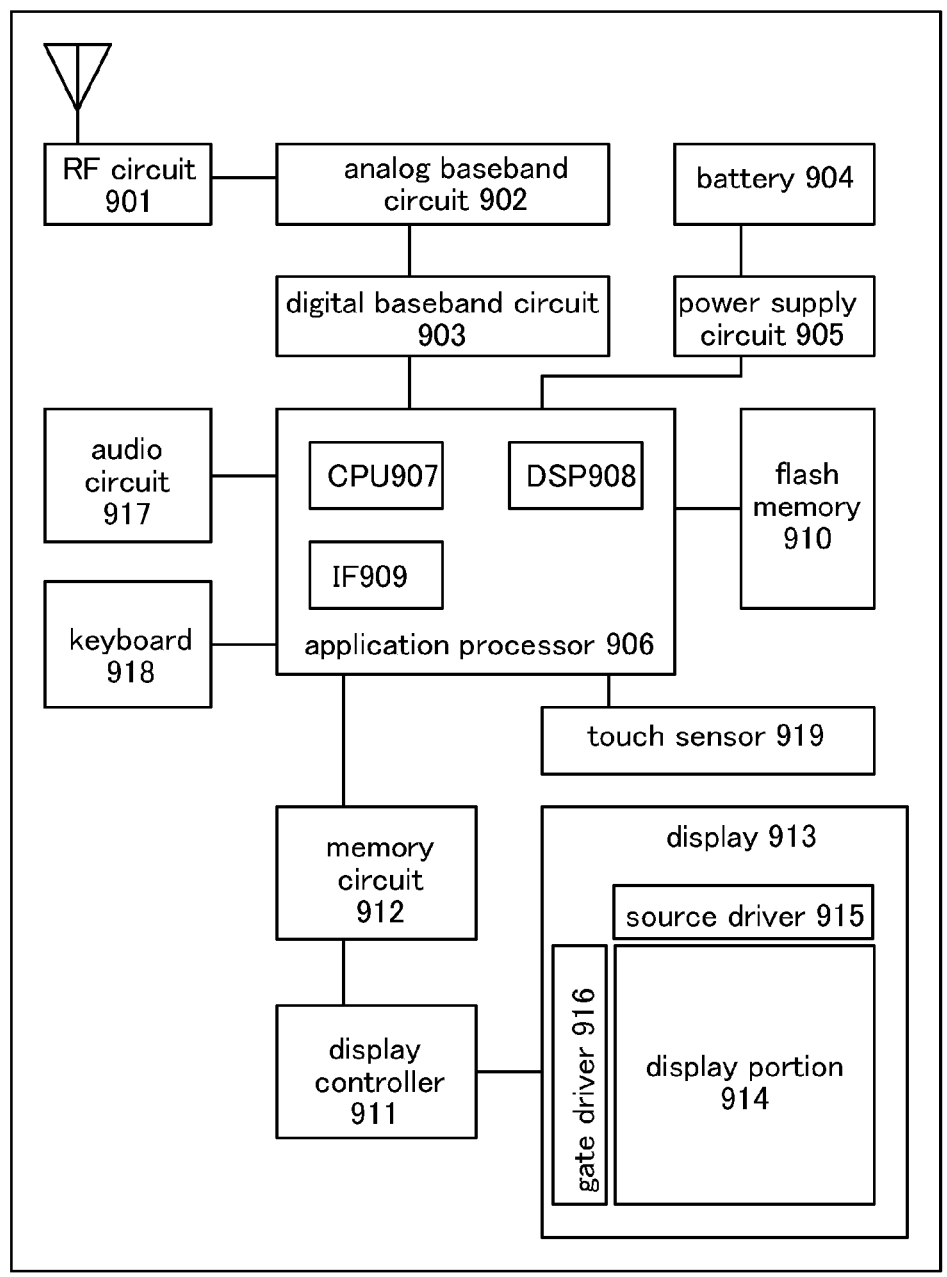
FIG. 26 is a block diagram illustrating one embodiment of a semiconductor device.

Next, FIG. 26 illustrates a block diagram of a portable device. A portable device shown in FIG. 26 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an IF 909. In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 27:
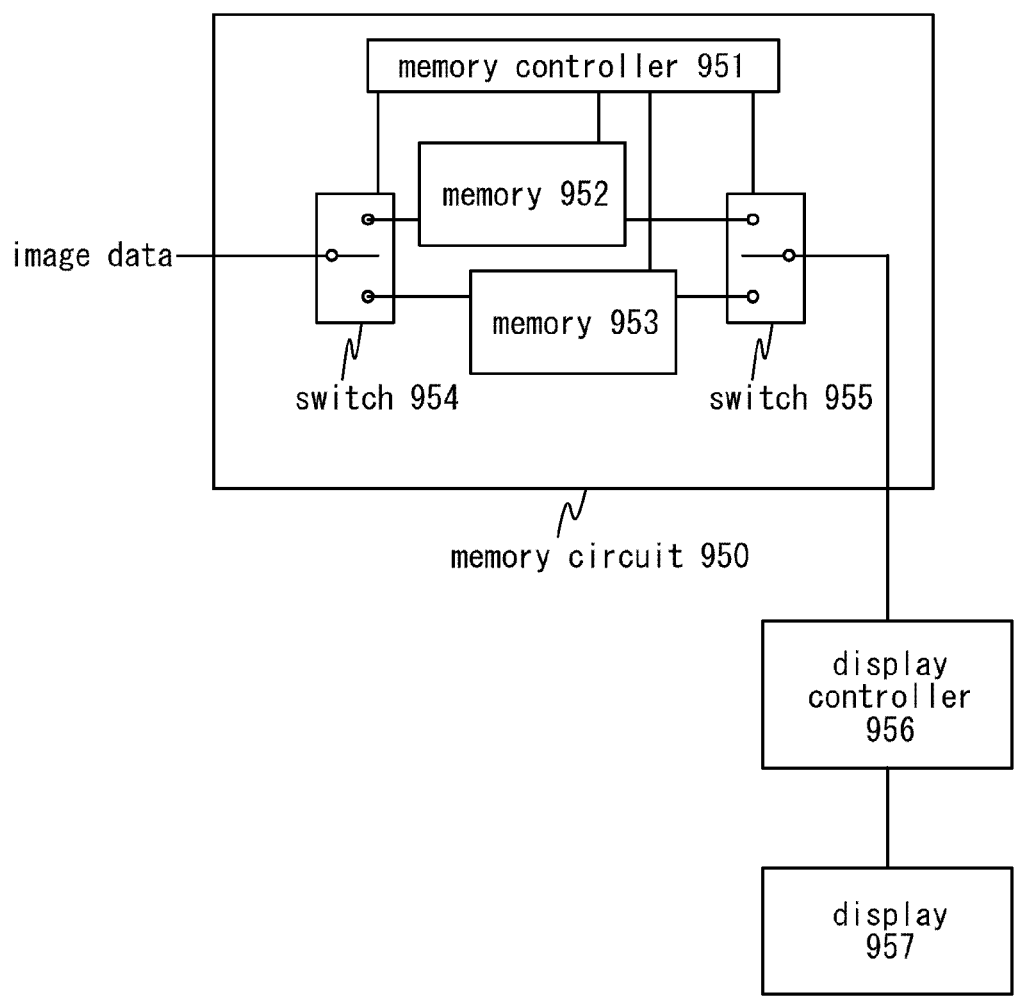
FIG. 27 is a block diagram illustrating one embodiment of a semiconductor device.

Next, FIG. 27 illustrates an example in which the semiconductor device described in any of the above embodiments is used for a memory circuit 950 in a display. The memory circuit 950 illustrated in FIG. 27 includes a memory 952, a memory 953, a switch 954, a switch 955, and a memory controller 951. Further, the memory circuit is connected to a display controller 956 which reads and controls image data input through a signal line (input image data) and data stored in the memory 952 and the memory 953 (stored image data), and is also connected to a display 957 which displays an image based on a signal from the display controller 956.

First, image data (input image data A) is formed by an application processor (not shown). The input image data A is stored in the memory 952 through the switch 954. The image data (stored image data A) stored in the memory 952 is transmitted and displayed to the display 957 through the switch 955 and the display controller 956.

In the case where the input image data A is not changed, the stored image data A is read from the memory 952 through the switch 955 by the display controller 956 normally at a frequency of approximately 30 Hz to 60 Hz.

Next, for example, when data displayed on the screen is rewritten by a user (that is, in the case where the input image data A is changed), new image data (input image data B) is formed by the application processor. The input image data B is held in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is stored in the memory 952.

Accordingly, image data is alternately written and read in the memories 952 and 953 so as to be displayed on the display 957. The memories 952 and 953 are not necessarily different memories, and a memory region included in one memory may be divided to be used. By employing the semiconductor device described in any of the above embodiments for the memory 952 and the memory 953, data can be written and read at high speed and held for a long time, and power consumption can be sufficiently reduced.

Figure 28:
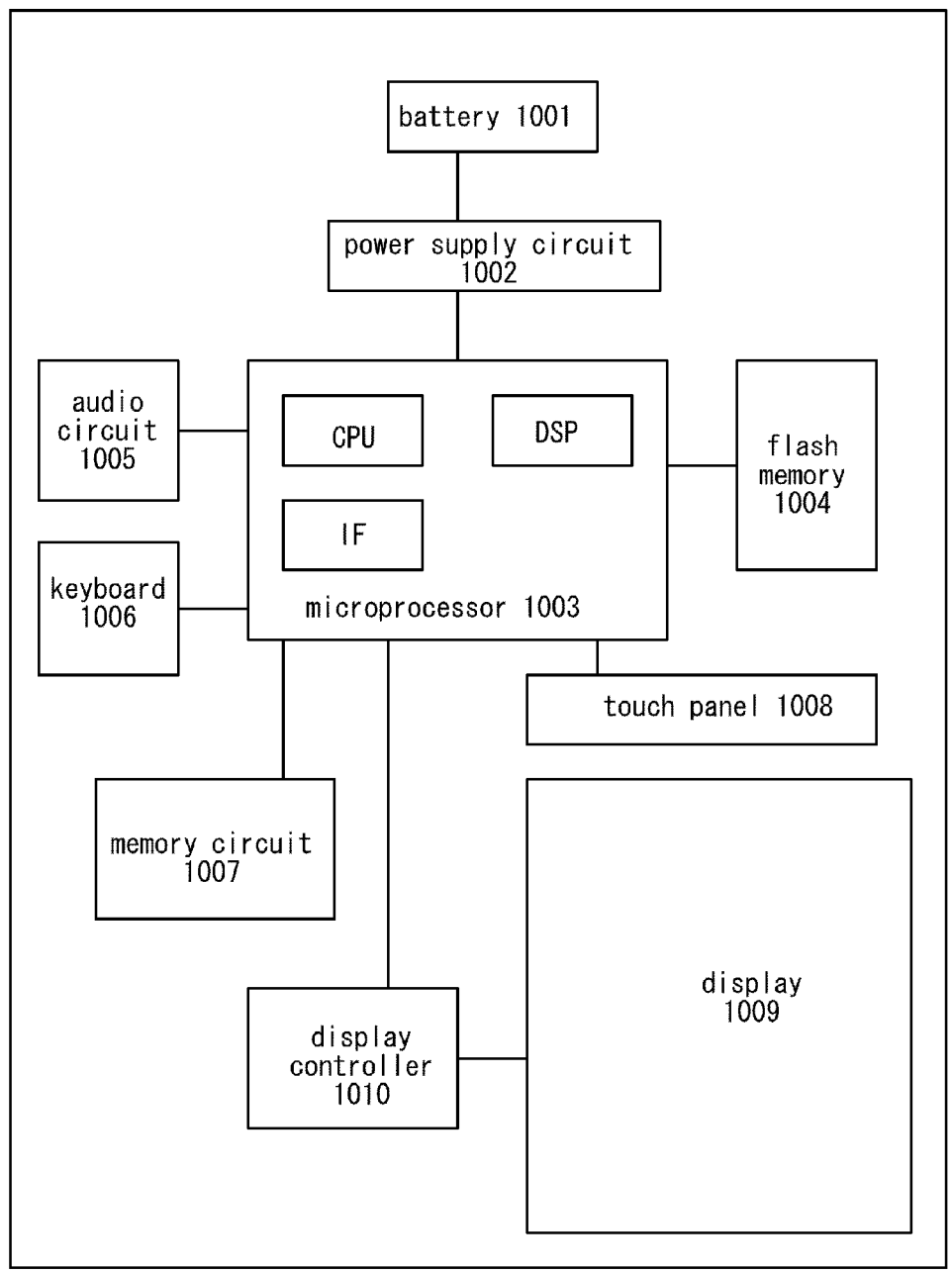
FIG. 28 is a block diagram illustrating one embodiment of a semiconductor device.

Next, FIG. 28 illustrates a block diagram of an e-book reader. FIG. 28 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 28. The memory circuit 1007 has a function of temporarily storing the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. In order to save information for a long time, the information may be copied into the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Therefore, it is possible to obtain a portable device which is capable of writing and reading data at high speed, storing data for a long time, and reducing power consumption.

The methods and structures described in this embodiment can be combined as appropriate with any of the methods and structures described in the other embodiments.

EXPLANATION OF REFERENCE

102: substrate, 104: oxide film, 106: first oxide semiconductor film, 106a: high-resistance region, 106b: low-resistance region, 108: second oxide semiconductor film, 108a: channel region, 108b: low-resistance region, 110: gate insulating film, 111: conductive film, 112: gate electrode, 113: insulating film, 113a: insulating film, 114: protective insulating film, 114a: insulating film, 115: sidewall insulating film, 115a: insulating film, 116: interlayer insulating film, 116a: insulating film, 118: conductive film, 118a: source electrode, 118b: drain electrode, 119: conductive film, 119a: wiring, 119b: wiring, 120: insulating film, 121: conductive film, 121a: first conductive film, 121b: second conductive film, 132: resist mask, 132a: resist mask, 134: resist mask, 134a: resist mask, 134b: resist mask, 136: resist mask, 136a: resist mask, 138: resist mask, 138a: resist mask, 142: dopant, 151a: first opening, 151b: second opening, 153a: opening, 153b: opening, 200: substrate, 206: element isolation insulating film, 208: gate insulating film, 210: gate electrode, 216: channel formation region, 220: impurity region, 224: intermetallic compound region, 228: insulating film, 230: oxide film, 256: insulating film, 258: insulating film, 260: transistor, 262: conductive film, 264: capacitor, 272: wiring, 274: oxide film, 300: transistor, 302: insulating film, 304: insulating film, 306: conductive film, 308: wiring, 350: memory cell, 351a: memory cell array, 351b: memory cell arrays, 353: peripheral circuit, 354: capacitor, 364: capacitor, 801: transistor, 802: transistor, 803: transistor, 804: transistor, 805: transistor, 806: transistor, 807: X decoder, 808: Y decoder, 811: transistor, 812: storage capacitor, 813: X decoder, 814: Y decoder, 901: RF circuit, 902: analog baseband circuit, 903: digital baseband circuit, 904: battery, 905: power supply circuit, 906: application processor, 907: CPU, 908: DSP, 909: IF, 910: flash memory, 911: display controller, 912: memory circuit, 913: display, 914: display portion, 915: source driver, 916: gate driver, 917: audio circuit, 918: keyboard, 919: touch sensor, 950: memory circuit, 951: memory controller, 952: memory, 953: memory, 954: switch, 955: switch, 956: display controller, 957: display, 1001: battery, 1002: power supply circuit, 1003: microprocessor, 1004: flash memory, 1005: audio circuit, 1006: keyboard, 1007: memory circuit, 1008: touch panel, 1009: display, 1010: display controller.

This application is based on Japanese Patent Application serial no. 2011-282509 filed with Japan Patent Office on Dec. 23, 2011, the entire contents of which are hereby incorporated by reference.

The invention claimed is:

1. A semiconductor device comprising:
a first oxide semiconductor film;
a second oxide semiconductor film over the first oxide semiconductor film, and
an insulating film over the second oxide semiconductor film, wherein a hydrogen concentration in the insulating film is less than $7.2 \times 10^{20}$ atoms/cm$^3$,
wherein the first oxide semiconductor film and the second oxide semiconductor film each comprises indium, gallium, and zinc, and
wherein the first oxide semiconductor film has a lower content percentage of indium and a higher content percentage of gallium than the second oxide semiconductor film.

2. The semiconductor device according to claim 1, wherein the first oxide semiconductor film comprises a low-resistance region and a high-resistance region, the high-resistance region being located outside the second oxide semiconductor film.

3. The semiconductor device according to claim 1, wherein the second oxide semiconductor film comprises a channel region and a pair of low-resistance regions in contact with the channel region.

4. The semiconductor device according to claim 1, wherein either end of the second oxide semiconductor film in a channel width direction comprises a high-resistance region.

5. The semiconductor device according to claim 1, wherein a content percentage of gallium is higher than or equal to a content percentage of indium in the first oxide semiconductor film.

6. The semiconductor device according to claim 1, wherein a content percentage of indium is higher than a content percentage of gallium in the second oxide semiconductor film.

7. The semiconductor device according to claim 1, wherein the second oxide semiconductor film comprises a crystal portion.

8. The semiconductor device according to claim 1, wherein a carrier concentration in the second oxide semiconductor film is less than $1 \times 10^{14}$ /cm$^3$.

9. The semiconductor device according to claim 1, wherein a copper concentration in the second oxide semiconductor film is less than or equal to $1 \times 10^{18}$ atoms/cm$^3$.

10. The semiconductor device according to claim 1, wherein an aluminum concentration in the second oxide semiconductor film is less than or equal to $1 \times 10^{18}$ atoms/cm$^3$.

11. The semiconductor device according to claim 1, wherein a chlorine concentration in the second oxide semiconductor film is less than or equal to $2 \times 10^{18}$ atoms/cm$^3$.

12. The semiconductor device according to claim 1, wherein a hydrogen concentration in the second oxide semiconductor film is less than or equal to $5 \times 10^{19}$ atoms/cm$^3$.

13. The semiconductor device according to claim 1, wherein the insulating film contains oxygen at a ratio exceeding a ratio of oxygen in a stoichiometric composition of the insulating film.

14. A semiconductor device comprising:
a first transistor, wherein a channel formation region of the first transistor comprises a semiconductor material;
an insulating film over the first transistor; and
a second transistor over the insulating film, the second transistor comprising:
a first oxide semiconductor film;
a second oxide semiconductor film over the first oxide semiconductor film;
a gate insulating film over the second oxide semiconductor film; and
a gate electrode over the second oxide semiconductor film with the gate insulating film interposed therebetween,
wherein the first oxide semiconductor film and the second oxide semiconductor film each comprises indium, gallium, and zinc, and
wherein the first oxide semiconductor film has a lower content percentage of indium and a higher content percentage of gallium than the second oxide semiconductor film.

15. The semiconductor device according to claim 14, wherein the first oxide semiconductor film comprises a low-resistance region and a high-resistance region, the high-resistance region being located outside the second oxide semiconductor film.

16. The semiconductor device according to claim 14, wherein the second oxide semiconductor film comprises a channel region and a pair of low-resistance regions in contact with the channel region.

17. The semiconductor device according to claim 14, wherein either end of the second oxide semiconductor film in a channel width direction comprises a high-resistance region.

18. The semiconductor device according to claim 14, wherein a content percentage of gallium is higher than or equal to a content percentage of indium in the first oxide semiconductor film.

19. The semiconductor device according to claim 14, wherein a content percentage of indium is higher than a content percentage of gallium in the second oxide semiconductor film.

20. The semiconductor device according to claim 14, further comprising a source electrode and a drain electrode which are provided over the gate insulating film,
wherein the gate insulating film has a first opening and a second opening,
wherein the source electrode and the drain electrode are electrically connected to the second oxide semiconductor film through the first opening and the second opening, respectively, and
wherein a distance between the gate electrode and the first opening and a distance between the gate electrode and the second opening are different.

21. The semiconductor device according to claim 14, wherein the second oxide semiconductor film comprises a crystal portion.

22. A semiconductor device comprising:
a first oxide semiconductor film;
a second oxide semiconductor film, wherein the first oxide semiconductor film and the second oxide semiconductor film overlap each other; and
an insulating film adjacent to the second oxide semiconductor film, wherein a hydrogen concentration in the insulating film is less than $7.2 \times 10^{20}$ atoms/cm$^3$,
wherein the first oxide semiconductor film and the second oxide semiconductor film each comprises indium, gallium, and zinc, and
wherein the first oxide semiconductor film has a lower content percentage of indium and a higher content percentage of gallium than the second oxide semiconductor film.

23. The semiconductor device according to claim 22, wherein the first oxide semiconductor film comprises a low-resistance region and a high-resistance region, the high-resistance region being located outside the second oxide semiconductor film.

24. The semiconductor device according to claim 22, wherein the second oxide semiconductor film comprises a channel region and a pair of low-resistance regions in contact with the channel region.

25. The semiconductor device according to claim 22, wherein either end of the second oxide semiconductor film in a channel width direction comprises a high-resistance region.

26. The semiconductor device according to claim 22, wherein a content percentage of gallium is higher than or equal to a content percentage of indium in the first oxide semiconductor film.

27. The semiconductor device according to claim 22, wherein a content percentage of indium is higher than a content percentage of gallium in the second oxide semiconductor film.

28. The semiconductor device according to claim 22, wherein the second oxide semiconductor film comprises a crystal portion.

29. The semiconductor device according to claim 22, wherein a carrier concentration in the second oxide semiconductor film is less than $1 \times 10^{14}$ /cm$^3$.

30. The semiconductor device according to claim 22, wherein a copper concentration in the second oxide semiconductor film is less than or equal to $1 \times 10^{18}$ atoms/cm$^3$.

31. The semiconductor device according to claim 22, wherein an aluminum concentration in the second oxide semiconductor film is less than or equal to $1 \times 10^{18}$ atoms/cm$^3$.

32. The semiconductor device according to claim 22, wherein a chlorine concentration in the second oxide semiconductor film is less than or equal to $2 \times 10^{18}$ atoms/cm$^3$.

33. The semiconductor device according to claim 22, wherein a hydrogen concentration in the second oxide semiconductor film is less than or equal to $5 \times 10^{19}$ atoms/cm$^3$.

34. The semiconductor device according to claim 22, wherein the insulating film contains oxygen at a ratio exceeding a ration of oxygen in a stoichiometric composition of the insulating film.

* * * * *

UNITED STATES PATENT AND TRADEMARK OFFICE
CERTIFICATE OF CORRECTION

PATENT NO. : 9,559,213 B2
APPLICATION NO. : 14/854566
DATED : January 31, 2017
INVENTOR(S) : Shunpei Yamazaki It is certified that error appears in the above-identified patent and that said Letters Patent is hereby corrected as shown below:

In the Specification

At Column 11, Line 28, "100 nm" should be --100 nm.--;

At Column 23, Line 48, "thereof" should be --thereof.--;

At Column 50, Line 16, "$(C_B + C)$." should be --$(C_B + C))$.--;

In the Claims

In Claim 1, at Column 56, Line 14, "film, and" should be --film; and--;

In Claim 34, at Column 58, Line 59, "ration" should be --ratio--.

Signed and Sealed this
Twenty-fifth Day of April, 2017

Michelle K. Lee
*Director of the United States Patent and Trademark Office*